US012771355B2

(12) United States Patent
Kim et al.

(10) Patent No.: US 12,771,355 B2
(45) Date of Patent: Oct. 20, 2026

(54) QUANTUM CIRCUIT FOR IMPLEMENTING A MULTI-CONTROLLED NOT GATE

(71) Applicant: ELECTRONICS AND TELECOMMUNICATIONS RESEARCH INSTITUTE, Daejeon (KR)

(72) Inventors: Taewan Kim, Daejeon (KR); Jeongho Bang, Daejeon (KR); Kyunghyun Baek, Daejeon (KR); Yongsoo Hwang, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 19/055,702

(22) Filed: Feb. 18, 2025

(65) Prior Publication Data

US 2025/0266841 A1 Aug. 21, 2025

(30) Foreign Application Priority Data

Feb. 19, 2024 (KR) ........................ 10-2024-0023465
Feb. 7, 2025 (KR) ........................ 10-2025-0016046

(51) Int. Cl.
*H03K 19/195* (2006.01)
*G06N 10/20* (2022.01)
*H03K 19/20* (2006.01)

(52) U.S. Cl.
CPC ........... *H03K 19/195* (2013.01); *G06N 10/20* (2022.01); *H03K 19/20* (2013.01)

(58) Field of Classification Search
CPC ....... H03K 19/195; H03K 19/20; G06N 10/20
USPC ............................... 326/7; 327/366; 977/933
See application file for complete search history.

(56) References Cited

U.S. PATENT DOCUMENTS

| | | | | |
|---|---|---|---|---|
| 10,171,088 | B1 * | 1/2019 | Kim | H03K 19/195 |
| 2014/0118024 | A1 * | 5/2014 | Eastin | G06N 10/20 327/366 |
| 2022/0156626 | A1 | 5/2022 | Gorshkov et al. | |
| 2023/0097026 | A1 | 3/2023 | Baek et al. | |

(Continued)

FOREIGN PATENT DOCUMENTS

CN 117829300 A 4/2024

OTHER PUBLICATIONS

Georgopoulos. et al, A Comparison Walk Implementations on NISQ Computers, Newcastle University, UK. (Year: 2021).*

*Primary Examiner* — Arnold M Kinkead

(57) ABSTRACT

Disclosed is a quantum circuit for implementing multi-controlled NOT gates with N control qubits. A quantum circuit for implementing multi-controlled NOT gates with N control qubits according to one embodiment of the present disclosure may include a first auxiliary circuit that corresponds to one or more initial layers of a plurality of layers and performs a controlled NOT operation on a target qubit based on an Nth control qubit from among the N control qubits and a first auxiliary qubit initialized to a |+> state, a quantum gate group that corresponds to the plurality of layers and performs controlled NOT operation on the first auxiliary qubit based on first to (N−1)th control qubits, and a second auxiliary circuit that corresponds one or more last layers of the plurality of layers and performs controlled NOT operation on the target qubit based on the Nth control qubit and the first auxiliary qubit.

20 Claims, 20 Drawing Sheets

(56) References Cited

U.S. PATENT DOCUMENTS

| | | | |
|---|---|---|---|
| 2023/0162078 | A1 | 5/2023 | Lee |
| 2023/0396254 | A1 | 12/2023 | Szady |

* cited by examiner

QUANTUM CIRCUIT FOR IMPLEMENTING A MULTI-CONTROLLED NOT GATE

CROSS-REFERENCE TO RELATED APPLICATIONS

This application claims priority under 35 U.S.C. § 119 to Korean Patent Application No. 10-2024-0023465 filed on Feb. 19, 2024 and No. 10-2025-0016046 filed on Feb. 7, 2025, in the Korean Intellectual Property Office, the disclosures of which are incorporated by reference herein in their entireties.

BACKGROUND

Embodiments of the present disclosure described herein relate to a quantum circuit, and more particularly, to a quantum circuit for implementing a multi-controlled NOT gate.

A quantum computer may perform an operation based on a qubit represented by a superposition of '0' and '1' by using the principle of quantum mechanics, and thus may have a much faster operation speed than a digital computer using bits that can be represented only by '0' or '1'.

The multi-controlled conditional gate is a quantum logic gate that performs a conditional operation on a target qubit based on a plurality of control qubits. Multi-controlled conditional gates are applied to implement system software or specific algorithms related to quantum computation in various applications of quantum computing. For example, the multi-controlled NOT gate is a quantum logic gate of a quantum circuit relating to a plurality of control qubits and one target qubit. The multi-controlled NOT gate inverts the state of the target qubit when the state of all control qubits is |1>.

The multi-controlled conditional gate may be implemented as elementary gates supported by a hardware platform of the quantum computer. However, in implementing a multi-controlled conditional gate by using basic gates, a circuit depth, which affects the speed of quantum computation, may be different according to arrangement of auxiliary qubits and basic gates. When the circuit depth of the quantum circuit is large, a relatively long computation time is required.

In order to implement a fast and efficient multi-controlled conditional gate, a quantum circuit with a minimum circuit depth is required using relatively simple gates.

SUMMARY

Embodiments of the present disclosure provide a quantum circuit for a multi-controlled NOT gate that can perform efficient and fast quantum computation.

Embodiments of the present disclosure provide a quantum circuit for a multi-controlled NOT gate that can minimize circuit depth in an environment where a type of operation is limited according to a hardware platform.

A quantum circuit for implementing multi-controlled NOT gates with N control qubits (N is an integer greater than or equal to 3) according to an embodiment of the present disclosure includes a first auxiliary circuit that corresponds to one or more initial layers of a plurality of layers and performs a controlled NOT operation on a target qubit based on an Nth control qubit from among the N control qubits and a first auxiliary qubit initialized to a |+> state, a quantum gate group that corresponds to the plurality of layers and performs controlled NOT operation on the first auxiliary qubit based on first to (N−1)th control qubits, and a second auxiliary circuit that corresponds one or more last layers of the plurality of layers, and performs controlled NOT operation on the target qubit based on the Nth control qubit and the first auxiliary qubit.

A quantum circuit for implementing multi-controlled NOT gates with N control qubits (N is an integer greater than or equal to 3) according to an embodiment of the present disclosure includes a first auxiliary circuit that corresponds to one or more initial layers of a plurality of layers and performs a controlled NOT operation on a target qubit based on an Nth control qubit from among the N control qubits and a first auxiliary qubit initialized to a |+> state, a quantum gate group that corresponds to the plurality of layers and perform controlled NOT operation on the first auxiliary qubit based on first to (N−1)th control qubits, one or more measurement circuits that correspond to one or more last layers of the plurality of layers, and measure a state of the one or more auxiliary qubits, and one or more conditional operation circuits that perform a conditional operation based on a measurement result of the one or more measurement circuits.

BRIEF DESCRIPTION OF THE FIGURES

The above and other objects and features of the present disclosure will become apparent by describing in detail embodiments thereof with reference to the accompanying drawings.

DETAILED DESCRIPTION

Figure 1:
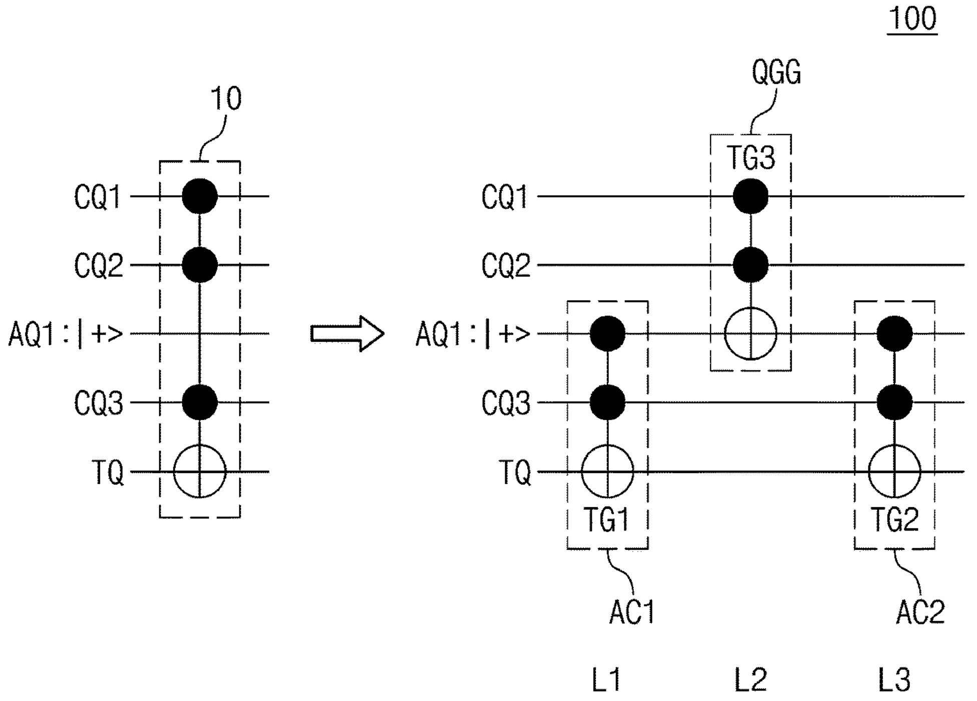
FIG. 1 is a circuit diagram illustrating an example of a quantum circuit for implementing a multi-controlled NOT gate with 3 control qubits according to an embodiment of the present disclosure.

Hereinafter, embodiments of the present disclosure will be described in detail and clearly to such an extent that an ordinary one in the art easily implements the present disclosure.

The components described with reference to the terms "unit", "module", "block", "or", "er", and the like used in the detailed description and the functional blocks shown in the drawings may be implemented in the form of software, hardware, or a combination thereof. Exemplarily, the software may be machine code, firmware, embedded code, and application software. For example, the hardware may include an electrical circuit, an electronic circuit, a processor, a computer, an integrated circuit, integrated circuit cores, a pressure sensor, an inertial sensor, a microelectromechanical system (MEMS), a passive device, or a combination thereof.

A multi-controlled NOT gate with N control qubits is a quantum logic gate that inverts the state of a target qubit based on the state of N control qubits being |1>. Relatively simpler gates and auxiliary qubits may be used to implement a multi-controlled NOT gate with N control qubits. When decomposing a multi-controlled NOT gate with N control qubits into simpler gates, the circuit depth may vary depending on the placement of the auxiliary qubits and gates. The following describes how the circuit depth can be minimized when disassembling a multi-controlled NOT gate.

FIG. 1 is a circuit diagram illustrating an example of a quantum circuit for implementing a multi-controlled NOT gate with 3 control qubits according to an embodiment of the present disclosure.

Referring to FIG. 1, the multi-controlled NOT gate with 3 control qubits 10 may be implemented through a quantum circuit 100 including a first auxiliary circuit AC1, a quantum gate group QGG, and a second auxiliary circuit AC2.

A Toffoli gate is referred to as a CCNOT gate or a CCX gate, and is a conditional gate that inverts the state of a target qubit based on two control qubits. The Toffoli gate may invert the state of the target qubit TQ based on the state of the two control qubits being |1>.

The Pauli-X gate inverts the state of the qubit. Inverting of the qubit state refers to a $\pi$(i.e., 180°) rotation in the Bloch sphere about the X axis of the sphere. A qubit that is a state of |1> becomes a state of 0> through state inverting, and a qubit that of |0> can become |1> through state inverting. The CNOT gate corresponds to a conditional Pauli-X gate according to the control qubit. The Pauli-X operation refers rotating the qubit by $\pi$ about the X axis.

The quantum circuit 100 may use an auxiliary qubit AQ1. The auxiliary qubit AQ1 may be a qubit initialized to the |+> state.

In implementing the multi-controlled NOT gate with N control qubits, the first auxiliary circuit AC1 may correspond to one or more initial layers among the plurality of layers and may perform a controlled NOT operation on the target qubit based on the Nth control qubit and the first auxiliary qubit initialized to the |+> state among the plurality of auxiliary qubits.

The quantum gate group QGG may perform controlled NOT operation on the first auxiliary qubit based on the first to N-lth control qubits.

The second auxiliary circuit AC2 may correspond to one or more last layers of the plurality of layers and may perform controlled NOT operation on the target qubit based on the Nth control qubit and the first auxiliary qubit. The second auxiliary circuit AC2 may be configured symmetrically with the first auxiliary circuit AC1.

Hereinafter, in FIGS. 1 to 4, the first auxiliary circuit AC1 may include a first Toffoli gate TG1, and the second auxiliary circuit AC2 may include a second Toffoli gate TG2.

The first Toffoli gate TG1 may correspond to the layer 1 (L1). The first Toffoli gate TG1 may rotate the target qubit TQ by $\pi$ about the X axis based on the auxiliary qubit AQ1 initialized to the |+> state and the control qubit CQ3.

The quantum gate group QGG may correspond to the layer 2 (L2). The quantum gate group QGG may rotate the auxiliary qubit AQ1 by $\pi$ about the X axis based on the control qubit CQ1 and the control qubit CQ2.

The second Toffoli gate TG2 may correspond to the layer 3 (L3). The second Toffoli gate TG2 may rotate the target qubit TQ by $\pi$ about the X axis based on the auxiliary qubit AQ1 and the control qubit CQ3.

The layers L1 to L3 may correspond to positions for describing arrangement of gates or circuits included in the quantum circuit 100. One or more layers may correspond to one circuit depth. According to a relationship between gates corresponding to each of the layers, even when the gates correspond to different layers, the gates may correspond to one circuit depth when the gates are operable in parallel.

The quantum gate group QGG may include a third Toffoli gate TG3. The third Toffoli gate TG3 may rotate the auxiliary qubit AQ1 by 71 around the X axis based on the control qubit CQ1 and the control qubit CQ2.

As a result, the multi-controlled NOT gate with 3 control qubits 10 may be decomposed into three Toffoli gates—a first Toffoli gate TG1, a second Toffoli gate TG2, and a third Toffoli gate GT3.

The quantum circuit 100 may parallelize the operation of the gates by using an auxiliary qubit AQ1 of |+> which is in a uniform superposition state. Parallelization of quantum computation utilizing auxiliary qubits may reduce the depth of the decomposed circuit.

Figure 2:
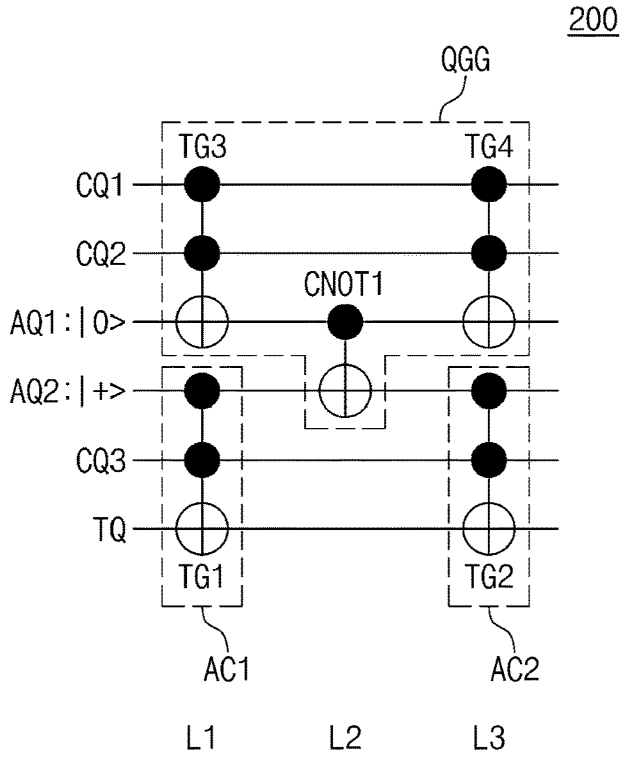
FIG. 2 is a circuit diagram illustrating an example of a quantum circuit for implementing a multi-controlled NOT gate with 3 control qubits according to an embodiment of the present disclosure.

FIG. 2 is a circuit diagram illustrating another example of a quantum circuit implementing a multi-controlled NOT gate with 3 control qubits according to an embodiment of the present disclosure.

Referring to FIG. 2, the quantum circuit 200 may include a first Toffoli gate TG1, a quantum gate group QGG, and a second Toffoli gate TG2.

The CNOT gate is a quantum logic gate in which the state of the target qubit does not change when the state of the control qubit is |0>, and the CNOT gate rotates the target qubit by π about the X axis when the state of control qubits is |1>.

The first Toffoli gate TG1 may rotate the target qubit TQ by π about the X axis based on the auxiliary qubit AQ2 initialized to the |+> state and the control qubit CQ3.

The quantum gate group QGG may include a third Toffoli gate TG3 that rotates the auxiliary qubit AQ1 initialized to the |0> state by π about the X axis based on the control qubit CQ1 and the control qubit CQ2. The quantum gate group QGG may include a first CNOT gate CNOT1 that rotates the auxiliary qubit AQ2 by π about the X axis based on the auxiliary qubit AQ1. The quantum gate group QGG may include a fourth Toffoli gate TG4 that rotates the auxiliary qubit AQ1 by π about the X axis based on the control qubit CQ1 and the control qubit CQ2. The quantum gate group QGG may apply a result calculated based on the control qubit CQ1 and the control qubit CQ2 on the auxiliary qubit AQ2 through the third Toffoli gate TG3, the first CNOT gate CNOT1, and the fourth Toffoli gate TG4.

The second Toffoli gate TG2 may rotate the target qubit TQ3 by π about the X axis based on the auxiliary qubit AQ2 and the control qubit CQ3.

In this case, the first Toffoli gate TG1 and the third Toffoli gate TG3 may correspond to the layer 1 (L1), the first CNOT gate CNOT1 may correspond to the layer 2 (L2), and the second Toffoli gates TG2 and TG4 may correspond to the layer 2 (L2). That is, in the layer 1 (L1), the operation of the first Toffoli gate TG1 and the third Toffoli gates TG3 may be performed in parallel. In addition, the operation of the second Toffoli gate TG2 and the third Toffoli gates TG4 may be performed in parallel. Parallel operation of the Toffoli gates can reduce circuit depth.

Figure 3:
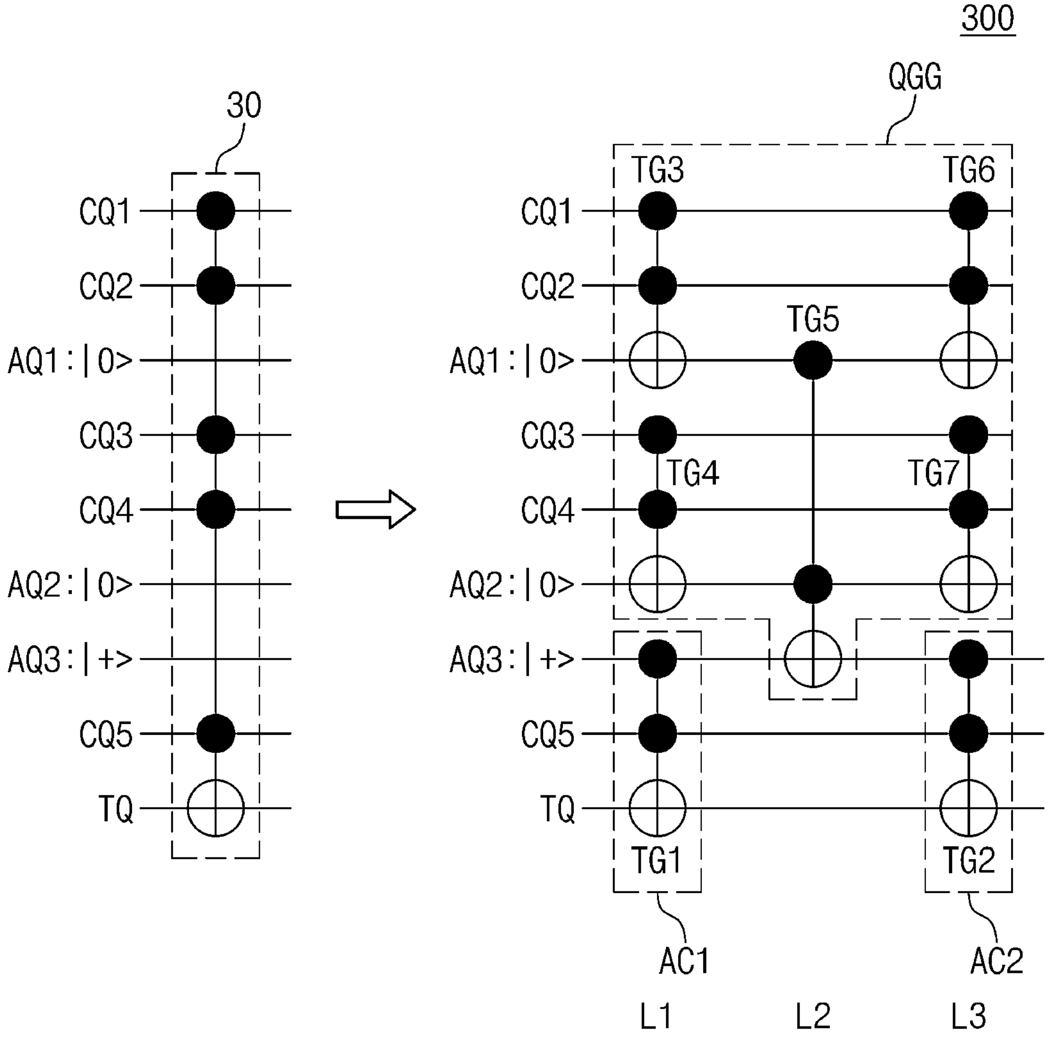
FIG. 3 is a circuit diagram illustrating an example of a quantum circuit for implementing a multi-controlled NOT gate with 5 control qubits according to an embodiment of the present disclosure.

FIG. 3 is a circuit diagram illustrating an example of a quantum circuit for implementing a multi-controlled NOT gate with 5 control qubits according to an embodiment of the present disclosure.

Referring to FIG. 3, the multi-controlled NOT gate with 5 control qubits 30 may be implemented through a quantum circuit 300 including a first Toffoli gate TG1, a quantum gate group QGG, and a second Toffoli gate TG2.

The first Toffoli gate TG1 may correspond to the layer 1 (L1), and may rotate the target qubit TQ by π about the X axis based on the auxiliary qubit AQ3 initialized to the |+> state and the control qubit CQ5.

The quantum gate group QGG may correspond to the layers L1 to L3. The quantum gate group QGG may rotate the auxiliary qubit AQ3 by π about the X axis based on the control qubits CQ1 to CQ4.

The quantum gate group QGG may include a third Toffoli gate TG3 that rotates the auxiliary qubit AQ1 that is initialized to the |0> state by π about the X axis based on the control qubit CQ1 and the control qubit CQ2, a fourth Toffoli gate TG4 that rotates the auxiliary qubit AQ2 that is initialized in the |0> state by π about the X axis based on the control qubit CQ3 and the control qubit CQ4. The quantum gate group QGG may include a fifth Toffoli gate TG5 that rotates an auxiliary qubit AQ3 by π about the X axis based on the auxiliary qubits AQ1 and AQ2. The quantum gate group QGG may include a sixth Toffoli gate TG6 that rotates the auxiliary qubit AQ1 by π about the X axis based on the control qubit CQ1 and the control qubit CQ2, and a seventh Toffoli gate TG7 that rotates the auxiliary qubit AQ2 by π about the X axis based on the control qubits CQ3 and CQ4. In this case, the third Toffoli gate TG3 and the fourth Toffoli gate TG4 may correspond to the layer 1 (L1). The fifth Toffoli gate TG5 may correspond to the layer 2 (L2). The sixth Toffoli gate TG6 and the seventh Toffoli gate TG7 may correspond to the layer 3 (L3).

The second Toffoli gate TG2 corresponds to the layer 3 (L3) and may rotate the target qubit TQ by π about the X axis based on the auxiliary qubit AQ3 and the control qubit CQ5.

Through the above-described parallelization, when the layer 1 (L1) is performed, the first Toffoli gate TG1, the third Toffoli gate TG3, and the fourth Toffoli gates TG4 may be operated in parallel, when the layer 2 (L2) is performed, the fifth Toffoli gate is operated, and when the layer 3 (L3) is performed, the second Toffoli gate TG2, the Toffoli gate 6 TG6, and the Toffoli gate 7 TG7 may be operated in parallel.

The quantum circuit 300 may implement a multi-controlled NOT gate with 5 control qubits having a circuit depth of 3 by using only a single type of Toffoli gate.

Figure 4:
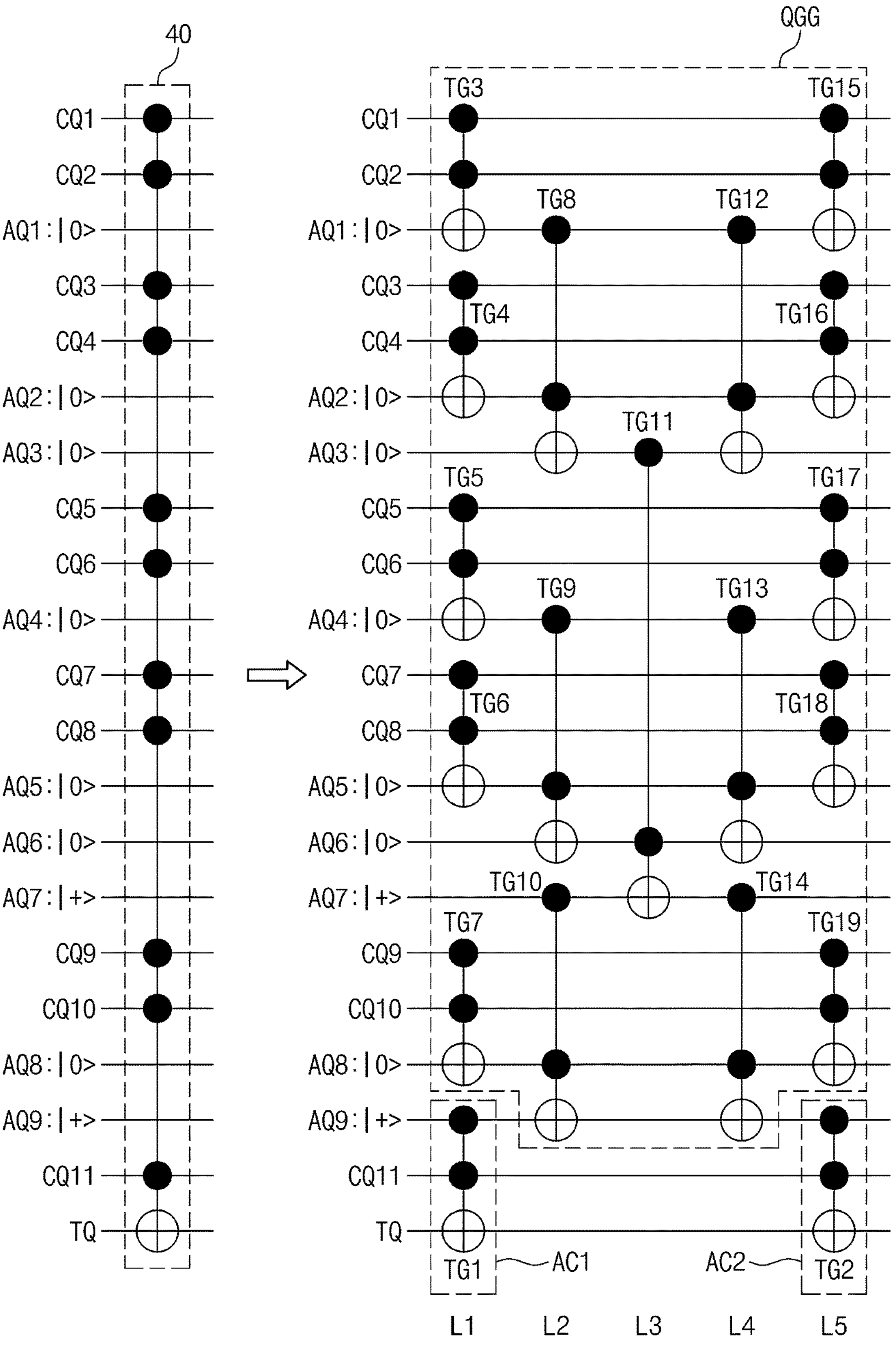
FIG. 4 is a circuit diagram illustrating an example of a quantum circuit for implementing a multi-controlled NOT gate with 11 control qubits according to an embodiment of the present disclosure.

FIG. 4 is a circuit diagram illustrating an example of a quantum circuit for implementing a multi-controlled NOT gate with 11 control qubits according to an embodiment of the present disclosure.

Referring to FIG. 4, the multi-controlled NOT gate with 11 control qubits 40 may be implemented by a quantum circuit 400 including a first Toffoli gate TG1, a quantum gate group QGG, and a second Toffoli gate TG2.

The first Toffoli gate TG1 may correspond to the layer L1, and may rotate the target qubit TQ by π about the X axis based on the auxiliary qubit AQ9 initialized to the |+1> state and the control qubit CQ11.

The quantum gate group QGG may correspond to the layer 1 (L1) to the layer 5 (L5), and may rotate the auxiliary qubit AQ9 by π about the X axis based on the control qubits CQ1 to CQ10.

The quantum gate group QGG may include a third Toffoli gate TG3 that rotates the auxiliary qubit AQ1 initialized to the |0> state by π about the X-axis based on the control qubit CQ1 and the control qubit CQ2, a fourth Toffoli gate TG4 that rotates the auxiliary qubit AQ2 initialized to the |0> state by r about the X-axis based on the control qubit CQ3 and the control qubit CQ4, a fifth Toffoli gate TG5 that rotates the auxiliary qubit AQ4 initialized to the |0> state by r about the X axis based on the control qubit CQ5 and the control qubit CQ6, a sixth Toffoli gate AQ6 that rotates the auxiliary qubit AQ5 initialized to the |0> state by r about the X axis based on the control qubit CQ7 and the control qubit CQ8, and a seventh Toffoli gate TG7 that rotates the auxiliary qubit AQ8 initialized to the |0> state by r about the X axis based on the control qubit CQ9 and the control qubit CQ10. The third to seventh Toffoli gates TG3-TG7 may correspond to the layer 1 (L1).

The quantum gate group QGG may include an eighth Toffoli gate TG8 that rotates an auxiliary qubit AQ3 initialized to the |0> state by π about the X axis based on the auxiliary qubits AQ1 and AQ2, a ninth Toffoli gates TG9 that rotates the auxiliary qubit AQ6 initialized to |0> states by π about the X axis based on an auxiliary qubits AQ4 and AQ5, and a tenth Toffoli gate TG10 that rotates the auxiliary qubit AQ9 by π about the X axis based on the auxiliary qubit AQ8 and the auxiliary qubit AQ7 initialized to |+> state. The eighth to tenth gates TG8-TG10 may correspond to the layer 2 (L2).

The quantum gate group QGG may include an eleventh Toffoli gate TG11 that rotates the auxiliary qubit AQ7 by π about the X axis based on the auxiliary qubits AQ3 and AQ6. The eleventh Toffoli gate TG11 may correspond to the layer 3 (L3).

The quantum gate group QGG may include a twelfth Toffoli gate TG12 that rotates an auxiliary qubit AQ3 by π about the X axis based on the auxiliary qubit AQ1 and the auxiliary qubit AQ2, a thirteenth Toffoli gate TG13 that rotates the auxiliary qubit AQ6 by π about the X axis based on the auxiliary qubit AQ4 and the auxiliary qubit AQ5, and a fourteenth Toffoli gate TG14 that rotates the auxiliary qubit AQ9 by π about the X axis based on the auxiliary qubit AQ7 and the auxiliary qubit AQ8. The twelfth to fourteenth gates TG12-TG14 may correspond to the layer 4 (L4).

The quantum gate group QGG may include a fifteenth Toffoli gate TG15 that rotates the auxiliary qubit AQ1 by π about the X axis based on the control qubit CQ1 and the control qubit CQ2, a sixteenth Toffoli gateway TG16 that rotates the auxiliary qubit AQ2 by π about the X axis based on the control qubit CQ3 and control qubit CQ4, a seventeenth Toffoli gate TG17 that rotates the auxiliary qubit AQ4 by π about the X axis based on the controls qubit CQ5 and control qubit CQ6, an eighteenth Toffoli gate TG18 that rotates the auxiliary qubit AQ5 by π about the X axis based on the control qubit CQ7 and control qubit CQ8, and a nineteenth Toffoli gate TG19 that rotates the auxiliary qubit AQ8 by π about the X axis based on the control qubit CQ9 and control qubit CQ10. The fifteenth to nineteenth Toffoli gates TG15-TG19 may correspond to the layer 5 (L5).

The second Toffoli gate TG2 corresponds to the layer 5 (L5) and may rotate the target qubit TQ by π about the X axis based on the auxiliary qubit AQ9 and the control qubit CQ11.

Based on the decomposition described above in FIG. 1, N−2 auxiliary qubits are required when implementing a multi-controlled NOT gate with N control qubits using Toffoli gates. When the multi-controlled NOT gate with N control qubits is implemented by using single type of Toffoli gate, the circuit depth of the quantum circuit may be represented by Equation 1.

$$K = 2\lceil \log_2(N+1)/3 \rceil + 1 \quad \text{[Equation 1]}$$

K is the circuit depth and N is the number of control qubits of the multi-controlled NOT gate.

When a multi-controlled NOT gate with N control qubits is implemented using only an auxiliary qubit of a |0> state conventionally, the circuit depth of the quantum circuit can be represented by Equation 2.

$$K = 2\lceil \log_2 N \rceil - 1 \quad \text{[Equation 2]}$$

In implementing a multi-controlled NOT gate with N control qubits, the quantum circuit according to an embodiment of the present disclosure may apply about 1.5 times control qubits compared to a conventional implementation. For example, when the circuit depth is 19, the number of control qubits may be 1024 according to a conventional implementation. At this time, a multi-controlled NOT gate with 1024 control qubits may be implemented. On the other hand, a quantum circuit according to an embodiment of the present disclosure may implement a multi-controlled NOT gate with 1535 control qubits in which the number of control qubits is 1535. It is possible to implement a multi-controlled NOT gate that operates based on more control qubits even if it corresponds to the same circuit depth. In another aspect, when rotating by π about the X axis based on the same number of control qubits, the quantum circuit according to an embodiment of the present disclosure may have a reduced circuit depth.

Figure 5:
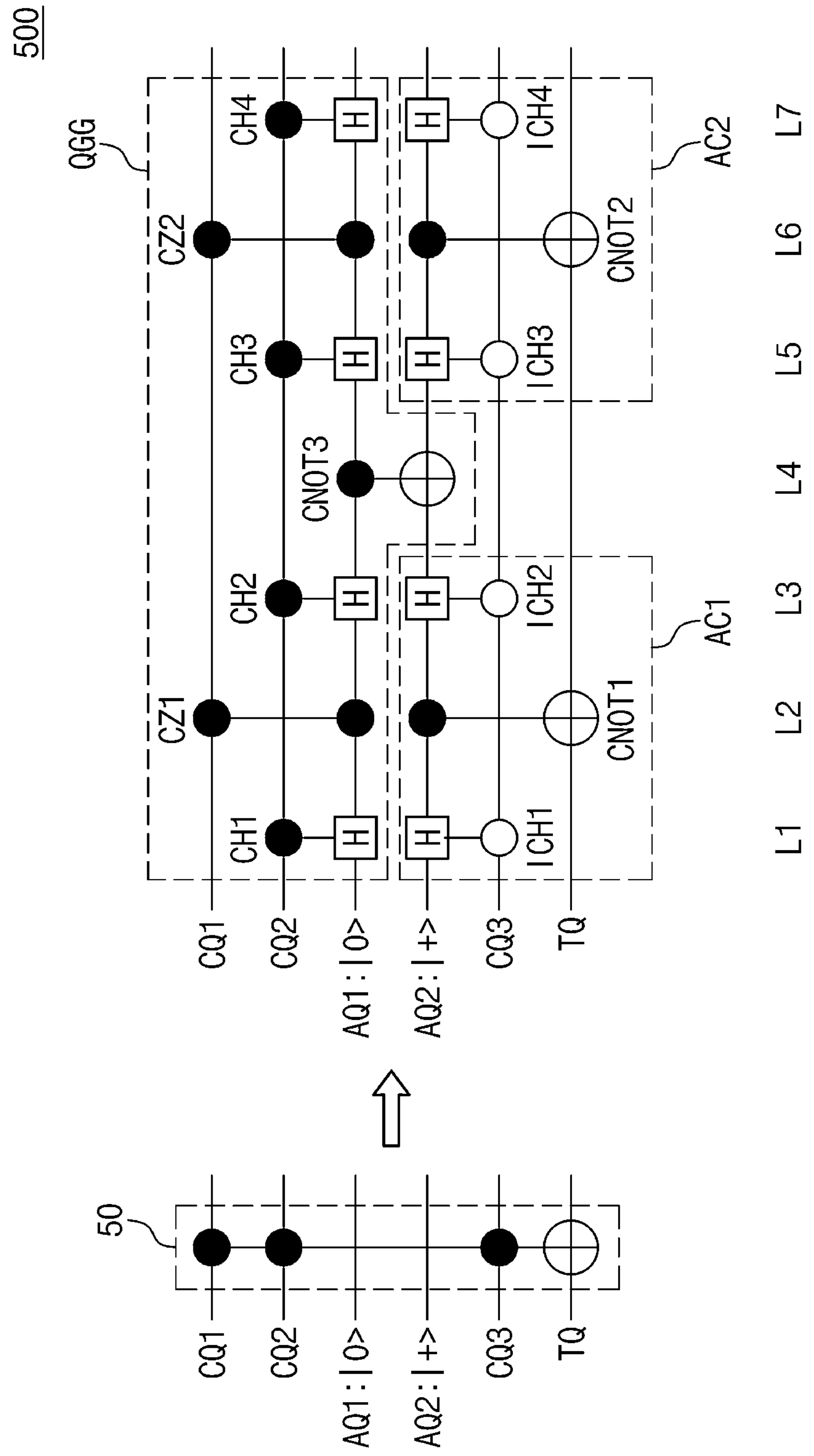
FIG. 5 is a circuit diagram illustrating another example of a quantum circuit for implementing a multi-controlled NOT gate with 3 control qubits according to an embodiment of the present disclosure.

FIG. 5 is a circuit diagram illustrating another example of a quantum circuit for implementing a multi-controlled NOT gate with 3 control qubits according to an embodiment of the present disclosure.

Referring to FIG. 5, the multi-controlled NOT gate with 3 control qubits 50 may be implemented by a quantum circuit 500 including a first auxiliary circuit AC1, a quantum gate group QGG, and a second auxiliary circuit AC2.

The quantum circuit 500 is obtained by implementing each of the Toffoli gates constituting the quantum circuit 200 described in FIG. 2 using a CH gate, a CZ gate, and inverted CH gates. The first auxiliary circuit AC1 may correspond to the first Toffoli gate TG1 of the quantum circuit 200 of FIG. 2. The quantum gate group QGG of the quantum circuit 500 may correspond to the quantum gate group QG of the quantum circuit 200. The second auxiliary circuit AC2 may correspond to the second Toffoli gate TG2 of the quantum circuit 200.

A Controlled-Hadamard (CH) gate is a quantum logic gate that maintains the state of a target qubit when the state of the control qubit is |0>, and performs Hadamard transformation on the target qubit when the state of the control qubit is |1>.

An Inverted-Controlled Hadamard Gate (Inverted CH Gate) is a quantum logic gate that performs Hadamard transformation on a target qubit when a state of a control qubit is |0>, and maintains the state of the target qubit when the state of the control qubits is |1>.

The controlled-Z gate (CZ gate) has no change in the state of the target qubit when the state of the control qubit is |0>, and inverts the phase of the target qubit when the state of the control qubit is |1>. The Pauli-Z gate rotates the qubit by π about the Z axis. The CZ gate has symmetry between the control qubit and the target qubit.

The first auxiliary circuit AC1 may include a first inverted CH gate ICH1 that corresponds to the layer 1 (L1) and performs inverted-controlled Hadamard transformation on the auxiliary qubit AQ2 initialized to the |+> state based on the control qubit CQ3, a first CNOT gate CNOT1 that corresponds to the layer 2 (L2) and rotates the target qubit TQ by π about X axis based on the auxiliary qubit AQ2, and a second inverted CH Gate ICH2 that corresponds to a layers 3 (L3) and performs inverted-controlled Hadamard transformation on the auxiliary qubit AQ2 based on the control qubit CQ3.

The quantum gate set QGG may include a first CH gate CH1 that corresponds to the layer 1 (L1) and performs controlled Hadamard transformation on the auxiliary qubit AQ1 initialized to |0> based on the control qubit CQ2, a first CZ gate CZ1 that corresponds to a layer 2 (L2) and rotates the auxiliary qubit AQ1 by π about the Z axis based on the control qubit CQ1, a second CH gate CH2 that corresponds to layer 3 (L3) and performs controlled Hadamard transformation on the auxiliary qubit AQ1 based on the control qubit CQ2; a third CNOT gate CNOT3 that corresponds to layer 4 (L4) and rotates the auxiliary qubit AQ2 by π about the X axis based on the auxiliary qubit AQ1; a third CH gate CH3 that corresponds to a layers 5 (L5) and performs controlled Hadamard transformation on an auxiliary qubit AQ1 based upon the control qubit CQ2; the second CZ gate CZ2 that corresponds to the layers 6 (L6) and rotates the auxiliary qubit AQ1 by π about the Z axis, based upon the control qubit CQ1; and a fourth CH gate CH4 that corresponds to layer 6 (L6) and performs controlled Hadamard transformation on the auxiliary qubit AQ1 based on the control qubit CQ2.

The second auxiliary circuit AC2 may include a third inverted CH gate ICH3 that corresponds to the layer 5 (L5) and performs inverted controlled Hadamard transformation on the auxiliary qubit AQ2 based on the control qubit CQ3, a second CNOT gate CNOT2 that corresponds to the layer 5 (L5) and rotates the target qubit TQ by π about the X axis based on the auxiliary qubit AQ2, and a fourth inverted CH gate ICH4 that corresponds to the layer 6 (L6) and performs inverted controlled Hadamard transformation on the auxiliary qubit AQ2 based on the control qubit CQ3.

Through this, it is possible to implement the multi-controlled NOT gate with 3 control qubits using the CH gate, the CZ gate, and the inverted CZ gates performing operation based on single control qubit.

Figure 6:
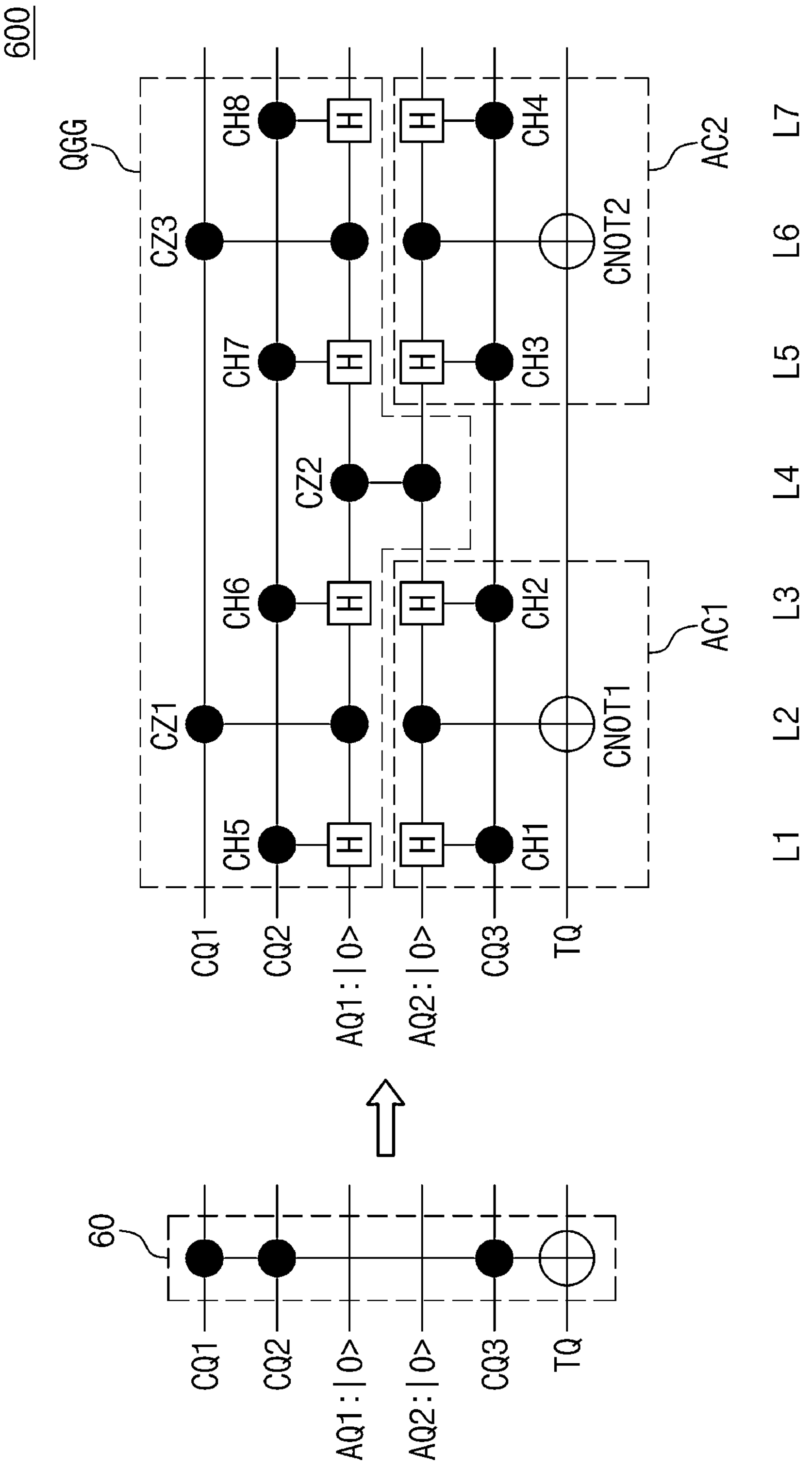
FIG. 6 is a circuit diagram illustrating another example of a quantum circuit for implementing a multi-controlled NOT gate with 3 control qubits according to an embodiment of the present disclosure.

FIG. 6 is a circuit diagram illustrating another example of a quantum circuit for implementing a multi-controlled NOT gate with 3 control qubits according to an embodiment of the present disclosure.

Referring to FIG. 6, the multi-controlled NOT gate with 3 control qubits 60 may be implemented by a quantum circuit 600 including a first auxiliary circuit AC1, a quantum gate group QGG, and a second auxiliary circuit AC2.

The first auxiliary circuit AC1 may include a first CH gate CH1 that corresponds to the layer 1 (L1) and performs controlled Hadamard transformation on a auxiliary qubit AQ2 initialized to the |0> state based on a control qubit CQ3, a first CNOT gate CNOT1 that corresponds to a layer 2 (L2) and rotates a target qubit TQ by π about the X axis based on the auxiliary qubit AQ2, and a second CH gate CH2 that corresponds to a layers 3 (L3) and performs controlled Hadamard transformation on an auxiliary qubit AQ2 based on the control qubit CQ3.

The quantum gate set QGG may include a fifth CH gate CH5 corresponding to the layer 1 (L1) and performs controlled Hadamard transformation on a auxiliary qubit AQ1 initialized to |0> based on a control qubit CQ2, a first CZ gate CZ1 corresponding to the layer 2 (L2) and rotating the auxiliary qubit AQ1 by π about the Z axis based on the control qubit CQ1, a sixth CH gate CH6 corresponding to the layer 3 (L3) and performing controlled Hadamard transformation on the auxiliary qubit AQ1 based on the control qubit CQ2, a second CZ gate CZ2 corresponding to a layer 4 (L4) and rotating the auxiliary qubit AQ2 by π about the Z axis based on the auxiliary qubit AQ1; a third CH gate CH3 corresponding to a layer 5 (L5) and performing controlled Hadamard transformation on an auxiliary qubit AQ1 based on a control qubit CQ2; a third CZ gate CZ3 corresponding to the layers 5 (L5), and rotating the auxiliary qubit AQ1 by π about the Z axis based on a control qubit CQ1; and an eighth CH gate CH8 corresponding to a layer 6 (L6) and performing controlled Hadamard transformation on the auxiliary qubit AQ1 based on the control CQ2.

The second auxiliary circuit AC2 may include a third CH gate CH3 corresponding to the layer 5 (L5) and performing controlled Hadamard transformation on the auxiliary qubit AQ2 based on the control qubit CQ3, a second CNOT gate CNOT2 corresponding to the layer 5 (L5) and rotating the target qubit TQ by π about the X axis based on the auxiliary qubit AQ2, and a fourth CH gate CH4 corresponding to a layer 6 (L6) and performing controlled Hadamard transformation on the auxiliary qubit AQ2 based on the control qubit CQ3.

Compared with the quantum circuit 500 in FIG. 5, the auxiliary qubit AQ2 of the quantum circuit 600 in FIG. 6 is initialized to the |0> state. The inverted CH gates included in the quantum circuit 500 of FIG. 5 are changed to CH gates in the quantum circuit 600 of FIG. 6. The third CNOT gate CNOT3 included in the quantum circuit 500 of FIG. 5 is changed to the second CZ gate CZ2 in the quantum circuit 600 of FIG. 6.

On the other hand, when configuring a quantum circuit with quantum logic gates (CH, CZ, CNOT, or inverted CH, etc.) having two gates (or terminals), N−1 auxiliary qubits are needed to implement a multi-controlled NOT gate with N control qubits. At this time, the depth M of the circuit can be expressed by Equation 3.

$$M = 6\lceil \log_2(N+1) \rceil - 5 \quad \text{[Equation 3]}$$

With reference to FIG. 5 and FIG. 6, the quantum logic gate with three gates in FIG. 2 can be represented by quantum logic gates with two gates. This enables a multi-controlled NOT gate with N control qubits to be implemented using a relatively simpler quantum logic gate.

Figure 7:
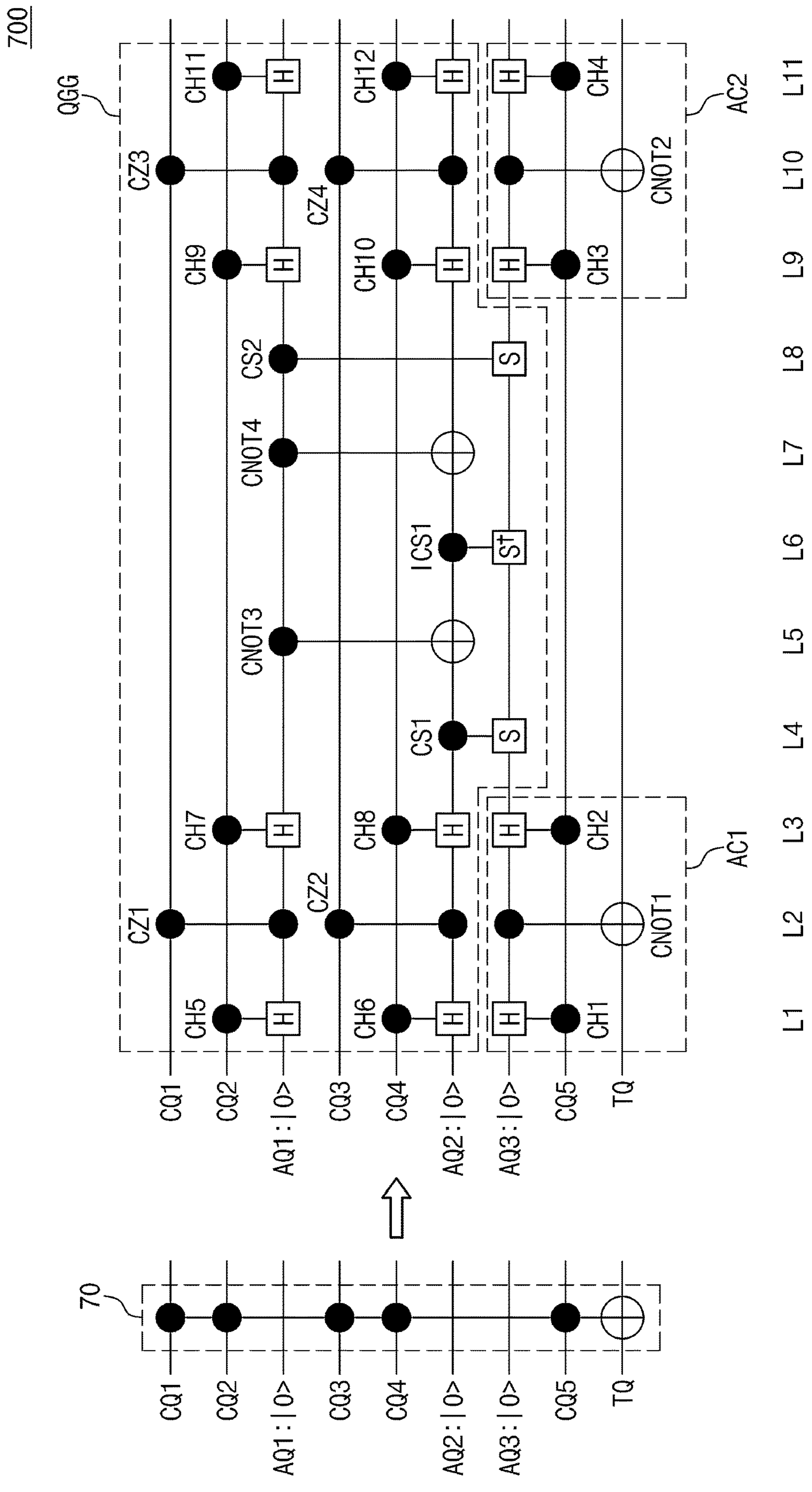
FIG. 7 is a circuit diagram illustrating an example of a quantum circuit for implementing a multi-controlled NOT gate with 5 control qubits according to an embodiment of the present disclosure.

FIG. 7 is a circuit diagram illustrating an example of a quantum circuit for implementing a multi-controlled NOT gate with 5 control qubits according to an embodiment of the present disclosure.

Referring to FIG. 7, the multi-controlled NOT gate with 5 control qubits 70 may be implemented by a quantum circuit 700 including a first auxiliary circuit AC1, a quantum gate group QGG, and a second auxiliary circuit AC2.

A Controlled S gate (CS gate) is a quantum logic gate in which the state of a target qubit is maintained when the state of the control qubit is |0>, and the state of the target qubit changes in phase by π/2 when the state of control qubits is |1>. That is, when the state of the control qubit is |1>, the S gate is applied. An S gate is a quantum logic gate that rotates the state of a qubit in a Bloch sphere about the Z axis by π/2.

An Inverse Controlled-S gate (inverse CS gate) is a quantum logic gate in which the state of a target qubit is maintained when the state of the qubit is |0>, and the state of the target qubit changes by −π/2 when the state of a control qubit is |1>. That is, when the state of the control qubit is |1>, the inverse S gate is applied. An Inverse S gate is a quantum logic gate that rotates the state of a qubit in the Bloch sphere about the Z axis by −π/2.

The first auxiliary circuit AC1 may include a first CH gate CH1 that corresponds to the layer 1 (L1) and performs controlled Hadamard transformation on the auxiliary qubit AQ3 initialized to the |0> state based on a control qubit CQ5, a first CNOT gate CNOT1 that corresponds to layer 2 (L2) and rotates a target qubit TQ by π about the X axis based on the auxiliary qubit AQ3, and a second CH gate CH2 that corresponds to layer 3 (L3) and performs controlled Hadamard transformation on the auxiliary qubit AQ3 based on the control qubit CQ5.

The quantum gate group QGG may further include, corresponding to the layer 1 (L1), a fifth CH gate CH5 that performs controlled Hadamard transformation on the auxiliary qubit AQ1 initialized to the |0> state based on the control qubit CQ2 and a sixth CH gate CH6 that performs controlled Hadamard transformation on the auxiliary qubit AQ2 initialized to the state |0> based on the control qubit CQ4.

The quantum gate group QGG may include, corresponding to the layer 2 (L2), a first CZ gate CZ1 that rotates the auxiliary qubit AQ1 by π about the Z axis based on the control qubit CQ1 and a second CZ gate CZ2 that rotates the auxiliary qubit AQ2 by π about the Z axis based on the control qubit CQ3.

The quantum gate group QGG may further include, corresponding to the layer 3 (L3), a seventh CH gate CH7 that performs controlled Hadamard transformation on the auxiliary qubit AQ1 based on the control qubit CQ2 and an eighth CH gate CH8 that performs controlled Hadamard transformation on the auxiliary qubit AQ2 based on the control qubit CQ4.

The quantum gate group QGG may further include, corresponding to a layer 4 (L4), a first CS gate CS1 that rotates the auxiliary qubit AQ3 by π/2 about the Z axis based on the auxiliary qubit AQ2.

The quantum gate group QGG may further include, corresponding to a layer 5 (L5) a third CNOT gate CNOT3 that rotates the auxiliary qubit AQ2 by π about the X axis based on the auxiliary qubit AQ1.

The quantum gate group QGG may further include, corresponding to a layer 6 (L6), a first inverse CS gate ICS1 that rotates the auxiliary qubit AQ3 by −π/2 about the Z axis based on the auxiliary qubit AQ2.

The quantum gate group QGG may further include, corresponding to a layer 7 (L7), may include a fourth CNOT gate CNOT4 that rotates the auxiliary qubit AQ2 by π about the X axis based on the auxiliary qubit AQ1.

The quantum gate group QGG may further include, corresponding to a layer 8 (L8), a second CS gate CS2 that rotates the auxiliary qubit AQ3 by −π/2 about the Z axis based on the auxiliary qubit AQ1.

The quantum gate group QGG may further include, corresponding to a layer 9 (L9), a ninth CH gate CH9 that performs controlled Hadamard transformation on the auxiliary qubit AQ1 based on the control qubit CQ2, and a tenth CH gate CH10 that performs controlled Hadamard transformation on the auxiliary qubit AQ2 based on the control qubit CQ4.

The quantum gate group QGG may further include, corresponding to the layer 10 (L10), a third CZ gate CZ3 that rotates the auxiliary qubit AQ1 by π about the Z axis based on the control qubit CQ1, and a fourth CZ gate CZ4 that rotates the auxiliary qubit AQ2 by π about the Z axis based on the control qubit CQ3.

The quantum gate group QGG may further include, corresponding to the layer 11 (L11), an eleventh CH gate CH11 that performs controlled Hadamard transformation on the auxiliary qubit AQ1 based on the control qubit CQ2, and a twelfth CH gate CH12 that performs controlled Hadamard transformation on the auxiliary qubit AQ2 based on the control qubit CQ4.

The second auxiliary circuit AC2 may include a third CH gate CH3 corresponding to the layer 9 (L9) and configured to perform controlled Hadamard transformation on the auxiliary qubit AQ3 based on the control qubit CQ5, a second CNOT gate CNOT2 corresponding to the layer 10 (L10) and configured to rotate the target qubit TQ by π about the X axis based on the auxiliary qubit AQ3, and a fourth CH gate CH4 corresponding to the layer 11 (L11) and configured to perform controlled Hadamard transformation on the auxiliary qubit AQ3 based on the control qubit CQ5.

According to Equation 3, when implementing a multi-controlled NOT gate with 5 control qubit using quantum logic gates having two gates, the circuit depth is 13. The quantum circuit 700 can reduce the circuit depth to 11 by using a CS gate and an inverse CS gate. As a result, the quantum circuit 700 can implement a multi-controlled NOT gate with a smaller circuit depth.

Figure 8:
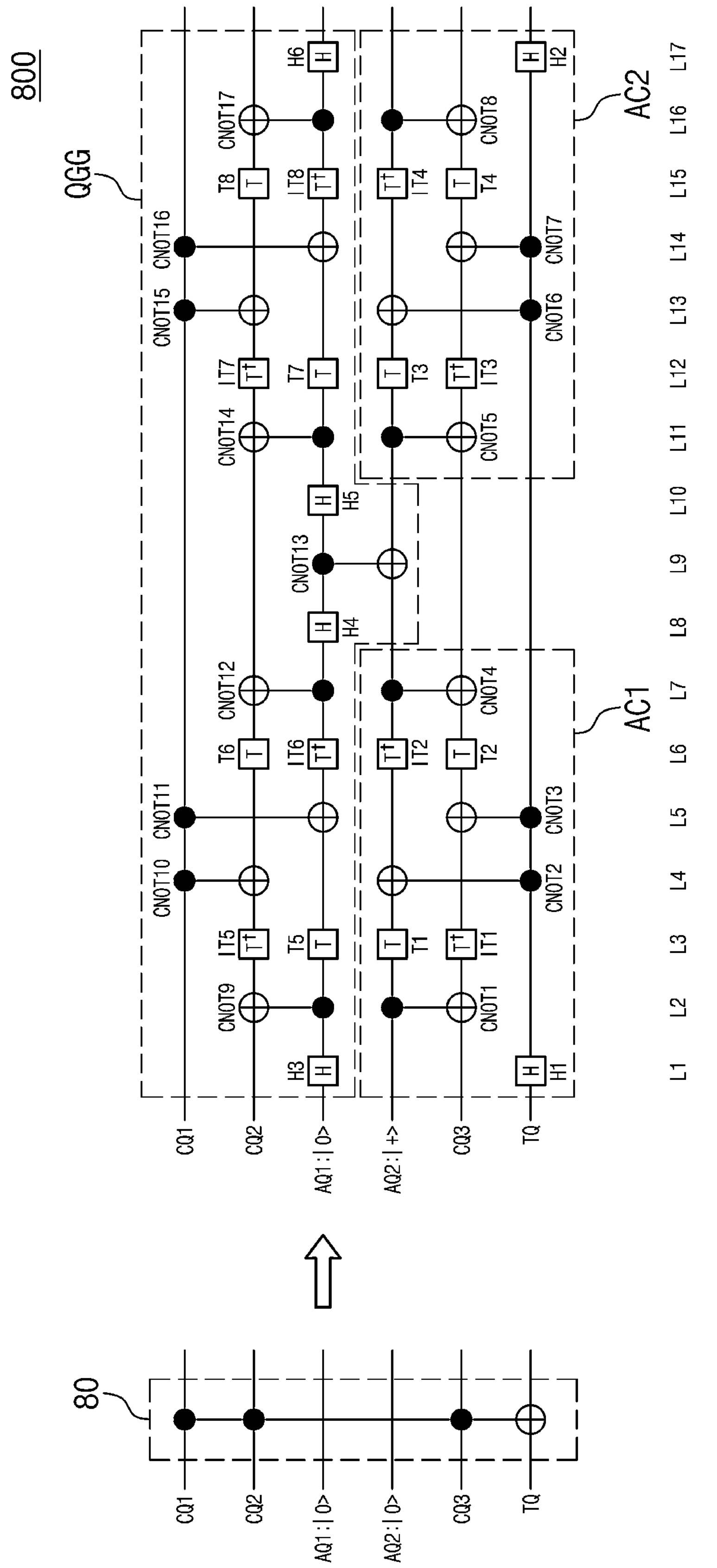
FIG. 8 is a circuit diagram illustrating an example of a quantum circuit for implementing a multi-controlled NOT gate with 3 control qubits according to an embodiment of the present disclosure.

FIG. 8 is a circuit diagram illustrating an example of a quantum circuit for implementing a multi-controlled NOT gate with 3 control qubits according to an embodiment of the present disclosure.

Referring to FIG. 8, the multi-controlled NOT gate with 3 control qubits 80 may be implemented through a quantum circuit 800 including a first auxiliary circuit AC1, a quantum gate group QGG, and a second auxiliary circuit AC2.

An H gate is a quantum logic gate that performs Hadamard transformation on a qubit.

A T gate is a quantum logic gate that rotates the state of a qubit by π/4 about the Z axis in a Bloch sphere.

An inverse T gate is a quantum logic gate that rotates the state of a qubit by −π/4 about the Z axis in a Bloch sphere.

The first auxiliary circuit AC1 may include a first H gate H1 that corresponds to layer 1 (L1) and performs Hadamard transformation on the target qubit TQ, a first CNOT gate CNOT1 that corresponds to a layer 2 (L2) and performs Pauli-X operation on the control qubit CQ3 based on the auxiliary qubit AQ2 initialized to a |+> state, a first T gate T1 that corresponds to layer 3 (L3) and performs π/4 phase transformation on the auxiliary qubit AQ2, a first inverse T gate IT1 that corresponds to layer 3 (L3) and performs −π/4 phase transformation on the control qubit CQ3, a second CNOT gate CNOT2 that corresponds to layer 4 (L4) and performs Pauli-X operation on the auxiliary qubit AQ2 based on the target qubit TQ, a third CNOT gate CNOT3 that corresponds to layer 5 (L5) and performs Pauli-X operation of the control qubit CQ3 based on the target qubit TQ, a second inverse T gate (IT2) that corresponds to layer 6 (L6) and performs a −π/4 phase conversion on the auxiliary qubit AQ2, a second T gate T2 that corresponds to layer 6 (L6) and performs π/4 phase transformation of the control qubit CQ3, and a fourth CNOT gates CNOT4 that corresponds to layer 7 (L7) and performs the Pauli-X operation on the control qubit CQ3 based on the auxiliary qubit AQ2.

The quantum gate group QGG may includes: corresponding to the layer 1 (L1), a third H gate H3 that performs Hadamard transformation on the auxiliary qubit AQ1 initialized to the |0> state; corresponding to the layer 2 (L2), a ninth CNOT gate CNOT9 performs Pauli-X operation on the control qubit CQ2 based on the auxiliary qubit AQ1; corresponding to layer 3 (L3), a fifth inverse T gate IT5 that performs −π/4 phase transformation on the control qubit CQ2 and a fifth T gate T5 that performs π/4 phase transformation on the auxiliary qubit AQ1; corresponding to layer 4 (L4), a tenth CNOT gate CNOT10 that performs Pauli-X operation on the control qubit CQ2 based on the control qubit CQ1; corresponding to layer 5 (L5), an eleventh CNOT gate CNOT11 that performs Pauli-X operation on the auxiliary qubit AQ1 based on the control qubit CQ1; corresponding to the layer 6 (L6), a sixth T gate T6 that performs π/4 phase transformation on the control qubit CQ2 and a sixth inverse T gate (IT6) that performs −π/4 phase transformation on the auxiliary qubit AQ1; corresponding to the layer 7 (L7), a twelfth CNOT gate CNOT12 that performs Pauli-X operation on the control qubit CQ2 based on the auxiliary qubit AQ1; corresponding to a layer 8 (L8), a fourth H gate H4 that performs Hadamard transformation on the auxiliary qubit AQ1; and, corresponding to a layer 9 (L9), a thirteenth CNOT gate CNOT13 that performs Pauli-X operation on the auxiliary qubit AQ2 based on the auxiliary qubit AQ1. The quantum gate group QGG may further includes: corresponding to a layer 10 (L10), a fifth H gate H5 that performs Hadamard transformation on the auxiliary qubit AQ1; corresponding to a layer 11 (L11), a fourteenth CNOT gate CNOT14 that performs Pauli-X operation on the control qubit CQ2 based on the auxiliary qubit AQ1; corresponding to a layer 12 (L12), a seventh inverse T gate IT7 that performs −π/4 phase transformation on the control qubit CQ2 and a seventh T gate T5 that performs π/4 phase transformation on the auxiliary qubit AQ1; corresponding to a layer 13 (L13), a fifteenth CNOT gate CNOT15 that performs Pauli-X operation on the control qubit CQ2 based on the control qubit CQ1; corresponding to a layer 14 (L14), an sixteenth CNOT gate CNOT16 that performs Pauli-X operation on the auxiliary qubit AQ1 based on the control qubit CQ1; corresponding to a layer 15 (L15), a eighth T gate T8 that performs π/4 phase transformation on the control qubit CQ2 and a eighth inverse T gate (IT8) that is perform −π/4 phase transformation on the auxiliary qubit AQ1; corresponding to a layer 16 (L16), a seventeenth CNOT gate CNOT17 performs Pauli-X operation on the control qubit CQ2 based on the auxiliary qubit AQ1; and, corresponding to a layer 17 (L17) a sixth H gate H6 that performs Hadamard transformation on the auxiliary qubit AQ1.

The second auxiliary circuit AC2 may include, corresponding to the layer 11 (L11), a fifth CNOT gate CNOT5 that performs Pauli-X operation on the control qubit CQ3 based on the auxiliary qubit AQ2, corresponding to the layer 12 (L12), a third T gate T3 that performs π/4 phase transformation on the auxiliary qubit AQ2 and a third inverse T gate IT3 that performs a −π/4 phase transformation on the control qubit CQ3, corresponding to the layer 13 (L13), a sixth CNOT gate CNOT6 that performs Pauli-X operation on the auxiliary qubit AQ2 based on the target qubit TQ, corresponding to the layer 14 (L14), a seventh CNOT gate TNOT7 that performs Pauli-X operation on the control qubit CQ3 based on the target qubit TQ, corresponding to a layer 15 (L15), a fourth inverse T gate (IT4) that performs −π/4 phase transformation on the auxiliary qubit AQ2 and a fourth T gate T4 that performs a π/4 phase transformation of the control qubit CQ3, corresponding to the layer 16 (L16), an eighth CNOT gate CNOT8 that performs a Pauli-X operation on the control qubit CQ3 based on an auxiliary qubit AQ2, and, corresponding to the layer 17 (L17), a second H gate H2 that performs Hadamard transformation on the target qubit TQ.

When implementing a quantum circuit with quantum logic gates having a CNOT gate or single qubit gates (H gate, T gate inverse T gate, etc.), N−1 auxiliary qubits are needed to implement a multi-controlled NOT gate with N control qubits. In this case, a circuit depth P of layers corresponding to the T gate or the inverse T gate (hereinafter, T-circuit depth) may be expressed by Equation 4.

$$P = 4(\lceil \log_2(N+1) \rceil - 1) \quad \text{[Equation 4]}$$

For example, for the quantum circuit 800, it is a multi-controlled NOT gate with 3 control qubits, and the T-circuit depth is 4. T-circuit depth can be used as an important indicator to dictate the speed of coupling tolerant quantum computing.

Referring to FIG. 8, a quantum logic gate (i.e., a Toffoli gate) having three gates of FIG. 2 may be expressed as a CNOT gate or quantum logic gates having single qubit gates (H gate, T gate inverse T gate, etc.). This may enable a multi-controlled NOT gate with N control qubits to be implemented using a relatively simpler quantum logic gate.

Figure 9:
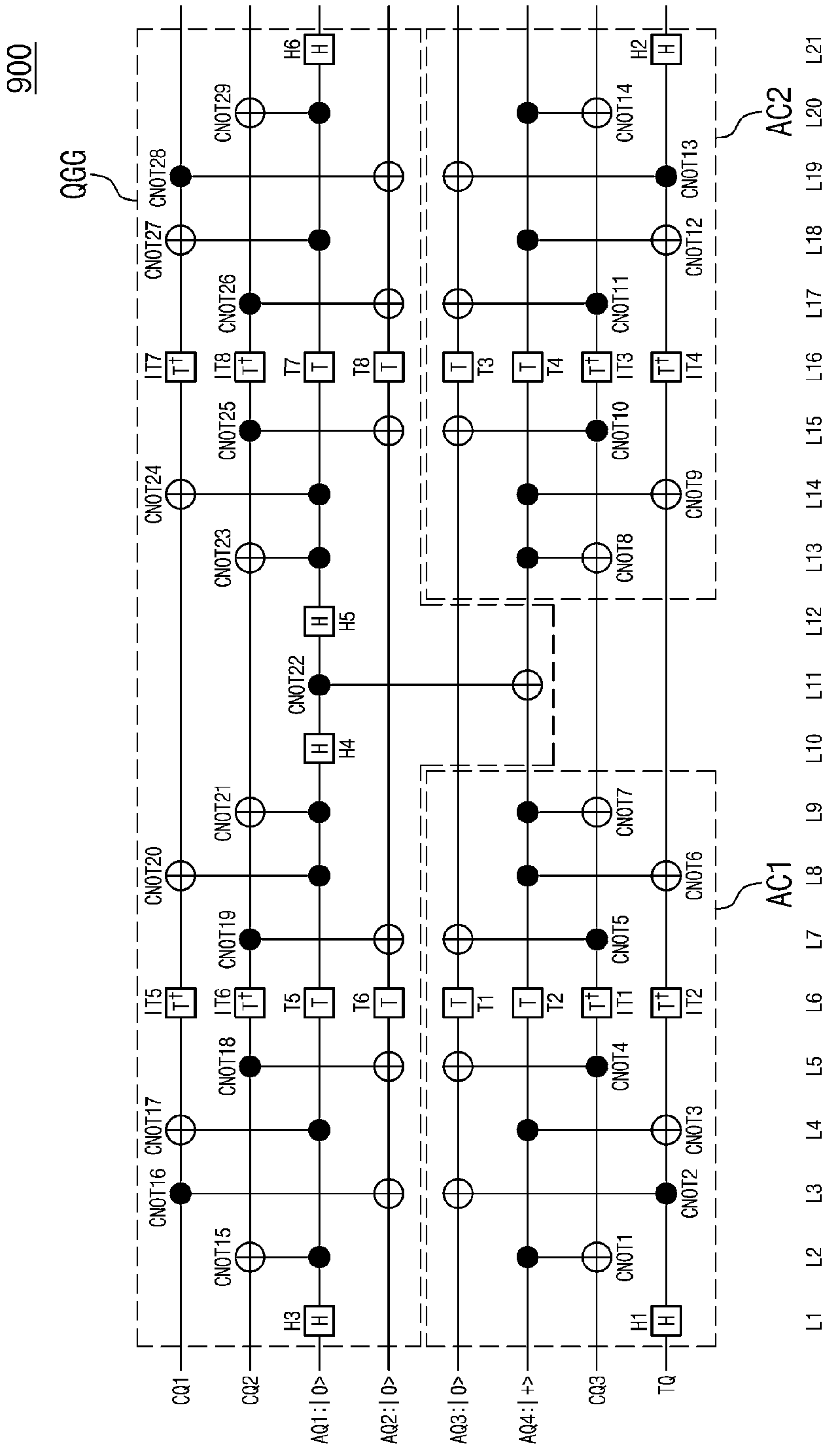
FIG. 9 is a circuit diagram illustrating an example of a quantum circuit for implementing a multi-controlled NOT gate with 3 control qubits according to an embodiment of the present disclosure.

FIG. 9 is a circuit diagram illustrating an example of a quantum circuit for implementing a multi-controlled NOT gate with 3 control qubits according to an embodiment of the present disclosure.

Referring to FIG. 9, the quantum circuit 900 may include a first auxiliary circuit AC1, a quantum gate group QGG, and a second auxiliary circuit AC2.

The first auxiliary circuit AC1 may include: corresponding to a layer 1 (L1), a first H gate H1 configured to perform Hadamard transformation on a target qubit TQ; corresponding to a layer 2 (L2), a first CNOT gate CNOT1 configured to rotate a control qubit CQ3 by π about the X axis based on a auxiliary qubit AQ4 initialized to the |+> state; corresponding to a layer 3 (L3), a second CNOT gate CNOT2 configured to rotate the auxiliary qubit AQ3 initialized to the state |0> by π about an X axis based on a target qubit TQ; corresponding to a layer 4 (L4), a third CNOT gate CNOT3 configured to rotate the target qubit TQ by π about a X axis based on the auxiliary qubit AQ4; corresponding to a layer 5 (L5), a fourth CNOT gate CNOT4 configured to rotate the auxiliary qubit AQ3 by π about the X axis based on the control qubit CQ3; corresponding to a layer 6 (L6), a first T gate T1 configured to perform π/4 phase transformation on the auxiliary qubit AQ3, a second T gate T2 configured to perform π/4 phase transformation on the auxiliary qubit AQ4, a first inverse T gate IT1 configured to perform −π/4 phase transformation on the control qubit CQ3, and a second inverse T gate IT2 configured to perform −π/4 phase transformation on the target qubit TQ; configured to a layer 7 (L7), a fifth CNOT gate CNOT5 configured to rotate auxiliary qubit AQ3 by π about the X axis based on the control qubit CQ3; corresponding to a layer 8 (L8), a sixth CNOT gate CNOT6 configured to rotate the target qubit TQ by π about the X axis based on the auxiliary qubit AQ4; and, corresponding to a layer 9 (L9), a seventh CNOT gate CNOT7 configured to rotate the control qubit CQ3 by π about the X axis based on the auxiliary qubit AQ4.

The quantum gate group QGG may include: corresponding to the layer 1 (L1), a third H gate H3 that performs Hadamard transformation on the auxiliary qubit AQ1 initialized to the |0> state; corresponding to the layer 2 (L2), a 15th CNOT gate CNOT15 that rotates the control qubit CQ2 by π about the X axis based the auxiliary qubit AQ1; corresponding to the layer 3 (L3), a 16th CNOT gate CNOT16 that rotates the auxiliary qubit AQ2 initialized to the 0> state by π about an X axis based on a control qubit CQ1; corresponding to the layer 4 (L4), a 17th CNOT gate CNOT17 that rotates the control qubit CQ1 by π about X axis based on the auxiliary qubit AQ1; corresponding to the layer 5 (L5), an 18th CNOT Gate CNOT18 that rotates the auxiliary qubit AQ2 by π about the X axis based on the control qubit CQ2; corresponding to the layer 6 (L6), a fifth inverse T gate IT5 that performs −π/4 phase transformation on the control qubit CQ1, a sixth inverse T gate T6 that performs −π/4 phase transformation on the control qubit CQ2, a fifth T gate T5 that performs π/4 phase transformation on the auxiliary qubit AQ1, and a sixth T gate T6 that performs π/4 phase transformation on the auxiliary qubit AQ2; corresponding to the layer 7 (L7), nineteenth CNOT gate CNOT19 that rotates the auxiliary qubit AQ2 by π about the X axis based on the control qubit CQ2; corresponding to the layer 8 (L8), twentieth CNOT gate CNOT20 that rotates the control qubit CQ1 by π about the X axis based on the auxiliary qubit AQ1; corresponding to the layer 9 (L9), 21st CNOT Gate that rotates the control qubit CQ2 by π about the X axis based on the auxiliary qubit AQ1; corresponding to a layer 10 (L10), a fourth H gate H4 that performs Hadamard transformation on the auxiliary qubit AQ1; and, corresponding to a layer 11 (L11), 22nd CNOT gate CNOT22 that rotates the auxiliary qubit AQ4 by π about the X axis based on the auxiliary qubit AQ1. The quantum gate group QGG may further include: corresponding to a layer 12 (L12), a fifth H gate H5 that performs Hadamard transformation on the auxiliary qubit A1; corresponding to a layer 13 (L13), a 23th CNOT gate CNOT23 that rotates the control qubit CQ2 by π about the X axis based on the auxiliary qubit AQ1; corresponding to a layer 14 (L14), a 24th CNOT gate CNOT24 that rotates the control qubit CQ1 by π about the X axis based on the auxiliary qubit AQ1; corresponding to a layer 15 (L15), a 25th CNOT gate CNOT25 that rotates the auxiliary qubit AQ2 by π about the X axis based on the control qubit CQ2; corresponding to a layer 16 (L16), a seventh inverse T gate IT7 that performs −π/4 phase transformation on the control qubit CQ1, a eighth inverse T gate T8 that performs −π/4 phase transformation on the control qubit CQ2, a seventh T gate T7 that performs π/4 phase transformation on the auxiliary qubit AQ1, and a eighth T gate T8 that performs π/4 phase transformation on the auxiliary qubit AQ2; corresponding to a layer 17 (L17), a 26th CNOT gate CNOT26 that rotates the auxiliary qubit AQ2 by π about the X axis based on the control qubit CQ2; a 27th CNOT gate CNOT27 that rotates the control qubit CQ1 by π about the X axis based on the auxiliary qubit AQ1; corresponding to a layer 19 (L19), a 28th CNOT gate CNOT28 that rotates the auxiliary qubit AQ2 by π about the X axis based on the control qubit CQ1; corresponding to a layer 20 (L20), a 29th CNOT gate CNOT29 that rotates the control qubit CQ2 by π about the X axis based on the auxiliary qubit AQ1; and, corresponding to a layer 21 (L21), a sixth H gate H6 that performs Hadamard transformation on the auxiliary qubit AQ1.

The second auxiliary circuit AC2 may includes: corresponding to the layer 13 (L13), an eighth CNOT gate CNOT8 that rotates the control qubit CQ3 by π about the X axis based on the auxiliary qubit AQ4; corresponding to the layer 24 (L24), a ninth CNOT gate CNOT9 that rotates the target qubit TQ by π about the X axis based on the auxiliary qubit AQ4; corresponding to the layer 15 (L15), a tenth CNOT gate CNOT10 that rotates the auxiliary qubit AQ3 by π about the X axis based on the control qubit CQ3; corresponding to the layer 16 (L16), a third T gate T3 that performs π/4 phase transformation on the auxiliary qubit AQ3, a fourth T gate T4 that performs π/4 phase transformation on the auxiliary qubit AQ4, a third inverse T gate IT3 that performs −π/4 phase transformation on the control qubit CQ3, and a fourth inverse T gate IT4 that performs −π/4 phase transformation on the target qubit TQ; corresponding to the layer 17 (L17), an eleventh CNOT gate CNOT11 that rotates the auxiliary qubit AQ3 by π about the X axis based on the control qubit CQ3; corresponding to the layer 18 (L18), a twelfth CNOT gate CNOT12 that rotates the target qubit TQ by π about the X axis based on the auxiliary qubit AQ4; corresponding to the layer 19 (L19), a thirteenth CNOT gate CNOT13 that rotates the auxiliary qubit AQ3 by π about the X axis based on the target qubit TQ; corresponding to the layer 20 (L20), fourteenth CNOT gate CNOT14 that rotates control qubit CQ3 by π about the X axis based on the auxiliary qubit AQ3; and, corresponding to the layer 21 (L21), a second H gate H2 that perform Hadamard transformation on the target qubit TQ.

The layer 2 (L2) and the layer 3 (L3) of the quantum circuit 900 may correspond to the same circuit depth. The layer 4 (L4) and the layer 5 (L5) of the quantum circuit 900 may correspond to the same circuit depth. The layer 7 (L7) and the layer 8 (L8) of the quantum circuit 900 may correspond to the same circuit depth. The layer 14 (L14) and the layer 15 (L15) of the quantum circuit 900 may correspond to the same circuit depth. The layer 17 (L17) and the layer 18 (L18) of the quantum circuit 900 may correspond to the same circuit depth. The layer 19 (L19) and the layer 20 (L20) of the quantum circuit 900 may correspond to the same circuit depth.

When a multi-controlled NOT gate with N control qubits is implemented based on the quantum circuit 900, 2(N−1) auxiliary qubits are required. In this case, the T-circuit depth Q may be expressed by Equation 5.

$$Q = 2(\lceil \log_2(N+1) \rceil - 1) \quad \text{[Equation 5]}$$

The quantum circuit 900 has a similar aspect to the quantum circuit 800 described in FIG. 8, but the T-circuit depth can be reduced by half while using double auxiliary qubits. As a result, the quantum circuit 900 can have a smaller T-circuit depth.

Figure 10:
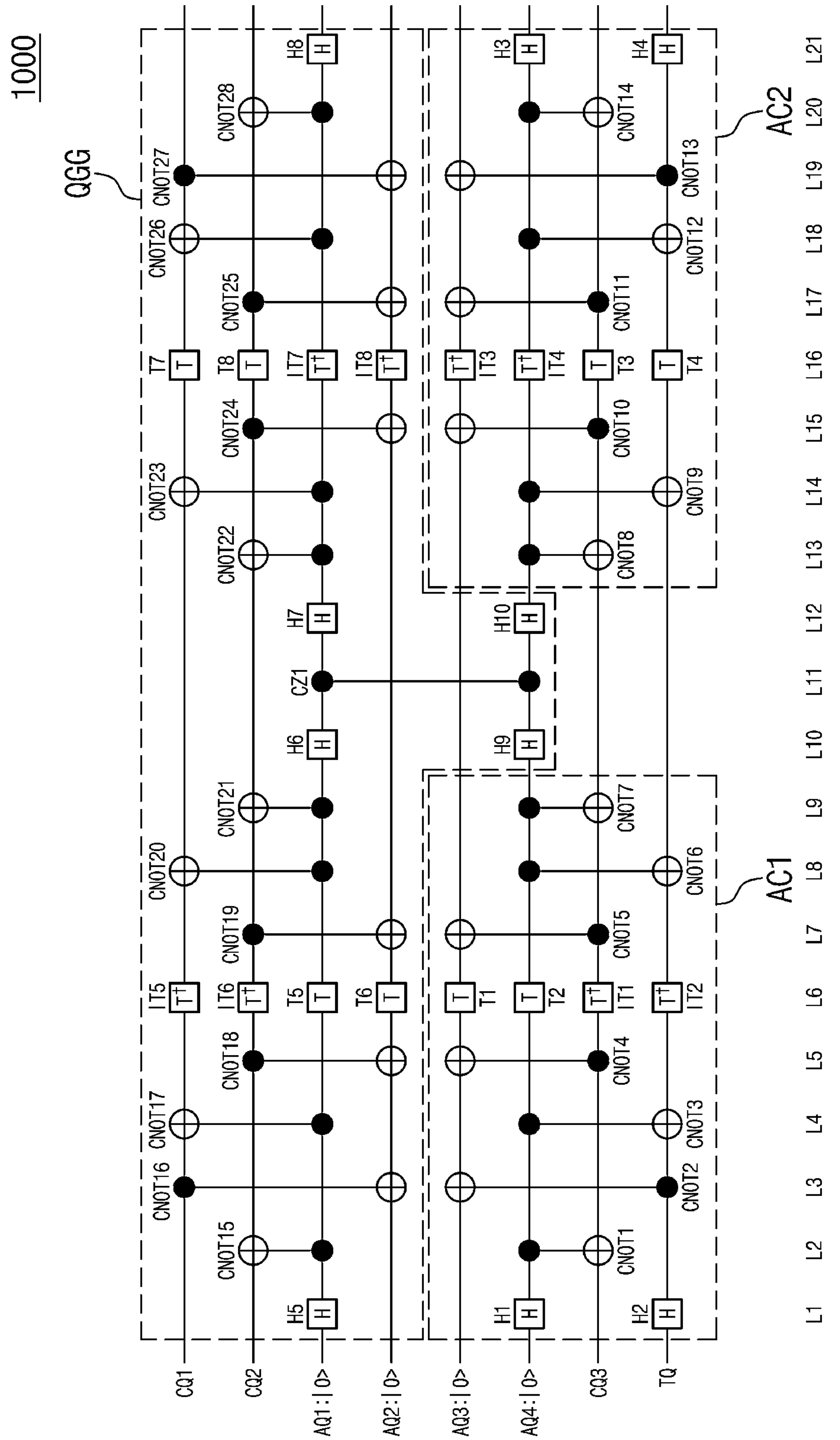
FIG. 10 is a circuit diagram illustrating an example of a quantum circuit for implementing a multi-controlled NOT gate with 3 control qubits according to an embodiment of the present disclosure.

FIG. 10 is a circuit diagram illustrating an example of a quantum circuit for implementing a multi-controlled NOT gate with 3 control qubits according to an embodiment of the present disclosure.

Referring to FIG. 10, the quantum circuit 1000 may include a first auxiliary circuit AC1, a quantum gate group QGG, and a second auxiliary circuit AC2.

The first auxiliary circuit AC1 includes: corresponding to a layer a (L1), a first H gate H1 configured to perform Hadamard transformation on an auxiliary qubit AQ4 initialized to the |0> state and a second H gate H2 configured to perform Hadamard transformation on a target qubit TQ; corresponding to a layer 2 (L2), a first CNOT gate CNOT1 configured to rotate a control qubit CQ3 by π about the X axis based on the auxiliary qubit AQ4; corresponding to a layer 3 (L3), a second CNOT gate CNOT2 configured to rotate an auxiliary qubit AQ3 initialized to the |0> state by r about the X axis based on a target qubit TQ; corresponding to a layer 4 (L4), a third CNOT gate CNOT3 configured to rotate the target qubit TQ by r about the X axis based on the auxiliary qubit AQ4; corresponding to a layer 5 (L6), a fourth CNOT gate CNOT4 configured to rotate the auxiliary qubit AQ3 by π about the X axis based on the control qubit CQ3; corresponding to a layer 6 (L6), a first T gate T1 configured to perform π/4 phase transformation on the auxiliary qubit AQ3, a second T gate T2 configured to perform π/4 phase transformation on the auxiliary qubit AQ4, a first inverse T gate IT1 configured to perform −π/4 phase transformation on the control qubit CQ3 and a second inverse T gate IT2 configured to perform −λ/4 phase transformation on the target qubit TQ; corresponding to a layer 7 (L7), a fifth CNOT gate CNOT5 configured to rotate the auxiliary qubit AQ3 by r about the X axis based on the control qubit CQ3; corresponding to a layer 8 (L8), a sixth CNOT gate CNOT6 configured to rotate the target qubit TQ by π about the X axis based on the auxiliary qubit AQ4; and, corresponding to a layer 9 (L9), a seventh CNOT gate CNOT7 configured to rotate the control qubit CQ3 by r about X axis based on the auxiliary qubit AQ4.

The quantum gate group QGG may include: corresponding to the layer 1 (L1), a fifth H gate H5 that performs Hadamard transformation on the auxiliary qubit AQ1 initialized to the |0> state; corresponding to the layer 2 (L2), a fifteenth CNOT gate CNOT15 that rotates the control qubit CQ2 by π about the X axis based on the auxiliary qubit AQ1; corresponding to the layer 3 (L3), a sixteenth CNOT gate CNOT16 that rotates the auxiliary qubit AQ2 initialized to the 0> state by r about the X axis based on the control qubit CQ1; corresponding to the layer 4 (L4), a seventeenth CNOT gate CNOT17 that rotates the control qubit CQ1 by π about the X axis based on the auxiliary qubit AQ1; corresponding to the layer 5 (L5), an eighteenth CNOT Gate CNOT18 that rotates the auxiliary qubit AQ2 by π about the X axis based on the control qubit CQ2; corresponding to the layer 6 (L6), a fifth inverse T gate IT5 that performs −π/4 phase transformation on the control qubit CQ1, a sixth inverse T gate T6 that performs −¼ phase transformation on the control qubit CQ2, a fifth T gate T5 that performs π/4 phase transformation on the auxiliary qubit AQ1, and a sixth T gate T6 which performs π/4 phase transformation on the auxiliary qubit AQ2; corresponding to the layer 7 (L7), a nineteenth CNOT gate CNOT19 that rotates the auxiliary qubit AQ2 by π about the X axis based on the control qubit CQ2; corresponding to the layer 8 (L8), a 20th CNOT gate CNOT20 that rotates the control qubit CQ1 by π about the X axis based on the auxiliary qubit AQ1; corresponding to the layer 9 (L9), a 21st CNOT gate CNOT21 that rotates the control qubit CQ2 by π about the X axis based on the auxiliary qubit AQ1; corresponding to a layer 10 (L10), a sixth H gate H6 that performs Hadamard transformation on the auxiliary qubit AQ1 and ninth H gate H9 that performs Hadamard transformation on the auxiliary qubit AQ4; corresponding to a layer 11 (L11), a first CZ gate CZ1 that rotates the auxiliary qubit AQ4 by π about the Z axis based on the auxiliary qubit AQ1; and, corresponding to a layer 12 (L12), a seventh H gate H7 that performs Hadamard transformation on the auxiliary qubit AQ1 and tenth H gate H10 that performs Hadamard transformation on the auxiliary qubit AQ4. The quantum gate group QGG may further include: corresponding to a layer 13 (L13), a 22nd CNOT gate CNOT22 that rotates the control qubit CQ2 by π about the X axis based on the auxiliary qubit AQ1; corresponding to a layer 14 (L14), a 23rd CNOT gate CNOT23 that rotates the control qubit CQ1 by π about the X axis based on the auxiliary qubit AQ1; corresponding to a layer 15 (L15), a 24th CNOT gate CNOT24 that rotates the auxiliary qubit AQ2 by π about the X axis based on the control qubit CQ2; corresponding to a layer 16 (L16), a seventh T gate T7 that performs π/4 phase transformation on the control qubit CQ1, a eighth T gate T8 that performs π/4 phase transformation on the control qubit CQ2, a seventh inverse T gate IT7 that performs −π/4 phase transformation on the auxiliary qubit AQ1, and a eighth inverse T gate IT8 which performs −π/4 phase transformation on the auxiliary qubit AQ2; corresponding to a layer 17 (L17), a 25th CNOT gate CNOT25 that rotates the auxiliary qubit AQ2 by π about the X axis based on the control qubit CQ2; corresponding to a layer 18 (L18), a 26th CNOT gate CNOT26 that rotates the control qubit CQ1 by π about the X axis based on the auxiliary qubit AQ1; corresponding to a layer 19 (L19), a 27th CNOT gate CNOT27 that rotates the auxiliary qubit AQ2 by π about the X axis based on the control qubit CQ1; corresponding to a layer 20 (L20), a 28th CNOT gate CNOT28 that rotates the control qubit CQ2 by π about the X axis based on the auxiliary qubit AQ1; corresponding to a layer 21 (L21), an eight H gate H8 that performs Hadamard transformation on the auxiliary qubit AQ1.

The second auxiliary circuit AC2 may includes: corresponding to the layer 13 (L13), an eighth CNOT gate CNOT8 that rotates the control qubit CQ3 by π about the X axis based on the auxiliary qubit AQ4; corresponding to the layer 14 (L14), a ninth CNOT gate CNOT9 that rotates the target qubit TQ by π about the X axis based on the auxiliary qubit AQ4; corresponding to the layer 15 (L15), a tenth CNOT gate TNOT10 that rotates the auxiliary qubit AQ3 by π about the X axis based on the control qubit CQ3; corresponding to the layer 16 (L16), a third inverse T gate IT3 that performs −π/4 phase transformation on the auxiliary qubit AQ3, a fourth inverse T gate IT4 that performs −π/4 phase transformation on the auxiliary qubit AQ4, a third T gate T3 that performs π/4 phase transformation on the control qubit CQ3, and a fourth T gate T4 that performs π/4 phase transformation on the target qubit TQ; corresponding to the layer 17 (L17), an eleventh CNOT gate CNOT11 that rotates the auxiliary qubit AQ3 by π about the X axis based on the control qubit CQ3; corresponding to the layer 18 (L18), a twelfth CNOT gate CNOT12 that rotates the targets qubit T Q by π about the X axis based on auxiliary qubits AQ4; corresponding to the layer 19 (L19) a thirteenth CNOT gate CNOT13 that rotate the auxiliary qubit AQ3 by π the X axis based on the target qubit TQ; corresponding to the layer 20 (L20), a fourteenth CNOT gate CNOT14 that rotates the control qubit CQ3 by π about the X axis based on the auxiliary qubit AQ4; and, corresponding to the layer 21 (L21), a third H gate that performs Hadamard transformation on the auxiliary qubit AQ4 and a fourth H gate that performs Hadamard transformation on the target qubit TQ.

The layer 2 (L2) and the layer 3 (L3) of the quantum circuit 1000 may correspond to the same circuit depth. The layer 4 (L4) and the layer 5 (L5) of the quantum circuit 1000 may correspond to the same circuit depth. The layer 7 (L7) and the layer 8 (L8) of the quantum circuit 1000 may correspond to the same circuit depth. The layer 14 (L14) and the layer 15 (L15) of the quantum circuit 1000 may correspond to the same circuit depth. The layer 17 (L17) and the layer 18 (L18) of the quantum circuit 1000 may correspond to the same circuit depth. The layer 19 (L19) and the layer 20 (L20) of the quantum circuit 1000 may correspond to the same circuit depth.

The quantum circuit 1000 is similar to the quantum circuit 900 of FIG. 9, but the auxiliary qubit AQ4 is initialized to |0>. In addition, in the quantum circuit 1000, the first CZ gate CZ1 is disposed at a position of the 22nd CNOT gate CNOT22 included in the quantum circuit 900 of FIG. 9. In the quantum circuit 1000, the inverse T gates IT3 and IT4 are disposed at the third T gate T3 and the fourth T gate T4 of the quantum circuit 900 in FIG. 9, and the T gates T3 and T4 are disposed at a third inverse T gate IT3 and a fourth inverse T gate T4 in the quantum circuit 900. In the quantum circuit 1000, T gates T7 and T8 are disposed at positions of the seventh inverted T gate IT7 and the eighth inverted T gate IT8 of the quantum circuit 900 of FIG. 9, respectively, and the inverted T gates IT7 and IT8 are disposed at the positions of the seventh T gate T7 and the eighth T gate T8 of the quantum Circuit 900 of FIG. 9.

Figure 11:
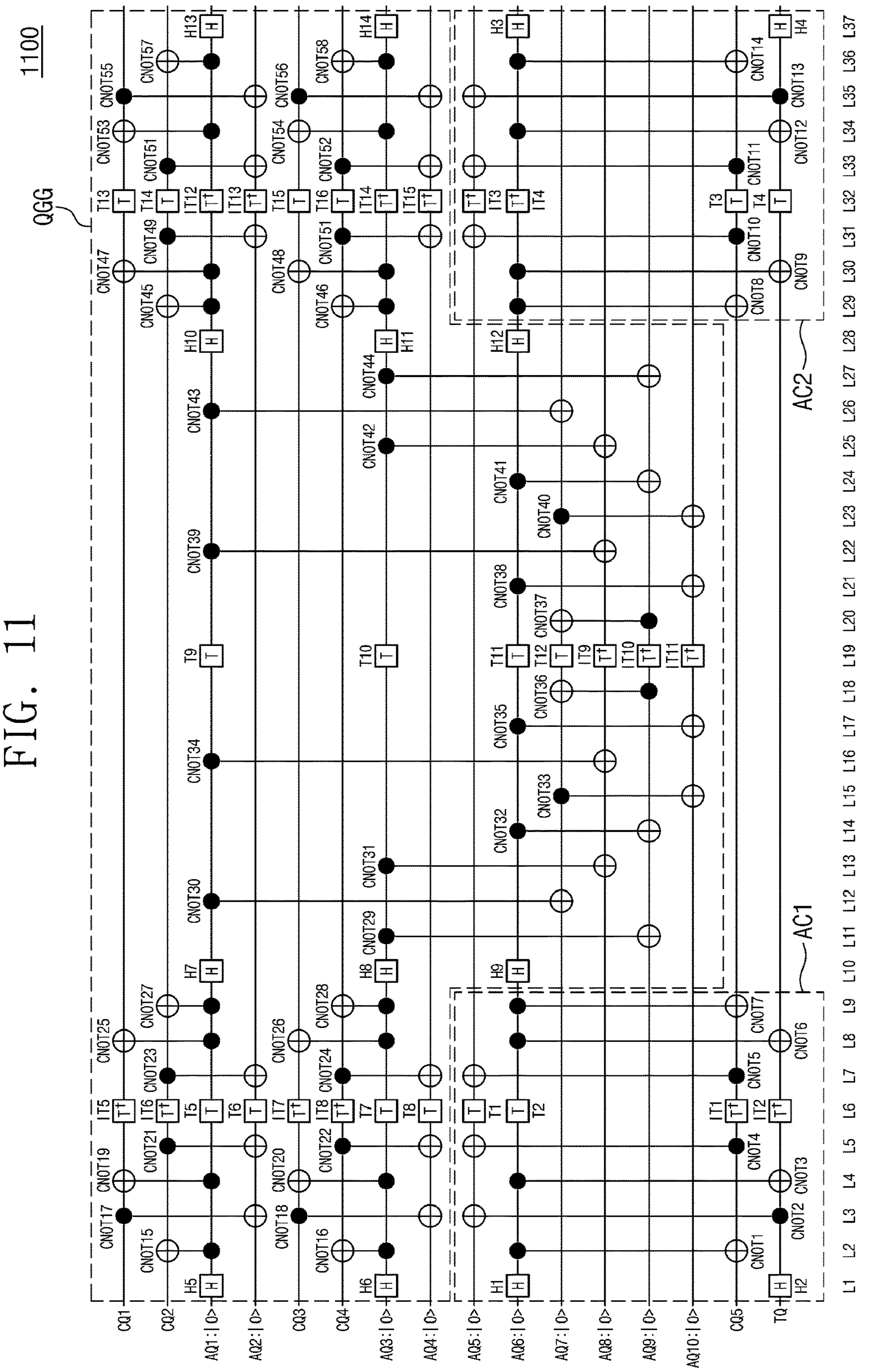
FIG. 11 is a circuit diagram illustrating an example of a quantum circuit for implementing a multi-controlled NOT gate with 5 control qubits according to an embodiment of the present disclosure.

FIG. 11 is a circuit diagram illustrating an example of a quantum circuit for implementing a multi-controlled NOT gate with 5 control qubits according to an embodiment of the present disclosure.

Referring to FIG. 11, the quantum circuit 1100 may include a first auxiliary circuit AC1, a quantum gate group QGG, and a second auxiliary circuit AC2.

The first auxiliary circuit AC1 may include: corresponding to a layer 1 (L1), a first H gate H1 configured to perform Hadamard transformation on the auxiliary qubit AQ6 initialized to the |0> state and a second H gate H2 configured to perform a Hadamard transformation on a target qubit TQ; corresponding to a layer 2 (L2), a first CNOT gate CNOT1 configured to rotate the control qubit CQ5 by π about the X axis based on the auxiliary qubit AQ6; a second CNOT gate CNOT2 configured to rotate the auxiliary qubit AQ5 initialized to the 0> state based on the target qubit TQ by π about to the X axis; corresponding to a layer 3 (L3), a third CNOT gate CNOT3 configured to rotate the target qubit TQ by π about the X axis based on the auxiliary qubit AQ6; corresponding to a layer 5 (L5), a fourth CNOT gate CNOT4 configured to rotate the auxiliary qubit AQ5 by π about the X axis based on the control qubit CQ5; corresponding to a layer 6 (L6), a first T gate T1 configured to perform π/4 phase transformation on the auxiliary qubit AQ5, a second T gate T2 configured to perform r/4 phase transformation on the auxiliary qubit AQ6, a first inverse T gate IT1 configured to perform −π/4 phase transformation on the control qubit CQ5, and a second inverse T gate IT2 configured to perform −π/4 phase transformation on the target qubit TQ; corresponding to a layer 7, a fifth CNOT gate CNOT5 configured to rotate the auxiliary qubit AQ5 by r about the X axis based on the control qubit CQ5; corresponding to a layer 8 (L8), a sixth CNOT gate CNOT6 configured to rotate the target qubit TQ by π about the X axis based on the auxiliary qubit AQ6; and, corresponding to a layer 9 (L9), a seventh CNOT gate CNOT7 configured to rotate the control qubit CQ5 by r about the X axis based on the auxiliary qubit AQ6.

The quantum gate group QGG may includes:

- corresponding the layer 1 (L1), a fifth H gate H5 configured to perform Hadamard transformation on a auxiliary qubit AQ1 initialized to the |0> state, and a sixth H gate H6 configured to perform Hadamard transformation on an auxiliary qubit AQ3 initialized to the 0> state;
- corresponding to the layer 2 (L2), a fifteenth CNOT gate CNOT15 configured to rotate a control qubit CQ2 by π about the X axis based on the auxiliary qubit AQ1, and a sixteenth CNOT gate CNOT16 configured to rotate a control qubit CQ4 by π about the X axis based on the auxiliary the qubit AQ3;
- corresponding to the layer 3 (L3), a seventeenth CNOT gate CNOT17 configured to rotate the auxiliary qubit AQ2 initialized to the |0> state by π about the X axis based on the control qubit CQ1, and an eighteenth CNOT gateway CNOT18 configured to rotate an auxiliary qubit AQ4 initialized to the 0> state by π about the X axis based on a control qubit CQ3;
- corresponding to the layer 4 (L4), a nineteenth CNOT gate CNOT19 configured to rotate the control qubit CQ1 by π about the X axis based on the auxiliary qubit AQ1, and a twentieth CNOT gate CNOT20 configured to rotate the control qubit CQ3 by π about the X axis based on the auxiliary qubit AQ3;
- corresponding to the layer 5 (L5), a 21st CNOT gate CNOT21 configured to rotate the auxiliary qubit AQ2 by π about the X axis based on the control qubit CQ2, and a 22nd CNOT gate CNOT22 configured to rotate the auxiliary qubit AQ4 by π about the X axis based on the control CQ4;
- corresponding to the layer 6 (L6), a fifth inverse T gate IT5 configured to perform −π/4 phase transformation on the control qubit CQ1, a sixth inverse T gate IT6 configured to perform −π/4 phase transformation on the control qubit CQ2, a fifth T gate T5 configured to perform π/4 phase transformation on the auxiliary qubit AQ1, a sixth T gate T6 configured to perform π/4 Phase Transformation on the auxiliary qubit AQ2, a seventh inverse T gate IT7 configured to perform −π/4 Phase transformation on the control qubit CQ3, an eighth inverse T gate IT8 configured to perform −π/4 phase transformation on the control qubit CQ4, a seventh T gate T7 configured to perform π/4 phase transformation on the auxiliary qubit AQ3, and an eighth T gate T8 configured to perform π/4 phase transformation on the auxiliary qubit AQ4;
- corresponding to the layer 7, a 23rd CNOT gate CNOT23 configured to rotate the auxiliary qubit AQ2 by π about the X axis based on the control qubit CQ2 and a 24th CNOT gate CNOT24 configured to rotate the auxiliary qubit AQ4 by π about the X axis to correspond to the layer 7;
- corresponding to the layer 8 (L8), a 25th CNOT gate CNOT25 configured to rotate the control qubit CQ1 by π about the X axis based on the auxiliary qubit AQ1, and a 26th CNOT gate CNOT26 configured to rotate the control qubit CQ3 by π about the X axis based on the auxiliary qubit AQ3;
- corresponding to the layer 9 (L9), a 27th CNOT gate CNOT27 configured to rotate the control qubit CQ2 by π about the X axis based on the auxiliary qubit AQ1, and a 28th CNOT gate CNOT28 configured to rotate the control qubit CQ4 by π about the X axis based on the auxiliary qubit AQ3;
- corresponding to a layer 10 (L10), a seventh H gate H7 configured to perform Hadamard transformation on the auxiliary qubit AQ1, an eighth H gate H8 configured to perform Hadamard transformation on an auxiliary qubit AQ3, and a ninth H gate H9 configured to perform Hadamard transformation on auxiliary qubits AQ6;
- corresponding to a layer 11 (L11), a 29th CNOT gate CNOT29 configured to rotate an auxiliary qubit AQ9 initialized to the |0> state by π about the X axis based on the auxiliary qubit AQ3;
- corresponding to a layer 12 (L12), a 30th CNOT gate CNOT30 configured to rotate an auxiliary qubit AQ7 initialized to the |0> state by π about the X axis based on the auxiliary qubit AQ1;
- corresponding to a layer 13 (L13), a 31st CNOT gate CNOT31 configured to rotate an auxiliary qubit AQ8 initialized to the |0> state by π about the X axis based on the auxiliary qubit AQ3;

corresponding to a layer 14 (L14), a 32nd CNOT gate CNOT32 configured to rotate the auxiliary qubit AQ9 by π about the X axis based on the auxiliary qubit AQ6;

corresponding to a layer 15 (L15), a 33rd CNOT gate CNOT33 configured to rotate an auxiliary qubit AQ10 initialized to the |0> state by π about the X axis based on the auxiliary qubit AQ7;

corresponding to a layer 16 (L16), a 34th CNOT gate CNOT34 configured to rotate the auxiliary qubit AQ8 by π about the X axis based on the auxiliary qubit AQ1;

corresponding to a layer 17 (L17), a 35th CNOT gate CNOT35 configured to rotate the auxiliary qubit AQ10 by π about the X axis based on the auxiliary qubit AQ6;

corresponding to a layer 18 (L18), a 36th CNOT gate CNOT36 configured to rotate the auxiliary qubit AQ7 by π about the X axis based on the auxiliary qubit AQ9;

corresponding to a layer 19 (L19), a ninth T gate T9 configured to perform π/4 phase transformation on the auxiliary qubit AQ1, a tenth T gate T10 configured to perform π/4 phase transformation on the auxiliary qubit AQ3, an eleventh T gate T11 configured to perform 7*r*/4 phase transformation on the auxiliary qubit AQ6, a twelfth T gate T12 configured to perform π/4 phase transformation on the auxiliary qubit AQ7, a ninth inverse T gate IT9 configured to perform −π/4 phase transformation on the auxiliary qubit AQ8, a tenth inverse T gate IT10 configured to perform −π/4 Phase Transformation on the auxiliary qubit AQ9, and an eleventh inverse T gate IT11 that performs −π/4 phase transformation on the auxiliary qubit AQ10;

corresponding to a layer 20 (L20), a 37th CNOT gate CNOT37 configured to rotate the auxiliary qubit AQ7 by π about the X axis based on the auxiliary qubit AQ9;

corresponding to a layer 21 (L21), a 38th CNOT gate CNOT38 configured to rotate the auxiliary qubit AQ10 by π about the X axis based on the auxiliary qubit AQ6;

corresponding to a layer 22 (L22), a 39th CNOT gate CNOT39 configured to rotate the auxiliary qubit AQ8 by π about the X axis based on the auxiliary qubit AQ1;

corresponding to a layer 23 (L23), a 40th CNOT gate CNOT40 configured to rotate the auxiliary qubit AQ10 by π about the X axis based on the auxiliary qubit AQ7;

corresponding to a layer 24 (L24), a 41st CNOT gate CNOT41 configured to rotate the auxiliary qubit AQ9 by π about the X axis based on the auxiliary qubit AQ6;

corresponding to a layer 25 (L25), a 42nd CNOT gate CNOT42 configured to rotate the auxiliary qubit AQ8 by π about the X axis based on the auxiliary qubit AQ3;

corresponding to a layer 26 (L26), a 43rd CNOT gate CNOT43 configured to rotate the auxiliary qubit AQ7 by π about the X axis based on the auxiliary qubit AQ1;

corresponding to a layer 27 (L27), a 44th CNOT gate CNOT44 configured to rotate the auxiliary qubit AQ9 by π about the X axis based on the auxiliary qubit AQ3;

corresponding to a layer 28 (L28), a tenth H gate H10 configured to perform Hadamard transformation on the auxiliary qubit AQ1, an eleventh H gate H11 configured to perform Hadamard transformation on the auxiliary qubit AQ3, and a twelfth H gate H12 configured to perform Hadamard transformation on the auxiliary qubit AQ6;

corresponding to a layer 29 (L29), a 45 h CNOT gate CNOT45 configured to rotate the control qubit CQ2 by π about the X axis based on the auxiliary qubit AQ1 and a 46th CNOT gate CNOT46 configured to rotate the control qubit CQ4 by π about the X axis based on the auxiliary qubit AQ3;

corresponding to a layer 30 (L30), a 47 h CNOT gate CNOT47 configured to rotate the control qubit CQ1 by π about the X axis based on the auxiliary qubit AQ1, and a 48th CNOT gate CNOT48 configured to rotate the control qubit CQ3 by π about the X axis based on the auxiliary qubit AQ3;

corresponding to a layer 31 (L31), a 49th CNOT gate CNOT49 configured to rotate the auxiliary qubit AQ2 by π about the X axis based on the control qubit CQ2, and a 50th CNOT gate CNOT50 configured to rotate the auxiliary qubit AQ4 by π about the X axis based on the control-qubit CQ4;

corresponding to a layer 32 (L32), a thirteenth T gate T13 configured to perform π/4 phase transformation on the control qubit CQ1, a fourteenth T gate T14 configured to perform π/4 phase transformation on the control qubit CQ2, a twelfth inverse T gate IT12 configured to perform −π/4 phase transformation on the auxiliary qubit AQ1, a thirteenth inverse T gate IT13 configured to perform −π/4 phase transformation on the auxiliary qubit AQ2, a fifteenth T gate T15 configured to perform π/4 phase transformation on the control qubit CQ3*a* sixteenth T gate T16 configured to perform π/4 phase transformation on the control qubit CQ4, a fourteenth inverse T gate IT14 configured to perform −π/4 phase transformation on the auxiliary qubit AQ3, and a fifteenth inverse T gate IT15 configured to perform −π/4 phase transformation on the auxiliary qubit AQ4;

corresponding to a layer 33 (L33), a 51st CNOT gate CNOT51 configured to rotate the auxiliary qubit AQ2 by π about the X axis based on the control qubit CQ2, and a 52nd CNOT gate CNOT52 configured to rotate the auxiliary qubit AQ4 by π about the X axis based on the control qubit CQ4;

corresponding to a layer 34 (L34), a 53rd CNOT gate CNOT53 configured to rotate the control qubit CQ1 by π about the X axis based on the auxiliary qubit AQ1, and a 54th CNOT gate CNOT54 configured to rotate the control qubit CQ3 by π about the X axis based on the auxiliary qubit AQ3;

corresponding to a layer 35 (L35), a 55th CNOT gate CNOT55 configured to rotate the auxiliary qubit AQ2 by π about the X axis based on the control qubit CQ1, and a 56th CNOT gate CNOT56 configured to rotate the auxiliary qubit AQ4 by π about the X axis based on the control qubit CQ3;

corresponding to a layer 36 (L36), a 57th CNOT gate CNOT57 configured to rotate the control qubit CQ2 by π about the X axis based on the auxiliary qubit AQ1, and a 58th CNOT gate CNOT58 configured to rotate the control qubit CQ4 by π about the X axis based on the auxiliary-qubit AQ3;

corresponding to the layer 37 (L37), a thirteenth H gate H13 configured to perform Hadamard transformation on the auxiliary qubit AQ1 and a fourteenth H gate H14 configured to perform Hadamard transformation on an auxiliary qubit AQ3.

The second auxiliary circuit AC2 may include: corresponding to the layer 29 (L29), an eighth CNOT gate CNOT8 configured to rotate the control qubit CQ5 by π about the X axis based on the auxiliary qubit AQ6; corresponding to the layer 30 (L30), a ninth CNOT gate CNOT9 configured to rotate the target qubit TQ by π about the X axis based on an auxiliary qubit AQ6; corresponding to the layer 31 (L31), a tenth CNOT gate CNOT10 configured to rotate the auxiliary qubit AQ5 by π about the X axis based on the control qubit CQ5; corresponding to the layer 32 (L32), a third inverse T gate IT3 configured to perform −π/4 phase transformation on the auxiliary qubit AQ5, a fourth inverse T gate T4 configured to perform −π/4 phase transformation on the auxiliary qubit AQ6, a third T gate T3 configured to perform π/4 phase transformation on the control qubit CQ5, and a fourth T gate T4 configured to perform π/4 phase transformation on the target qubit TQ; corresponding to the layer 33 (L33), an eleventh CNOT gate CNOT11 configured to rotate the auxiliary qubit AQ5 by π about the X axis based on the control qubit CQ5; corresponding to the layer 34 (L34), a twelfth CNOT gate CNOT12 configured to rotate the target qubit TQ by π about the X axis based on the auxiliary qubit AQ6; corresponding the layer 35 (L35), a thirteenth CNOT gate CNOT13 configured to rotate the auxiliary qubit AQ5 by π about the X axis based on the target qubit TQ; corresponding to the layer 36 (L36), fourteenth CNOT gate CNOT14 configured to rotate the control qubit CQ5 by π about the X axis based on the auxiliary qubit AQ6; and, corresponding to the layer 37 (L37), a third H gate H3 configured to perform Hadamard transformation on an auxiliary qubit AQ6, and a fourth H gate H4 configured to perform Hadamard transformation on the target qubit TQ.

The layer 2 (L2) and the layer 3 (L3) may correspond to the same circuit depth. The layer 4 (L4) and the layer 5 (L5) may correspond to the same circuit depth. The layer 7 (L7) and the layer 8 (L8) may correspond to the same circuit depth. The layer 11 (L11) and the layer 12 (L12) may correspond to the same circuit depth. The layer 13 (L13), the layer 14 (L14), and the layer 15 (L15) may correspond to the same circuit depth. The layer 16 (L16), the layer 17 (L17), and the layer 18 (L18) may correspond to the same circuit depth. The layer 20 (L20), the layer 21 (L21), and the layer 22 (L22) may correspond to the same circuit depth. The layer 23 (L23), the layer 24 (L24), and the layer 25 (L25) may correspond to the same circuit depth. The layer 26 (L26) and the layer 27 (L27) may correspond to the same circuit depth. The layer 30 (L30) and the layer 33 (L31) may correspond to the same circuit depth. The layer 33 (L33) and the layer 34 (L34) may correspond to the same circuit depth. The layer 35 (L35) and the layer 36 (L36) may correspond to the same circuit depth. Layers corresponding to the same circuit depth may be performed in parallel with each other.

In the quantum circuit 1100, the layer 6 (L6), the layer 19 (L19), and the layer 32 (L32) are layers corresponding to T gates or inverse T gates. The quantum circuit 1100 may have 10 auxiliary qubits AQ1-AQ10 and have a T-circuit depth of 3 while implementing a multi-controlled NOT gate with 5 control qubits.

Figure 12:
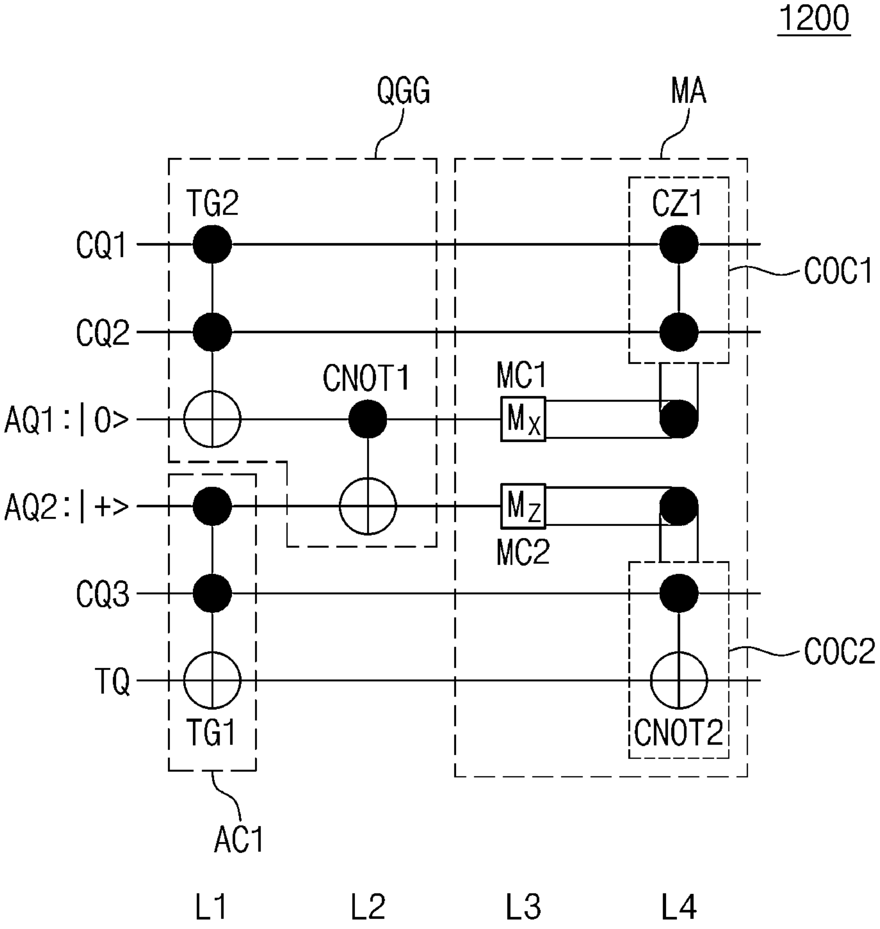
FIG. 12 is a circuit diagram illustrating an example of a quantum circuit for implementing a multi-controlled NOT gate with 3 control qubits according to an embodiment of the present disclosure.

FIG. 12 is a circuit diagram illustrating an example of a quantum circuit for implementing a multi-controlled NOT gate with 3 control qubits according to an embodiment of the present disclosure.

Referring to FIG. 12, the quantum circuit 1200 may include a first auxiliary circuit AC1, a quantum gate group QGG, and a measurement area MA.

In implementing the multi-controlled NOT gate with N control qubits, the first auxiliary circuit AC1 may correspond to one or more initial layers of the plurality of layers and may perform controlled NOT operation on the target qubit based on an Nth control qubit from among the N control qubits and a first auxiliary qubit initialized to a |+> state from among the plurality of auxiliary qubits.

The quantum gate group QGG may correspond to the plurality of layers and may perform controlled NOT operation on the first auxiliary qubit based on the first to (N−1)th control qubits.

The measurement area MA may correspond to the last one or more layers of the plurality of layers and may include one or more measurement circuits that measure the state of one or more auxiliary qubits, and one or more conditional operation circuits that perform a conditional operation based on a measurement result of the one or more measurement circuits.

Hereinafter, in FIGS. 12 to 15, the first auxiliary circuit AC1 may include a first Toffoli gate TG1.

The first Toffoli gate TG1 corresponds to the layer 1 (L1), and may rotate the target qubit TQ by π about the X axis based on the auxiliary qubit AQ2 initialized to the |+> state and the control qubit CQ3.

The quantum gate group QGG may include: corresponding to the first layer 1 (L1), a second Toffoli gate TG2 configured to rotate a auxiliary qubit AQ1 initialized to the |0> state by π about the X axis based on a control qubit CQ1 and a control qubit CQ2 corresponding to the layer 1 (L1); and, and, corresponding to a layer 2 (L2), a first CNOT gate CNOT1 configured to rotate the auxiliary qubit AQ2 by π about the X axis based on the auxiliary qubit AQ1.

The measurement area MA may include a first measurement circuit MC1 that measures the auxiliary qubit AQ1 on the X basis and a second measurement circuit MC2 that measures the auxiliary qubit AQ2 on the Z basis corresponding to the layer 3 (L3).

The measurement area MA may include a first conditional operation circuit COC1 that performs an operation based on a measurement result of the first measurement circuit MC1 and a second conditional operation circuit COC2 that performs an operation based on a measurement result of the second measurement circuit MC2 corresponding to the layer 4 (L4).

The first conditional operation circuit COC1 may include a first CZ gate CZ1 configured to rotate the control qubit CQ2 by π about the Z axis based on the control qubit CQ1. When the measurement result of the first measurement circuit MC1 is 0, the first conditional operation circuit COC1 does not perform a predetermined operation. When the measurement result of the first measurement circuit MC1 is 1, the first conditional operation circuit COC1 performs the predetermined operation. In this case, the operation of the first CZ gate CZ1 may be performed.

The second conditional operation circuit COC2 may include a second CNOT gate CNOT2 configured to rotate the target qubit TQ by π about to the X axis based on the control qubit CQ3. When the measurement result of the second measurement circuit MC2 is 0, the second conditional operation circuit COC2 does not perform a predetermined operation. When the measurement result of the second measurement circuit MC2 is 1, the second conditional operation circuit COC2 performs the predetermined operation. In this case, the operation of the second CNOT gate CNOT2 may be performed.

When compared with the quantum circuit 200 of FIG. 2, the quantum circuit 1200 may include the measurement area MA to reduce the circuit depth of the Toffoli gate from 3 to 1. At this time, the circuit depth of the measurement circuit is additionally required to be 1. The number of auxiliary qubits required in the quantum circuit 1200 is 2.

Figure 13:
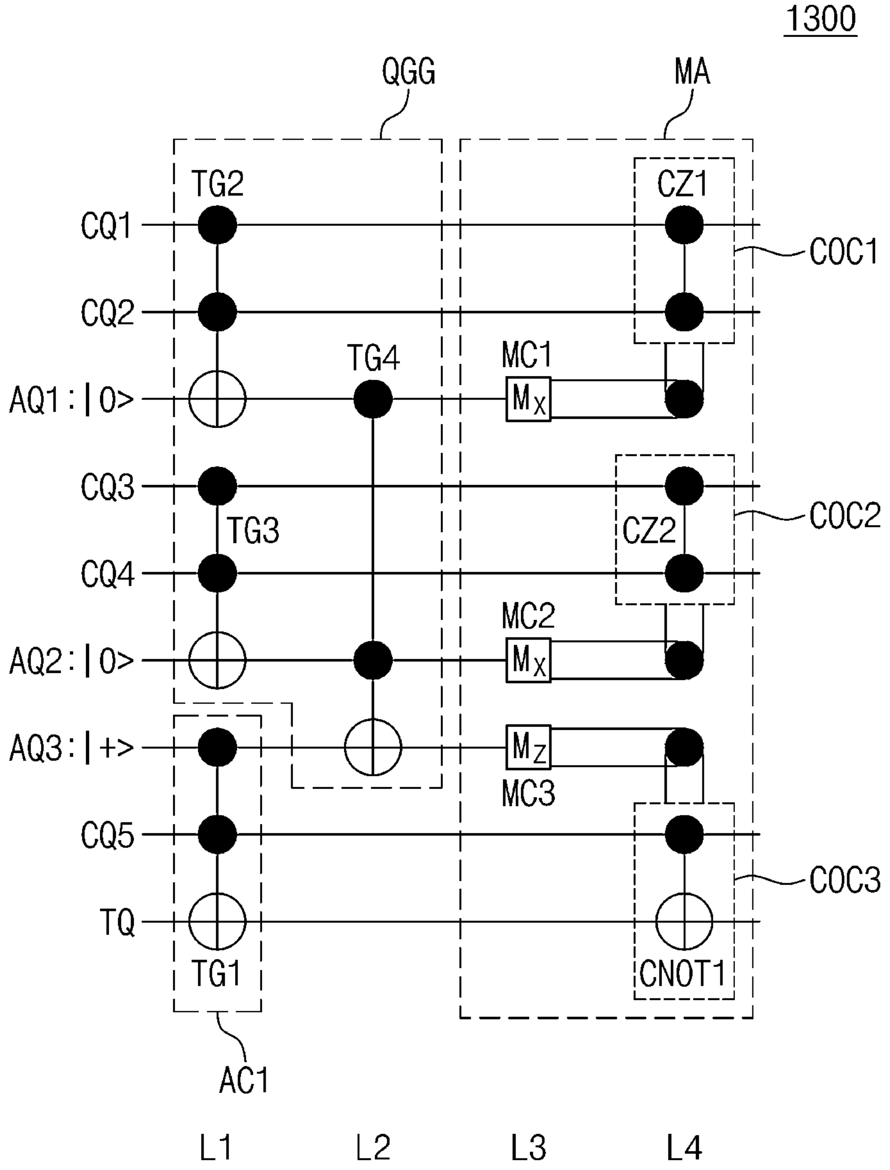
FIG. 13 is a circuit diagram illustrating an example of a quantum circuit for implementing a multi-controlled NOT gate with 5 control qubits according to an embodiment of the present disclosure.

FIG. 13 is a circuit diagram illustrating an example of a quantum circuit for implementing a multi-controlled NOT gate with 5 control qubits according to an embodiment of the present disclosure.

Referring to FIG. 13, the quantum circuit 1300 may include a first Toffoli gate TG1, a quantum gate group QGG, and a measurement region MA.

The first Toffoli gate TG1 corresponds to the layer 1 (L1), and may rotate the target qubit TQ by π about the X axis based on the auxiliary qubit AQ3 initialized to the |+> state and the control qubit CQ5.

The quantum gate group QGG may include, corresponding to the layer 1 (L1), a second Toffoli gate TG2 configured to rotate the auxiliary qubit AQ1 initialized to the |0> state by π about the X axis based on a control qubit CQ1 and a control qubit CQ2, and a third Toffoli gates TG3 configured to rotate the auxiliary qubit AQ2 by π about the X axis based on control qubits CQ3 and CQ4. The quantum gate group QGG may include, corresponding to a layer 2 (L2), a fourth Toffoli gate TG4 configured to rotate the auxiliary qubit AQ1 by π about the X axis based on the auxiliary qubit AQ1 and the auxiliary qubit AQ3.

The measurement area MA may include a first measurement circuit MC1 that measures the auxiliary qubit AQ1 on the X basis, a second measurement circuit MC2 that measures the auxiliary qubit AQ2 on the X basis, and a third measurement circuit MC3 that measures the auxiliary qubit AQ3 on the Z basis, corresponding to a layer 3 (L3).

The measurement area MA may include a first conditional operation circuit COC1 that performs an operation based on a measurement result of the first measurement circuit MC1, a second conditional operation circuit COC2 that performs an operation based on a measurement result of a second measurement circuit MC2, and a third conditional operation circuit COC3 that performs an operation based on the measurement result of the third measurement circuit MC3, corresponding to a layer 4 (L4).

The first conditional operation circuit COC1 may include a first CZ gate CZ1 configured to rotate the control qubit CQ2 by π about the Z axis based on the control qubit CQ1. When the measurement result of the first measurement circuit MC1 is 0, the first conditional operation circuit COC1 does not perform a predetermined operation. When the measurement result of the first measurement circuit MC1 is 1, the first conditional arithmetic circuit COC1 performs the predetermined operation. In this case, the operation of the first CZ gate CZ1 may be performed.

The second conditional arithmetic circuit COC2 may include a second CZ gate CZ2 configured to rotate the control qubit CQ4 by π about the Z axis based on the control qubit CQ3. When the measurement result of the second measurement circuit MC2 is 0, the second conditional operation circuit COC2 does not perform a predetermined operation. When the measurement result of the second measurement circuit MC2 is 1, the second conditional operation circuit COC2 performs the predetermined operation. In this case, the operation of the second CZ gate CZ2 may be performed.

The third conditional operation circuit COC3 may include a first CNOT gate CNOT1 configured to rotate the target qubit TQ by π about the X axis based on the control qubit CQ5. When the measurement result of the third measurement circuit MC3 is 0, the third conditional operation circuit COC3 does not perform a predetermined operation. When the measurement result of the third measurement circuit MC3 is 1, the third conditional operation circuit COC3 performs the predetermined operation. In this case, the operation of the first CNOT gate CNOT1 may be performed.

When compared with the quantum circuit 200 of FIG. 2, the quantum circuit 1200 may include the measurement area MA to reduce the circuit depth of the Toffoli gate from 3 to 1. At this time, the circuit depth of the measurement circuit is additionally required to be 1. The number of auxiliary qubits required in the quantum circuit 1200 is 2.

When compared with the quantum circuit 300 of FIG. 3, the quantum circuit 1300 may include the measurement area MA to reduce the circuit depth of the Toffoli gate from 3 to 2. At this time, the circuit depth of the measurement circuit is additionally required to be 1. The number of auxiliary qubits required in the quantum circuit 1200 is 3.

Figure 14:
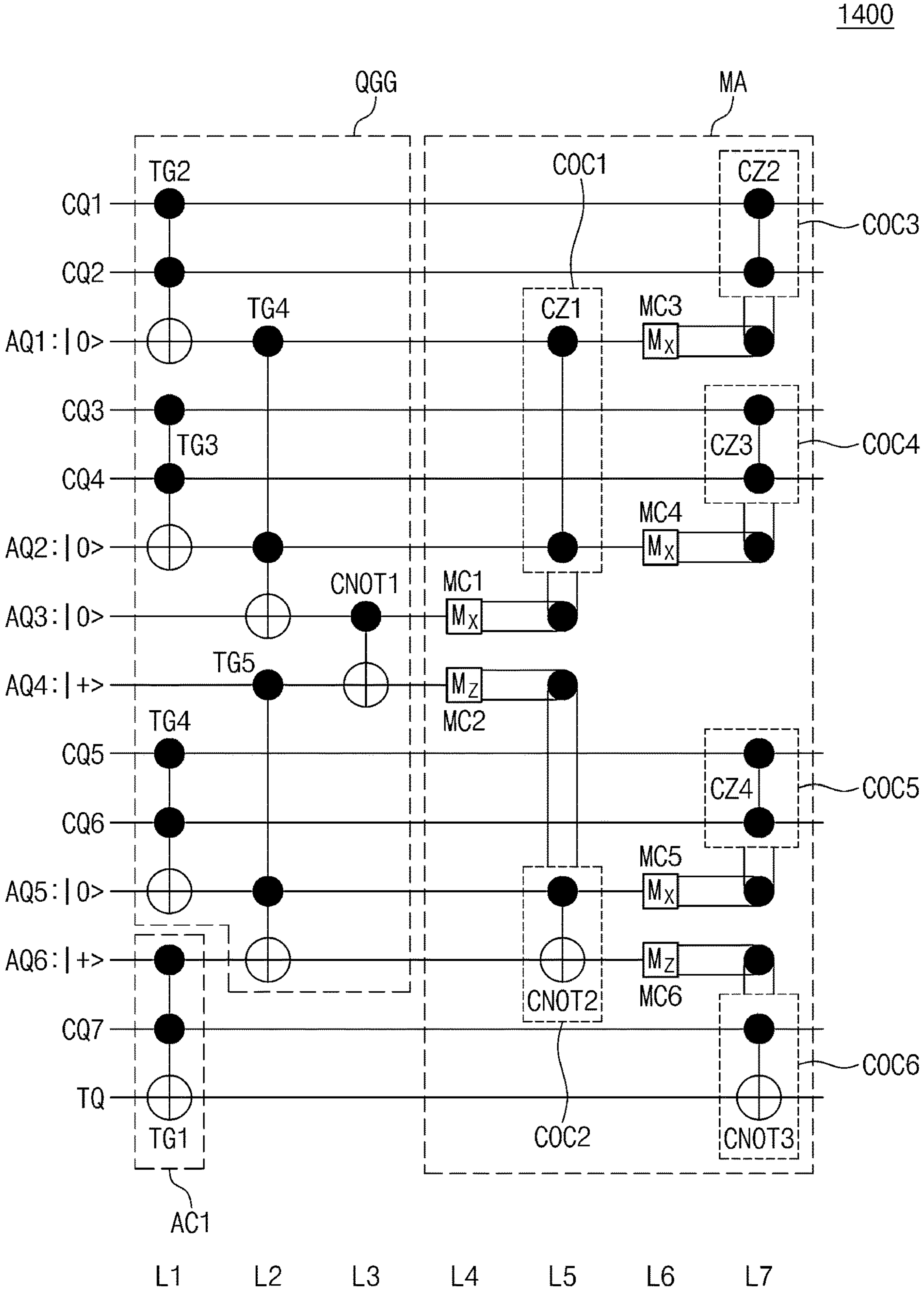
FIG. 14 is a circuit diagram illustrating an example of a quantum circuit for implementing a multi-controlled NOT gate with 7 control qubits according to an embodiment of the present disclosure.

FIG. 14 is a circuit diagram illustrating an example of a quantum circuit for implementing a multi-controlled NOT gate with 7 control qubits according to an embodiment of the present disclosure.

Referring to FIG. 14, the quantum circuit 1400 may include a first Toffoli gate TG1, a quantum gate group QGG, and a measurement area MA.

The first Toffoli gate TG1 corresponds to a layer 1 (L1), and may rotate the target qubit TQ by π about the X axis based on an auxiliary qubit AQ6 initialized to the |+> state and a control qubit CQ7.

The quantum gate group QGG may include, corresponding to the layer a (L1), a second Toffoli gate TG2 configured to rotate the auxiliary qubit AQ1 initialized to the |0> state by π about the X axis based on a control qubit CQ1 and a control qubit CQ2, a third Toffoli gate TG3 configured to rotate the auxiliary qubit AQ2 initialized to the 0> state by π about the Z axis based on a control qubit CQ3 and a control qubit CQ4, and a fourth Toffoli gate TG4 configured to rotate the auxiliary qubit A Q5 initialized to the O> state by π about the X axis based on a control qubit CQ5 and a controlling qubit CQ6.

The quantum gate group QGG may include corresponding to a layer 2 (L2), a fourth Toffoli gate TG4 configured to rotate an auxiliary qubit AQ3 initialized to a |0> state by π about the X axis based on the auxiliary qubits AQ1 and AQ2 and a fifth Toffoli gates TG5 configured to rotate the auxiliary qubits AQ6 initialized to |+> states by π about to the X axis based on the auxiliary qubit AQ4 and the auxiliary qubit AQ5.

The quantum gate group QGG may include a first CNOT gate CNOT1 configured to rotate the auxiliary qubit AQ4 by π about the X axis based on the auxiliary qubit AQ3 corresponding to a layer 3 (L3).

The measurement area MA may include a first measurement circuit MC1 that measures the auxiliary qubit AQ3 on the X basis and a second measurement circuit MC2 that measures the auxiliary qubit AQ4 on the Z basis corresponding to the layer 4 (L4).

The measurement area MA may include a first conditional operation circuit COC1 that performs an operation based on a measurement result of the first measurement circuit MC1 and a second conditional operation circuit COC2 that performs an operation on the based on a measurement result of a second measurement circuit MC2 corresponding to the layer 5 (L5).

The first conditional operation circuit COC1 may include a first CZ gate CZ1 that rotates the auxiliary qubit AQ2 by π about the Z axis based on the auxiliary qubit AQ1. When the measurement result of the first measurement circuit MC1 is 0, the first conditional operation circuit COC1 does not perform a predetermined operation. When the measurement result of the first measurement circuit MC1 is 1, the first conditional operation circuit COC1 performs a predetermined operation. In this case, the operation of the first CZ gate CZ1 may be performed.

The second conditional operation circuit COC2 may include a second CNOT gate CNOT2 configured to rotate the auxiliary qubit AQ6 by π about the X axis based on the auxiliary qubit AQ5. When the measurement result of the second measurement circuit MC2 is 0, the second conditional operation circuit COC2 does not perform a predetermined operation. When the measurement result of the second measurement circuit MC2 is 1, the second conditional operation circuit COC2 performs the predetermined operation. In this case, the operation of the second CNOT gate CNOT2 may be performed.

The measurement area MA may include, corresponding to a layer 6 (L6), a third measurement circuit MC3 that measures the auxiliary qubit AQ1 on the X basis, a fourth measurement circuit MC4 that measures the auxiliary qubit AQ2 on the X basis, a fifth measurement circuit MC5 that measures the auxiliary qubit AQ5 on the X basis, and a sixth measurement circuit MC6 that measures the auxiliary qubit AQ6 on the Z basis.

The measurement area MA may include a third conditional operation circuit COC3 that performs an operation based on a measurement result of the third measurement circuit MC3, a fourth conditional operation circuit COC4 that performs an operation according to a measurement result of a fourth measurement circuit MC4, a fifth conditional operation circuit CoC5 that performs an operation based on the measurement result of the fifth measurement circuit MC5, and a sixth conditional operation circuit coC6 that performs an operation of the sixth measurement circuit MC6 corresponding to a layer 7 (L7).

The third conditional operation circuit COC3 may include a second CZ gate CZ2 configured to rotate the control qubit CQ2 by π about the Z axis based on the control qubit CQ1. When the measurement result of the third measurement circuit MC3 is 0, the third conditional operation circuit COC3 does not perform a predetermined operation. When the measurement result of the third measurement circuit MC3 is 1, the third conditional operation circuit COC3 performs the predetermined operation. In this case, the operation of the second CZ gate CZ2 may be performed.

The fourth conditional arithmetic circuit COC4 may include a third CZ gate CZ3 configured to rotate the control qubit CQ4 by π about the Z axis based on the control qubit CQ3. When the measurement result of the fourth measurement circuit MC4 is 0, the fourth conditional operation circuit COC4 does not perform a predetermined operation. When the measurement result of the fourth measurement circuit MC4 is 1, the fourth conditional operation circuit COC4 performs the predetermined operation. In this case, the operation of the third CZ gate CZ3 may be performed.

The fifth conditional computation circuit COC5 may include a fourth CZ gate CZ4 configured to rotate the control qubit CQ6 by π about the Z axis based on the control qubit CQ5. When the measurement result of the fifth measurement circuit MC5 is 0, the fifth conditional operation circuit COC5 does not perform a predetermined operation. When the measurement result of the fifth measurement circuit MC5 is 1, the fifth conditional operation circuit COC5 performs predetermined operation. In this case, the operation of the fourth CZ gate CZ4 may be performed.

The sixth conditional arithmetic circuit COC6 may include a third CNOT gate CNOT3 configured to rotate the target qubit TQ by π about the X axis based on the control qubit CQ7. When the measurement result of the sixth measurement circuit MC6 is 0, the sixth conditional operation circuit COC6 does not perform a predetermined operation. When the measurement result of the sixth measurement circuit MC6 is 1, the sixth conditional operation circuit COC6 performs the predetermined operation. In this case, the operation of the third CNOT gate CNOT3 may be performed.

The quantum circuit 1400 may include the measurement area MA to reduce the circuit depth of the Toffoli gate from 5 to 2. At this time, the circuit depth of the measurement circuit is 2. The quantum circuit 1400 requires six auxiliary qubits.

Figure 15:
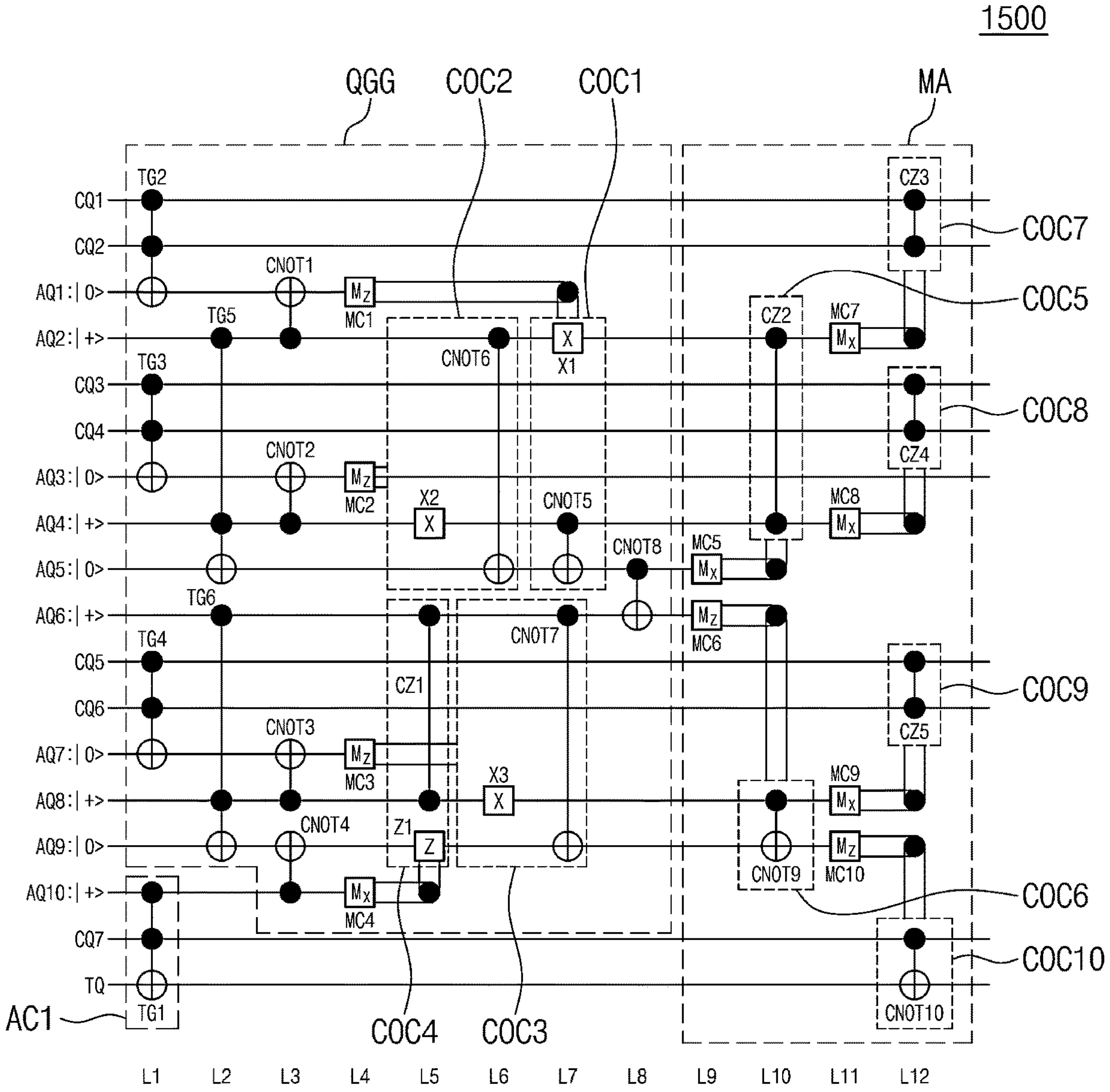
FIG. 15 is a circuit diagram illustrating an example of a quantum circuit for implementing a multi-controlled NOT gate with 7 control qubits according to an embodiment of the present disclosure.

FIG. 15 is a circuit diagram illustrating an example of a quantum circuit for implementing a multi-controlled NOT gate with 7 control qubits according to an embodiment of the present disclosure.

Referring to FIG. 15, the quantum circuit 1500 may include a first Toffoli gate TG1, a quantum gate group QGG, and a measurement area MA.

The first Toffoli gate TG1 corresponds to the layer 1 (L1), and may rotate the target qubit TQ by π about the X axis based on an auxiliary qubit AQ6 initialized to the |+> state and a control qubit CQ7.

The quantum gate group QGG may include, corresponding to a layer 1 (L1), a second Toffoli gate TG2 configured to rotate the auxiliary qubit AQ1 initialized to the |0> state by π about the X axis based on the control qubit CQ1 and the control qubit CQ2, a third Toffoli gate TG3 configured to rotate a auxiliary qubit AQ3 initialized to the 0> state by π about the X axis based on a control qubit CQ3 and a control qubit CQ4, and a fourth Toffoli gate TG4 configured to rotate an auxiliary qubit AQ7 initialized to the O> state by π about the X axis based on a control qubit CQ5 and a control qubit CQ6.

The quantum gate group QGG may further include, corresponding to a layer 2 (L2), a fifth Toffoli gate TG5 configured to rotate an auxiliary qubit AQ5 initialized to the |0> state by π about the X axis based on an auxiliary qubits AQ2 initialized to |+> states and an auxiliary qubit AQ4 initialized to |+> states, and a sixth Toffoli gates TG6 configured to rotate an auxiliary qubits AQ9 initialized to the 0> by a π about the X axis w based on an auxiliary qubit AQ6 initialized to the +> state and an auxiliary qubit AQ8 initialized to the +> state.

The quantum gate group QGG may further include, corresponding to a layer 3 (L3), a first CNOT gate CNOT1 configured to rotate the auxiliary qubit AQ1 by π about the X axis based on the auxiliary qubit AQ2, a second CNOT gate CNOT2 configured to rotate the auxiliary qubit AQ3 by π about the X axis based on the auxiliary qubit AQ4, a third CNOT gate CNOT3 configured to rotate the auxiliary qubit AQ7 by π about the X axis based on the auxiliary qubit AQ8, and a fourth CNOT gates CNOT4 configured to rotate the auxiliary qubits AQ9 by π about the X axis based on the auxiliary qubits AQ10.

The quantum gate group QGG may further include, corresponding to a layer 4 (L4), a first measurement circuit MC1 that measures an auxiliary qubit AQ1 on the Z basis, a second measurement circuit MC2 that measures an auxiliary qubit AQ3 on the Z basis, a third measurement circuit MC3 that measures an auxiliary qubit AQ7 on the Z basis, and a fourth measurement circuit MC4 that measures an auxiliary qubit AQ10 on the X basis.

The quantum gate group QGG may further include, corresponding to a layer 5 (L5), a layer 6 (L6), and a layer 7 (L7), a first conditional operation circuit COC1 that performs an operation based on a measurement result of the first measurement circuit MC1, a second conditional operation circuit COC2 that performs an operation based on a measurement result of a second measurement circuit MC2, a third conditional operation circuit COC3 that performs an operation based on a measurement result of the third measurement circuit MC3, and a fourth conditional operation circuit COC4 that performs an operation based on a measurement result of the fourth measurement circuit MC4.

The first conditional operation circuit COC1 may include, corresponding to the layer 7 (L7), a first X gate X1 configured to rotate the auxiliary qubit AQ2 by π about the X axis and a fifth CNOT gate CNOT5 configured to rotate the auxiliary qubit AQ5 by π about the X axis based on the auxiliary qubit AQ4. When the measurement result of the first measurement circuit MC1 is 0, the first conditional operation circuit COC1 does not perform a predetermined operation. When the measurement result of the first measurement circuit MC1 is 1, the first conditional operation circuit COC1 performs the predetermined operation.

The second conditional operation circuit COC2 may include a second X gate X2 configured to rotate the auxiliary qubit AQ4 by π about the X axis corresponding to the layer 5 (L5) and a sixth CNOT gate CNOT6 configured to rotate the auxiliary qubit AQ5 by π about the X axis based on the auxiliary qubit AQ2 corresponding to the layer 6 (L6). When the measurement result of the second measurement circuit MC2 is 0, the second conditional operation circuit COC2 does not perform a predetermined operation. When the measurement result of the second measurement circuit MC2 is 1, the second conditional operation circuit COC2 performs the predetermined operation.

The third conditional operation circuit COC3 may include a third X gate X3 configured to rotate the auxiliary qubit AQ8 by π about the X axis corresponding to the layer 6 (L6) and a seventh CNOT gate CNOT7 configured to rotate the auxiliary qubit AQ9 by π about the X axis based on the auxiliary qubit AQ6 corresponding to the layer 7 (L7). When the measurement result of the third measurement circuit MC3 is 0, the third conditional operation circuit COC3 does not perform a predetermined operation. When the measurement result of the third measurement circuit MC3 is 1, the third conditional operation circuit COC3 performs the predetermined operation.

The fourth conditional operation circuit COC4 may include a first CZ gate CZ1 configured to rotate the auxiliary qubit AQ8 by π about the Z axis based on the auxiliary qubit AQ6 corresponding to the layer 5 (L5) and a first Z gate XZ configured to rotate the auxiliary qubit AQ9 by π about the Z axis. When the measurement result of the fourth measurement circuit MC4 is 0, the fourth conditional operation circuit COC4 does not perform a predetermined operation. When the measurement result of the fourth measurement circuit MC4 is 1, the fourth conditional operation circuit COC4 performs the predetermined operation.

The quantum gate group QGG may further include an eighth CNOT gate CNOT8 configured to rotate the auxiliary qubit AQ6 by π about the X axis based on the auxiliary qubit AQ5 corresponding to the layer 8 (L8).

The measurement area MA may include, corresponding to a layer 9 (L9), a fifth measurement circuit MC5 that measures the auxiliary qubit AQ5 on the X basis and a sixth measurement circuit MC6 that measures the auxiliary qubit AQ6 on the Z basis.

The measurement area MA may include, corresponding to a layer 10 (L10), a fifth conditional operation circuit COC5 that performs an operation based on a measurement result of the fifth measurement circuit MC5 and a sixth conditional operation circuit COC6 that performs an operation based on a measurement result of a sixth measurement circuit MC6.

The fifth conditional operation circuit COC5 may include a second CZ gate CZ2 configured to rotate the auxiliary qubit AQ4 by π about the Z axis based on the auxiliary qubit AQ2. When the measurement result of the fifth measurement circuit MC5 is 0, the fifth conditional circuit COC5 does not perform a predetermined operation. When the measurement result of the fifth measurement circuit MC5 is 1, the fifth conditional operation circuit COC5 performs the predetermined operation. In this case, the operation of the second CZ gate CZ2 may be performed.

The sixth conditional computation circuit COC6 may include a ninth CNOT gate CNOT9 configured to rotate the auxiliary qubit AQ9 by π about the X axis based on the auxiliary qubit AQ8. When the measurement result of the sixth measurement circuit MC6 is 0, the sixth conditional operation circuit COC6 does not perform a predetermined operation. When the measurement result of the sixth measurement circuit MC6 is 1, the sixth conditional operation circuit COC6 performs the predetermined operation. In this case, the operation of the ninth CNOT gate CNOT9 may be performed.

The measurement area MA may include, corresponding to a layer 11 (L11) a seventh measurement circuit MC7 that measures the auxiliary qubit AQ2 on the X basis, an eighth measurement circuit MC8 that measures the auxiliary qubit AQ4 on the X basis, a ninth measurement circuit MC9 that measures the auxiliary qubit AQ8 on the X basis, and a tenth measurement circuit MC10 that measures the auxiliary qubit AQ9 on the Z basis.

The measurement area MA may include, corresponding to a layer 12 (L12), a seventh conditional operation circuit COC7 that performs an operation based on a measurement result of the seventh measurement circuit MC7, an eighth conditional operation circuit COC8 that performs an operation based on a measurement result of an eighth measurement circuit MC8, a fifth conditional operation circuit COC9 that performs an operation based on a measurement result of a ninth measurement circuit MC9, and a tenth conditional operation circuit COC10 that performs an operation based on a measurement result of the tenth measurement circuit MC10.

The seventh conditional arithmetic circuit COC7 may include a third CZ gate CZ3 configured to rotate the control qubit CQ2 by π about the Z axis based on the control qubit CQ1. When the measurement result of the seventh measurement circuit MC7 is 0, the seventh conditional operation circuit COC7 does not perform a predetermined operation. When the measurement result of the seventh measurement circuit MC7 is 1, the seventh operation arithmetic circuit COC7 performs the predetermined operation. In this case, the operation of the third CZ gate CZ3 may be performed.

The eighth conditional computation circuit COC8 may include a fourth CZ gate CZ4 configured to rotate the control qubit CQ4 by π about the Z axis based on the control qubit CQ3. When the measurement result of the eighth measurement circuit MC8 is 0, the eighth conditional operation circuit COC8 does not perform a predetermined operation. When the measurement result of the eighth measurement circuit MC8 is 1, the eighth conditional operation circuit COC8 performs the predetermined operation. In this case, the operation of the fourth CZ gate CZ4 may be performed.

The ninth conditional computation circuit COC9 may include a fifth CZ gate CZ5 configured to rotate the control qubit CQ6 by π about the Z axis based on the control qubit CQ5. When the measurement result of the ninth measurement circuit MC9 is 0, the ninth conditional operation circuit COC9 does not perform a predetermined operation. When the measurement result of the ninth measurement circuit MC9 is 1, the ninth conditional operation circuit COC9 performs the predetermined operation. In this case, the operation of the fifth CZ gate CZ5 may be performed.

The tenth conditional operation circuit COC10 may include a tenth CNOT gate CNOT10 configured to rotate the target qubit TQ by π about the X axis based on the control qubit CQ7. When the measurement result of the tenth measurement circuit MC10 is 0, the tenth conditional operation circuit COC10 does not perform a predetermined operation. When the measurement result of the tenth measurement circuit MC10 is 1, the tenth conditional operation circuit COC10 performs the predetermined operation. In this case, the operation of the tenth CNOT gate CNOT10 may be performed.

The layer 1 (L1) and the layer 2 (L2) may correspond to the same circuit depth. The quantum circuit 1500 may reduce a circuit depth of a Toffoli gate to 1 by using gate teleportation. At this time, the measurement circuit depth is 3, and 10 auxiliary qubits are required.

Extending the quantum circuit 1500 may implement a multi-controlled NOT gate with N control qubits where the circuit depth of the Toffoli gate is 1. At this time, 2(N−2) or smaller auxiliary qubits are required. The measurement circuit depth R can be represented by Equation 6.

$$R = 2(\lceil \log_2(N+1) \rceil - 3) \quad \text{[Equation 6]}$$

Figure 16:
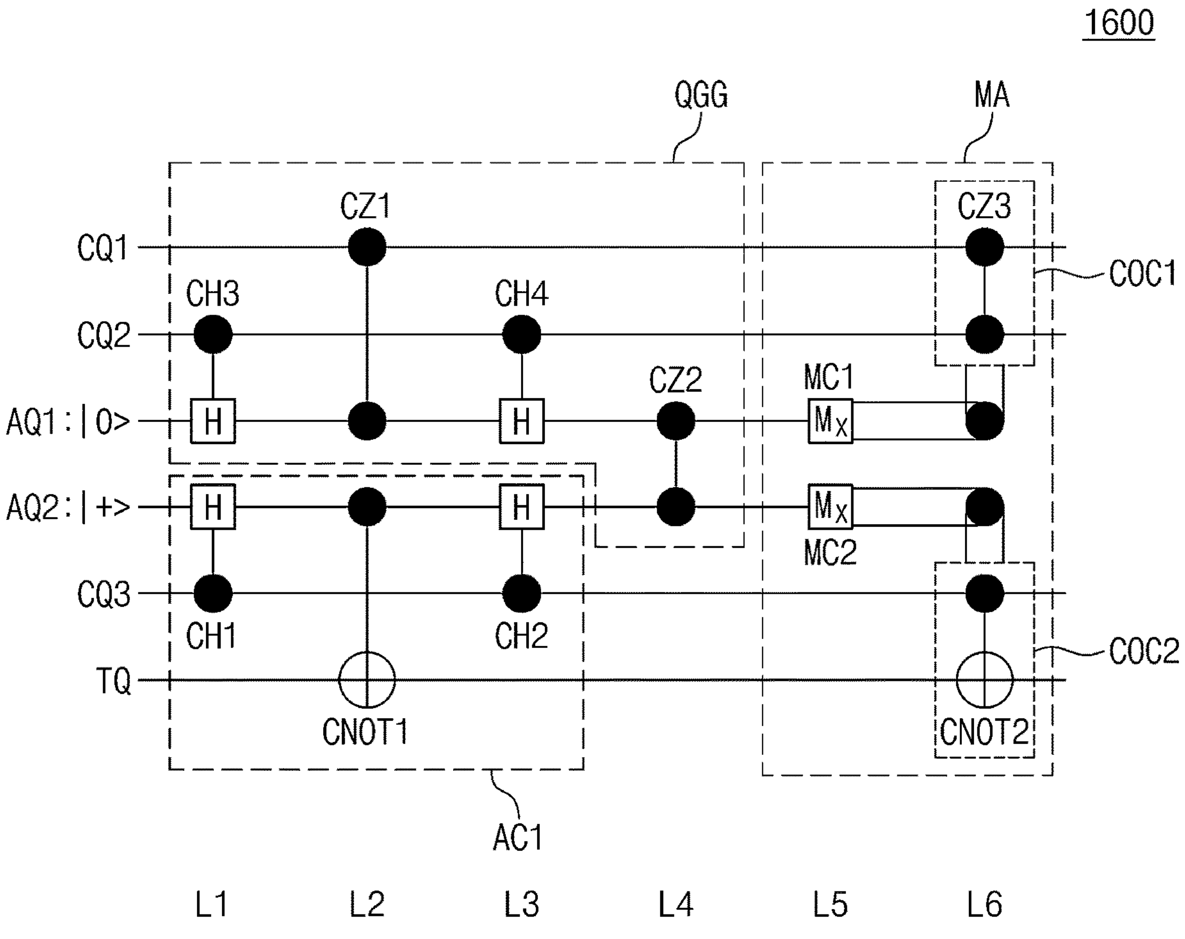
FIG. 16 is a circuit diagram illustrating an example of a quantum circuit for implementing a multi-controlled NOT gate with 3 control qubits according to an embodiment of the present disclosure.

FIG. 16 is a circuit diagram illustrating an example of a quantum circuit for implementing a multi-controlled NOT with 3 control qubits gate according to an embodiment of the present disclosure.

Referring to FIG. 16, the quantum circuit 1600 may include a first auxiliary circuit AC1, a quantum gate group QGG, and a measurement area MA.

The first auxiliary circuit AC1 may include: corresponding to a layer (L1), a first CH gate CH1 configured to perform controlled Hadamard transformation on a auxiliary qubit AQ2 initialized to the |+> state based on a control qubit CQ3; corresponding to a layer 2 (L2), a first CNOT gate CNOT1 configured to rotate a target qubit TQ by π about the X axis based on the auxiliary qubit AQ2; and, corresponding to a layer 3 (L3), a second CH gate CH2 configured to perform controlled Hadamard transformation on the auxiliary qubit AQ2 based on the control qubit CQ3.

The quantum gate set QGG may include: corresponding to the layer 1 (L1), a third CH gate CH3 configured to perform controlled Hadamard transformation on a auxiliary qubit AQ1 initialized to |0> based on a control qubit CQ2; corresponding to the layer 2 (L2), a first CZ gate CZ1 configured to rotate the auxiliary qubit AQ1 by π about the Z axis based on a control qubit CQ1; corresponding to a fourth CH gate CH4 configured to perform controlled Hadamard transformation on the auxiliary qubit AQ1 based on the control qubit CQ2; and, corresponding to a layer 4 (L4), a second CZ gate C Z2 configured to rotate the auxiliary qubit AQ2 by π about the Z axis based on the auxiliary qubit AQ1.

The measurement area MA may include a first measurement circuit MC1 that measures the auxiliary qubit AQ1 on the X basis and a second measurement circuit MC2 that measures the auxiliary qubit AQ2 on the Z basis corresponding to a layer 5 (L5).

The measurement area MA may include a first conditional operation circuit COC1 that performs an operation based on a measurement result of the first measurement circuit MC1 and a second conditional operation circuit COC2 that performs an operation based on a measurement result of a second measurement circuit MC2 corresponding to a layer 6 (L6).

The first conditional arithmetic circuit COC1 may include a third CZ gate CZ3 configured to rotate the control qubit CQ2 by π about the Z axis based on the control qubit CQ1. When the measurement result of the first measurement circuit MC1 is 0, the first conditional operation circuit COC1 does not perform a predetermined operation. When the measurement result of the first measurement circuit MC1 is 1, the first conditional operation circuit COC1 performs the predetermined operation. In this case, the operation of the third CZ gate CZ3 may be performed.

The second conditional operation circuit COC2 may include a second CNOT gate CNOT2 configured to rotate the target qubit TQ by π about the X axis based on the control qubit CQ3. When the measurement result of the second measurement circuit MC2 is 0, the second conditional operation circuit COC2 does not perform a predetermined operation. When the measurement result of the second measurement circuit MC2 is 1, the second conditional operation circuit COC2 performs the predetermined operation. In this case, the operation of the second CNOT gate CNOT2 may be performed.

Figure 17:
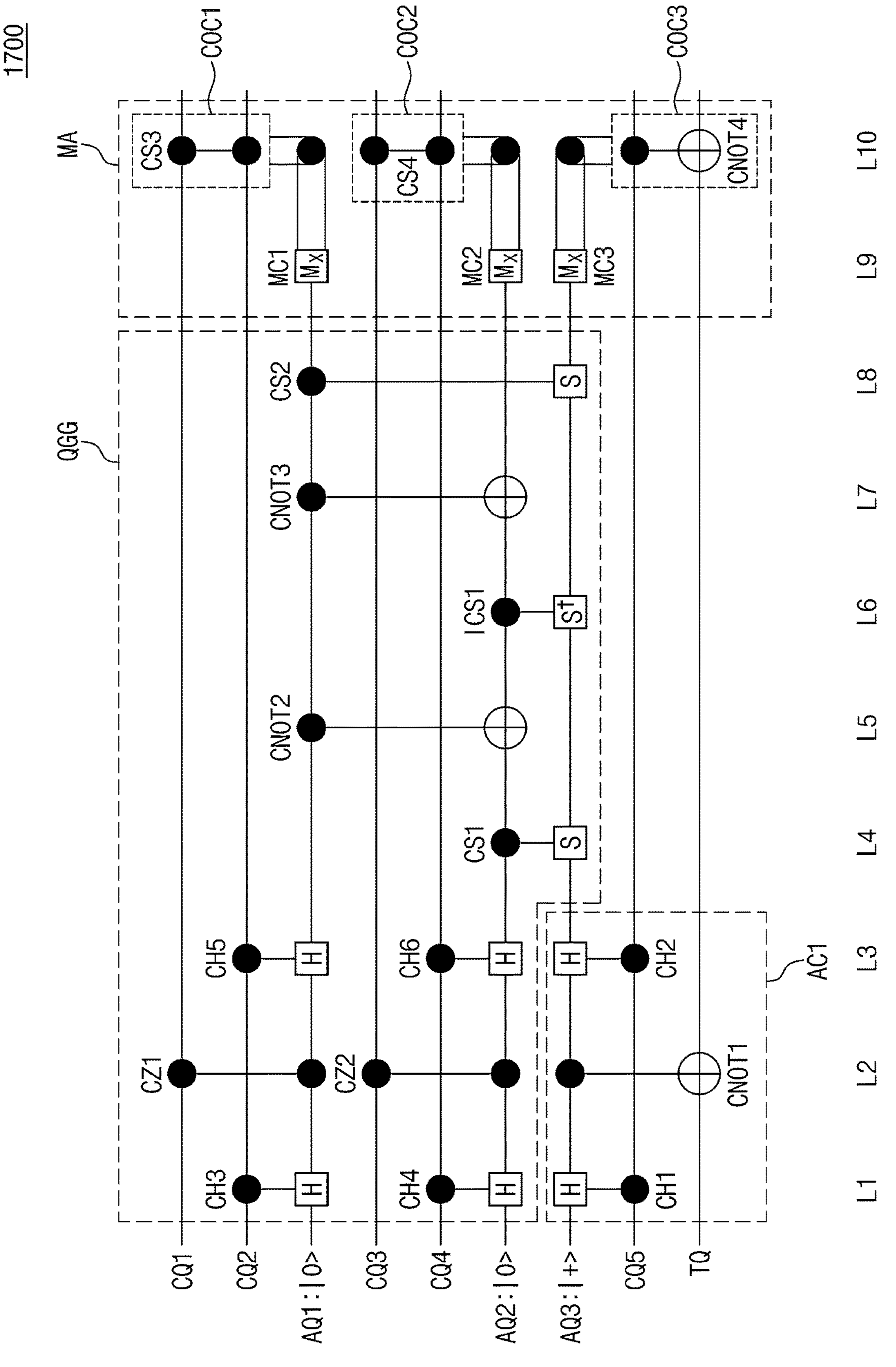
FIG. 17 is a circuit diagram illustrating an example of a quantum circuit for implementing a multi-controlled NOT gate with 5 control qubits according to an embodiment of the present disclosure.

FIG. 17 is a circuit diagram illustrating an example of a quantum circuit for implementing a multi-controlled NOT gate with 5 control qubits according to an embodiment of the present disclosure.

Referring to FIG. 17, the quantum circuit 1700 may include a first auxiliary circuit AC1, a quantum gate group QGG, and a measurement region MA.

The first auxiliary circuit AC1 may include: corresponding to a layer (L1), a first CH gate CH1 configured to perform controlled Hadamard transformation on a auxiliary qubit AQ3 initialized to the +> state based on a control qubit CQ5; corresponding to a layer 2 (L2), a first CNOT gate CNOT1 configured to rotate a target qubit TQ by π about the X axis based on the auxiliary qubit AQ3; and, corresponding to a layer 3 (L3), a second CH gate CH2 configured to perform controlled Hadamard transformation on the auxiliary qubit AQ3 based on the control qubit CQ5.

The quantum gate group QGG may include: corresponding to the layer 1 (L1), a third CH gate CH3 configured to perform a controlled Hadamard transformation on a auxiliary qubit AQ1 initialized to the |0> state based on a control qubit CQ2, and a fourth CH gate CH4 configured to perform controlled Hadamard transformation on a auxiliary qubit AQ2 initialized to the state |0> based on a control qubit CQ4.

The quantum gate group QGG may further include, corresponding to the layer 2 (L2), a first CZ gate CZ1 configured to rotate the auxiliary qubit AQ1 by π about the Z axis based on a control qubit CQ1, and a second CZ gate CZ2 configured to rotate the auxiliary qubit AQ2 by π about the Z axis based on a control qubit CQ3.

The quantum gate group QGG may further include, corresponding to the layer 3 (L3), a fifth CH gate CH5 configured to perform controlled Hadamard transformation on the auxiliary qubit AQ1 based on the control qubit CQ2, and a sixth CH gate CH6 configured to perform controlled Hadamard transformation on the auxiliary qubit AQ2 based on the control qubit CQ4.

The quantum gate group QGG may further include, corresponding to a layer 4 (L4), a first CS gate CS1 configured to rotate the auxiliary qubit AQ3 by π/2 about the Z axis based on the auxiliary qubit AQ2.

The quantum gate group QGG may further include, corresponding to a layer 5 (L5), a second CNOT gate CNOT2 configured to rotate the auxiliary qubit AQ2 by π about the X axis based on the auxiliary qubit AQ1.

The quantum gate group QGG may further include, corresponding to a layer 6 (L6), a first inverse CS gate ICS1 configured to rotate the auxiliary qubit AQ3 by −π/2 about the Z axis based on the auxiliary qubit AQ2.

The quantum gate group QGG may further include, corresponding to a layer 7 (L7), a third CNOT gate CNOT3 configured to rotate the auxiliary qubit AQ2 by π about the X axis based on the auxiliary qubit AQ1.

The quantum gate group QGG may further include, corresponding to a layer 8 (L8), a second CS gate CS2 configured to rotate the auxiliary qubit AQ3 by −π/2 abut the Z axis based on the auxiliary qubit AQ1.

The measurement area MA may include, corresponding to a layer 9 (L9), a first measurement circuit MC1 that measures the auxiliary qubit AQ1 on the X basis, a second measurement circuit MC2 that measures the auxiliary qubit AQ2 on the X basis, and a third measurement circuit MC3 that measures the auxiliary qubit AQ3 on the Z basis.

The measurement area MA may include, corresponding to a layer 10 (L10), a first conditional operation circuit COC1 that performs an operation based on a measurement result of the first measurement circuit MC1, a second conditional operation circuit COC2 that performs an operation based on a measurement result of the second measurement circuit MC2, and a third conditional operation circuit COC3 that performs an operation based on a measurement result of the third measurement circuit MC3.

The first conditional arithmetic circuit COC1 may include a third CZ gate CZ3 configured to rotate the control qubit CQ2 by π about the Z axis based on the control qubit CQ1. When the measurement result of the first measurement circuit MC1 is 0, the first conditional operation circuit COC1 does not perform a predetermined operation. When the measurement result of the first measurement circuit MC1 is 1, the first conditional operation circuit COC1 performs the predetermined operation. In this case, the operation of the third CZ gate CZ3 may be performed.

The second conditional arithmetic circuit COC2 may include a fourth CZ gate CZ4 configured to rotate the control qubit CQ4 by π about the Z axis based on the control qubit CQ3. When the measurement result of the second measurement circuit MC2 is 0, the second conditional operation circuit COC2 does not perform a predetermined operation. When the measurement result of the second measurement circuit MC2 is 1, the second conditional operation circuit COC2 performs the predetermined operation. In this case, the operation of the fourth CZ gate CZ4 may be performed.

The third conditional operation circuit COC3 may include a first CNOT gate CNOT1 configured to rotate the target qubit TQ by π about the X axis based on the control qubit CQ5. When the measurement result of the third measurement circuit MC3 is 0, the third conditional operation circuit COC3 does not perform a predetermined operation. When the measurement result of the third measurement circuit MC3 is 1, the third conditional operation circuit COC3 performs the predetermined operation. In this case, the operation of the fourth CNOT gate CNOT4 may be performed.

Figure 18:
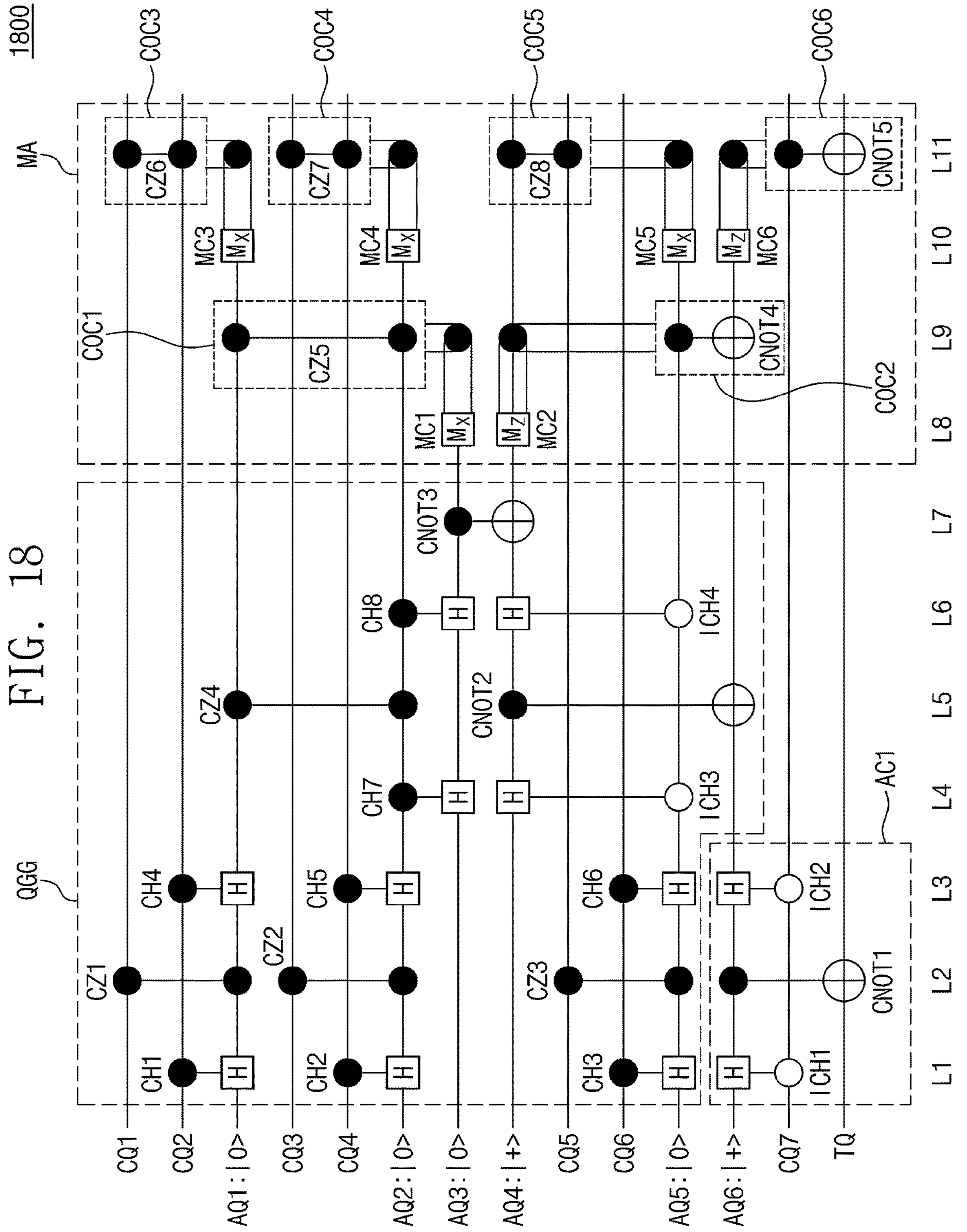
FIG. 18 is a circuit diagram illustrating an example of a quantum circuit for implementing a multi-controlled NOT gate with 7 control qubits according to an embodiment of the present disclosure.

FIG. 18 is a circuit diagram illustrating an example of a quantum circuit for implementing a multi-controlled NOT gate with 7 control qubits according to an embodiment of the present disclosure.

Referring to FIG. 18, the quantum circuit 1700 may include a first auxiliary circuit AC1, a quantum gate group QGG, and a measurement area MA.

The first auxiliary circuit AC1 may include: corresponds to a layer 1 (L1), a first inverted CH gate ICH1 configured to perform inverted-controlled Hadamard transformation on a auxiliary qubit AQ8 initialized to the |+> state based on the control qubit CQ7; corresponding to a layer 2 (L2), a first CNOT gate CNOT1 configured to rotate a target qubit TQ by π about the X axis based on the auxiliary qubit AQ6; and, corresponding to a layer 3 (L3), a second inverted CH gate ICH2 configured to perform inverted-controlled Hadamard transformation on the auxiliary qubit AQ6 based on the control qubit CQ7.

The quantum gate group QGG may include, corresponding to the layer 1 (L1), a first CH gate CH1 configured to perform controlled Hadamard transformation on a auxiliary qubit AQ1 initialized to the |0> state based on a control qubit CQ2, a second CH gate CH2 configured to perform controlled Hadamard transformation on a auxiliary qubit AQ2 initialized to the state |0> based on a control qubit CQ4, and a third CH gate CH3 configured to perform controlled Hadamard transformation on an auxiliary qubit AQ5 initialized to the states 10> based on a control qubit CQ6.

The quantum gate group QGG may further include, corresponding to the layer 2 (L2), a first CZ gate CZ1 configured to rotate the auxiliary qubit AQ1 by π about the Z axis based on a control qubit CQ1, a second CZ gate CZ2 configured to rotate the auxiliary qubit AQ2 by π about the Z axis based on a control qubit CQ3, and a third CZ gate CZ3 configured to rotate the auxiliary qubit AQ5 by π about the Z axis based on a control qubit CQ5.

The quantum gate group QGG may further include, corresponding to the layer 3 (L3), a fourth CH gate CH4 configured to perform controlled Hadamard transformation on the auxiliary qubit AQ1 based on the control qubit CQ2, a fifth CH gate CH5 configured to perform controlled Hadamard transformation on the auxiliary qubit AQ2 based on the control qubit CQ4, and a sixth CH gate CH6 configured to perform controlled Hadamard transformation on an auxiliary qubit AQ5 based on the control qubit CQ6.

The quantum gate group QGG may further include, corresponding to a layer 4 (L4) a seventh CH gate CH7 configured to perform controlled Hadamard transformation on the auxiliary qubit AQ3 based on the auxiliary qubit AQ2, and a third inverted CH gate ICH3 that configured to perform inverted-controlled Hadamard transformation on the auxiliary Qubit AQ4 based on the auxiliary qubit AQ5.

The quantum gate group QGG may further include, corresponding to a layer 5 (L5), a fourth CZ gate CZ4 configured to rotate the auxiliary qubit AQ2 by π about the Z axis based on the auxiliary qubit AQ1, and a second CNOT gate CNOT2 configured to rotate the auxiliary qubit AQ6 by π about the X axis based on the auxiliary qubit AQ4.

The quantum gate group QGG may further include, corresponding to a layer 6 (L6) an eighth CH gate CH8 configured to perform controlled Hadamard transformation on the auxiliary qubit AQ3 based on the auxiliary qubit AQ2, and a fourth inverted CH gate ICH4 configured to perform inverted-controlled Hadamard transformation on the auxiliary Qubit AQ4 based on the auxiliary qubit AQ5.

The quantum gate group QGG may further include a third CNOT gate CNOT3 configured to rotate the auxiliary qubit AQ4 by π about the X axis based on the auxiliary qubit AQ3.

The measurement area MA may include, corresponding to a layer 8 (L8), a first measurement circuit MC1 that measures the auxiliary qubit AQ5 on the X basis and a second measurement circuit MC2 that measures the auxiliary qubit AQ6 on the Z basis.

The measurement area MA may further include, corresponding to a layer 9 (L9), a first conditional operation circuit COC1 that performs an operation based on a measurement result of the first measurement circuit MC1 and a second conditional operation circuit COC2 that performs an operation based on a measurement result of a second measurement circuit MC2 corresponding to the layer 9L9.

The first conditional operation circuit COC1 may include a fifth CZ gate CZ5 configured to rotate the auxiliary qubit AQ3 by 7*t* about the Z axis based on the auxiliary qubit AQ1. When the measurement result of the first measurement circuit MC1 is 0, the first conditional operation circuit COC1 does not perform a predetermined operation. When the measurement result of the first measurement circuit MC1 is 1, the first conditional operation circuit COC1 performs the predetermined operation. In this case, the operation of the fifth CZ gate CZ5 may be performed.

The second conditional operation circuit COC2 may include a fourth CNOT gate CNOT4 configured to rotate the auxiliary qubit AQ6 by π about the X axis based on the auxiliary qubit AQ5. When the measurement result of the second measurement circuit MC2 is 0, the second conditional operation circuit COC2 does not perform a predetermined operation. When the measurement result of the second measurement circuit MC2 is 1, the second conditional operation circuit COC2 performs the predetermined operation. In this case, the operation of the fourth CNOT gate CNOT4 may be performed.

The measurement area MA may further include, corresponding to a layer 10 (L10), a third measurement circuit MC3 that measures the auxiliary qubit AQ1 on the X basis, a fourth measurement circuit MC4 that measures the auxiliary qubit AQ2 on the X basis, a fifth measurement circuit MC5 that measures the auxiliary qubit AQ5 on the X basis, and a sixth measurement circuit MC6 that measures the auxiliary qubit AQ6 on the Z basis.

The measurement area MA may further include, corresponding to the layer 11 (L11) a third conditional operation circuit COC3 that performs an operation based on a measurement result of the third measurement circuit MC3, a fourth conditional operation circuit COC4 that performs an operation based on a measurement result of a fourth measurement circuit MC4, a fifth conditional operation circuit COC5 that performs an operation based on a measurement result of the fifth measurement circuit MC5, and a sixth conditional operation circuit COC6 that performs an operation based on a measurement result of a sixth measurement circuit MC6.

The third conditional arithmetic circuit COC3 may include a sixth CZ gate CZ6 that rotates the control qubit CQ2 by π about the Z axis based on the control qubit CQ1. When the measurement result of the third measurement circuit MC3 is 0, the third conditional operation circuit COC3 does not perform a predetermined operation. When the measurement result of the third measurement circuit MC3 is 1, the third conditional operation circuit COC3 performs the predetermined operation. In this case, the operation of the sixth CZ gate CZ6 may be performed.

The fourth conditional arithmetic circuit COC4 may include a seventh CZ gate CZ7 that rotates the control qubit CQ4 by π about the Z axis based on the control qubit CQ3. When the measurement result of the fourth measurement circuit MC4 is 0, the fourth conditional operation circuit COC4 does not perform a predetermined operation. When the measurement result of the fourth measurement circuit MC4 is 1, the fourth conditional operation circuit COC4 performs the predetermined operation. In this case, the operation of the seventh CZ gate CZ7 may be performed.

The ninth conditional computation circuit COC9 may include an eighth CZ gate CZ8 that rotates the control qubit CQ6 by π about the Z axis based on the control qubit CQ5. When the measurement result of the fifth measurement circuit MC5 is 0, the ninth conditional operation circuit COC9 does not perform a predetermined operation. When the measurement result of the fifth measurement circuit MC5 is 1, the ninth conditional operation circuit COC9 performs the predetermined operation. In this case, the operation of the eighth CZ gate CZ8 may be performed.

The tenth conditional operation circuit COC10 may include a fifth CNOT gate CNOT5 that rotates the target qubit TQ by π about the X axis based on the control qubit CQ7. When the measurement result of the sixth measurement circuit MC6 is 0, the tenth conditional operation circuit COC10 does not perform a predetermined operation. When the measurement result of the sixth measurement circuit MC6 is 1, the tenth conditional operation circuit COC10 performs the predetermined operation. In this case, the operation of the fifth CNOT gate CNOT5 may be performed.

The quantum circuit 1800 has a 2 qubit circuit depth of 9 and a measurement circuit depth of 2. The number of auxiliary qubits used in the quantum circuit 1800 is 6.

Generalizing the configuration of the quantum circuit 1800, N−1 auxiliary qubits are needed when implementing a multi-controlled NOT gate with N control qubits. When a multi-controlled NOT gate with N control qubits is implemented based on the structure of the quantum circuit 1800, the 2 qubit circuit depth S and the measurement circuit depth T can be expressed by Equations (7) and (8), respectively.

$$S = 4\lceil \log_2(N+1) \rceil - 3 \quad \text{[Equation 7]}$$

$$T = \lceil \log_2(N+1) \rceil - 1 \quad \text{[Equation 8]}$$

Figure 19:
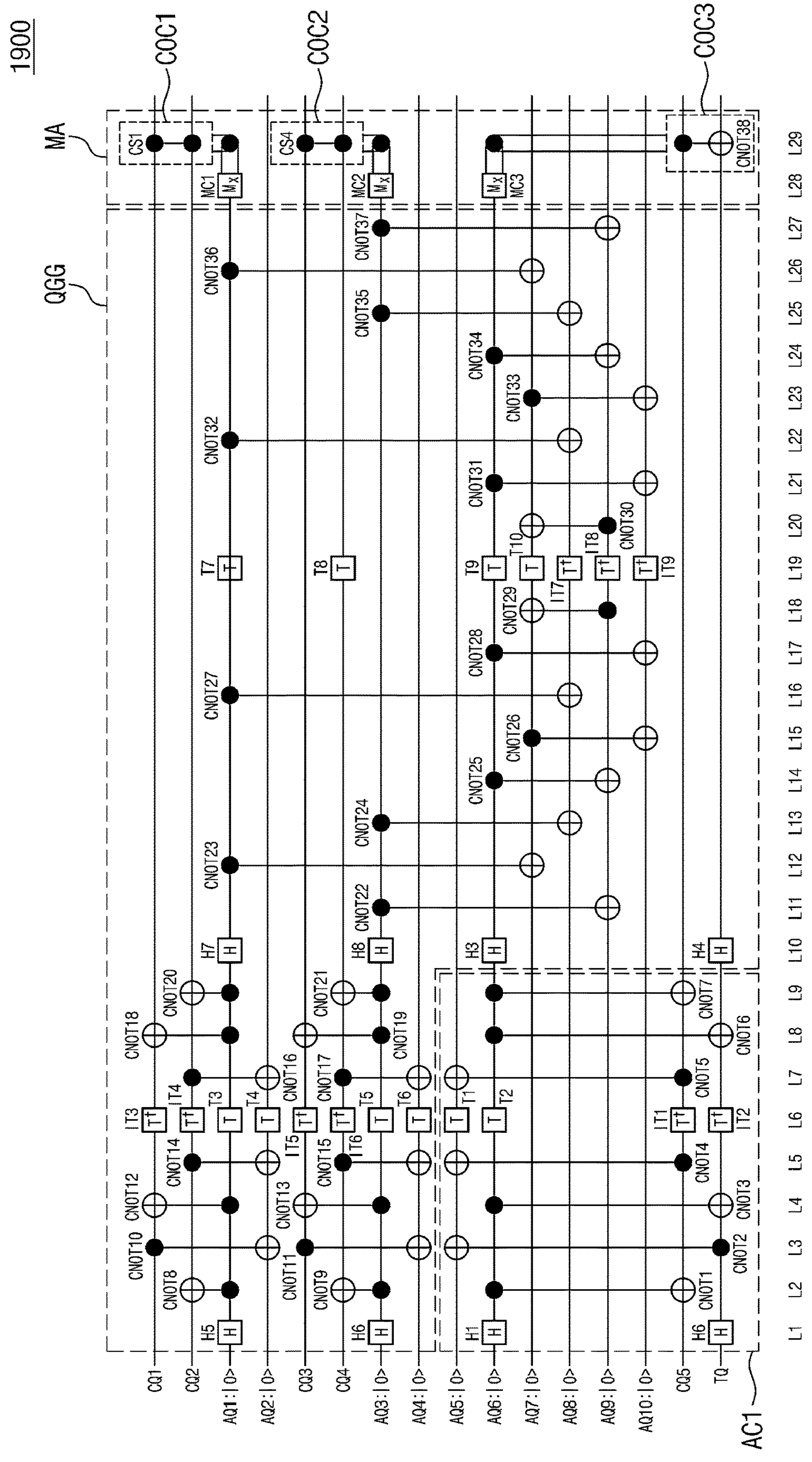
FIG. 19 is a circuit diagram illustrating an example of a quantum circuit for implementing a multi-controlled NOT gate with 5 control qubits according to an embodiment of the present disclosure.

FIG. 19 is a circuit diagram illustrating an example of a quantum circuit for implementing a multi-controlled NOT gate with 5 control qubits according to an embodiment of the present disclosure.

Referring to FIG. 19, the quantum circuit 1900 may include a first auxiliary circuit AC1, a quantum gate group QGG, and a measurement region MA.

The first auxiliary circuit AC1 of the quantum circuit 1900 corresponds to the first auxiliary circuit AC1 of the quantum circuit 1100 described with reference to FIG. 11. The quantum gate group QGG of the quantum circuit 1900 corresponds to the quantum gate group QGG of the quantum circuit 1100 described in FIG. 11. However, the quantum gate group QGG of the quantum circuit 1900 corresponds to only a configuration included in the layer 1 (L1) to the layer 27 (L27) in the quantum circuit 1100. The quantum gate group QGG of the quantum circuit 1900 may further include a fourth H gate H4 configured to perform Hadamard transformation on the target qubit TQ corresponding to a layer 10 (L10). The fourth H gate H4 corresponds to the fourth H gate H4 of the quantum circuit 1100.

The measurement area MA may include a first measurement circuit MC1 that measures the auxiliary qubit AQ1 on the X basis, a second measurement circuit MC2 that measures the auxiliary qubit AQ3 on the X basis, and a third measurement circuit MC3 that measures the auxiliary qubit AQ6 on the X basis corresponding to a layer 28 (L28).

The measurement area MA may further include a first conditional operation circuit COC1 that performs an operation based on a measurement result of the first measurement circuit MC1, a second conditional operation circuit CoC2 that performs an operation based on a measurement result of a second measurement circuit MC2, and a third conditional operation circuit COC3 that performs an operation based on a measurement result of the third measurement circuit MC3 corresponding to a layer 29 (L29).

The first conditional arithmetic circuit COC1 may include a first CZ gate CZ1 configured to rotate the control qubit CQ2 by π about the Z axis based on the control qubit CQ1. When the measurement result of the first measurement circuit MC1 is 0, the first conditional operation circuit COC1 does not perform a predetermined operation. When the measurement result of the first measurement circuit MC1 is 1, the first conditional operation circuit COC1 performs the predetermined operation. In this case, the operation of the first CZ gate CZ1 may be performed.

The second conditional arithmetic circuit COC2 may include a second CZ gate CZ2 configured to rotate the control qubit CQ4 by π about the Z axis based on the control qubit CQ3. When the measurement result of the second measurement circuit MC2 is 0, the second conditional operation circuit COC2 does not perform a predetermined operation. When the measurement result of the second measurement circuit MC2 is 1, the second conditional operation circuit COC2 performs the predetermined operation. In this case, the operation of the second CZ gate CZ2 may be performed.

The third conditional operation circuit COC3 may include a first CNOT gate CNOT1 configured to rotate the target qubit TQ by π about the X axis based on the control qubit CQ5. When the measurement result of the third measurement circuit MC3 is 0, the third conditional operation circuit COC3 does not perform a predetermined operation. When the measurement result of the third measurement circuit MC3 is 1, the third conditional operation circuit COC3 performs the predetermined operation. In this case, the operation of the first CNOT gate CNOT1 may be performed.

Figure 20:
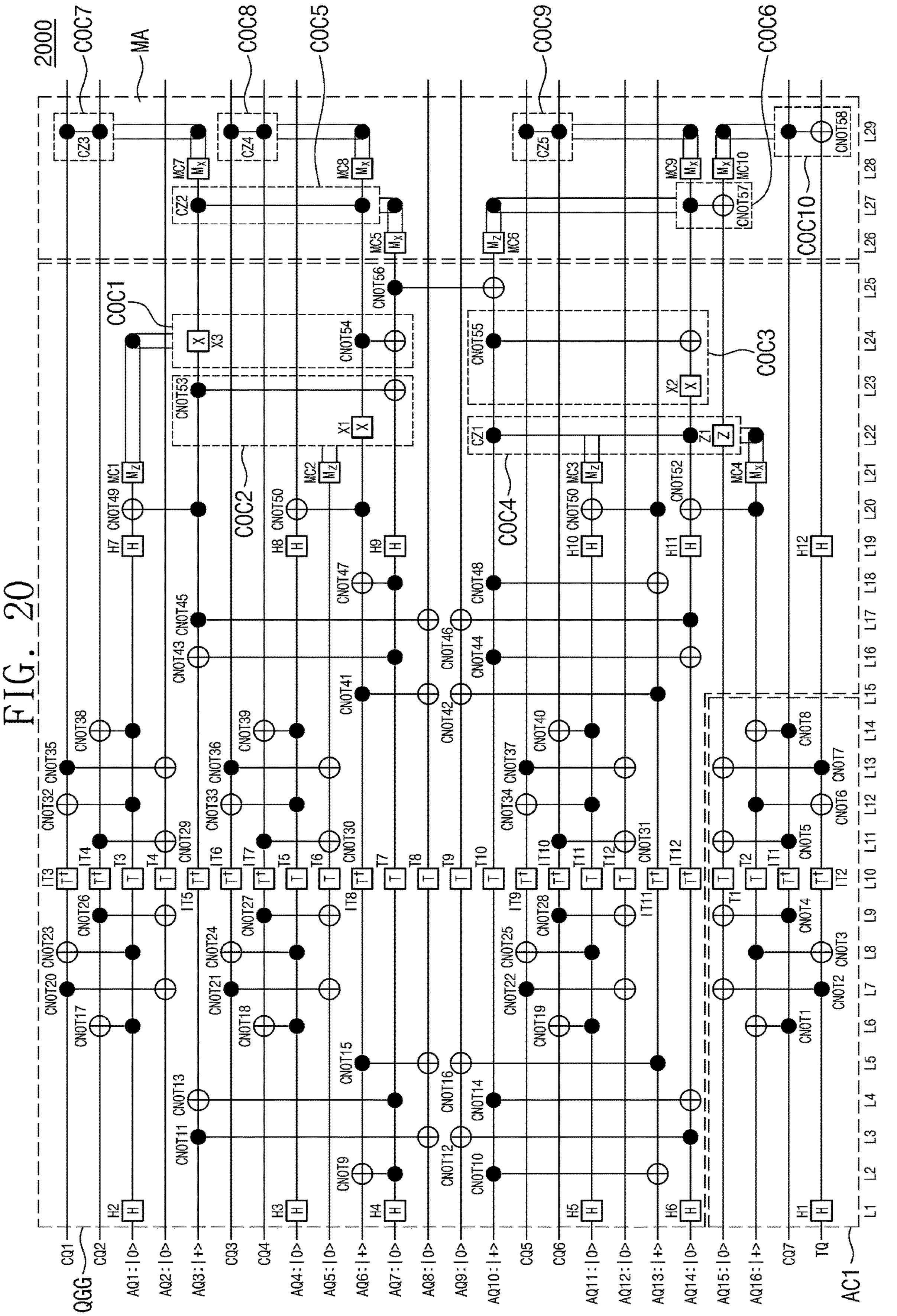
FIG. 20 is a circuit diagram illustrating an example of a quantum circuit for implementing a multi-controlled NOT gate with 7 control qubits according to an embodiment of the present disclosure.

FIG. 20 is a circuit diagram illustrating an example of a quantum circuit for implementing a multi-controlled NOT gate with 7 control qubits according to an embodiment of the present disclosure.

Referring to FIG. 20, the quantum circuit 2000 may include a first auxiliary circuit AC1, a quantum gate group QGG, and a measurement area MA.

The first auxiliary circuit AC1 may include a first H gate H1, first to eighth CNOT gates CNOT1-CNOT8, first to second T gates T1 and T2, and first to second inverse T gates IT1 and IT2.

The quantum gate group QGG may include second to twelfth H gates H2-H12, ninth to 56th CNOT gates CNOT9-CNOT56, third to 12th T gates T3-T12, third to 12th inverse T gates IT3-IT12, first to fourth measurement circuits MC1-MC4, first to third X gates X1-X3, a first CZ gate CZ1, and a first Z gate Z1.

The quantum gate group QGG may include first to fourth conditional arithmetic circuits COC1-COC4. The first conditional operation circuit COC1 performs an operation based on the measurement result of the first measurement circuit MC1, and may include a third X gate X3 and a 54th CNOT gate CNOT54. The second conditional operation circuit COC2 performs an operation based on the measurement result of the second measurement circuit MC2, and may include a first X gate X1 and a 53rd CNOT gate CNOT53. The third conditional operation circuit COC3 performs an operation based on the measurement result of the third measurement circuit MC3, and may include a second X gate X2 and a 54th CNOT gate CNOT54. The fourth conditional operation circuit COC4 performs an operation based on the measurement result of the fourth measurement circuit MC4, and may include a first Z gate Z1 and a first CZ gate CZ1.

The measurement area MA may include fifth to tenth measurement circuits MC5-MC10 and fifth to tenth conditional operation circuits COC5-COC10. The fifth conditional arithmetic circuit COC5 may include a second CZ gate CZ2. The sixth conditional arithmetic circuit COC6 may include a 57th CNOT gate CNOT57. The seventh conditional arithmetic circuit COC7 may include a third CZ gate CZ3. The eighth conditional arithmetic circuit COC8 may include a fourth CZ gate CZ4. The ninth conditional arithmetic circuit COC9 may include a fifth CZ gate CZ5. The tenth conditional computation circuit COC10 may include a 58th CNOT gate CNOT58.

The quantum circuit 2000 may have a T-circuit depth of 1 due to the application of gate teleportation. The measurement circuit depth of the quantum circuit 2000 is 3. When a configuration method of the quantum circuit 2000 is generalized, 3(N−1) or less auxiliary qubits are required, and the measurement circuit depth V may be expressed by Equation 9.

$$V = 2\lceil \log_2(N+1) \rceil - 3 \quad \text{[Equation 9]}$$

Figure 21:
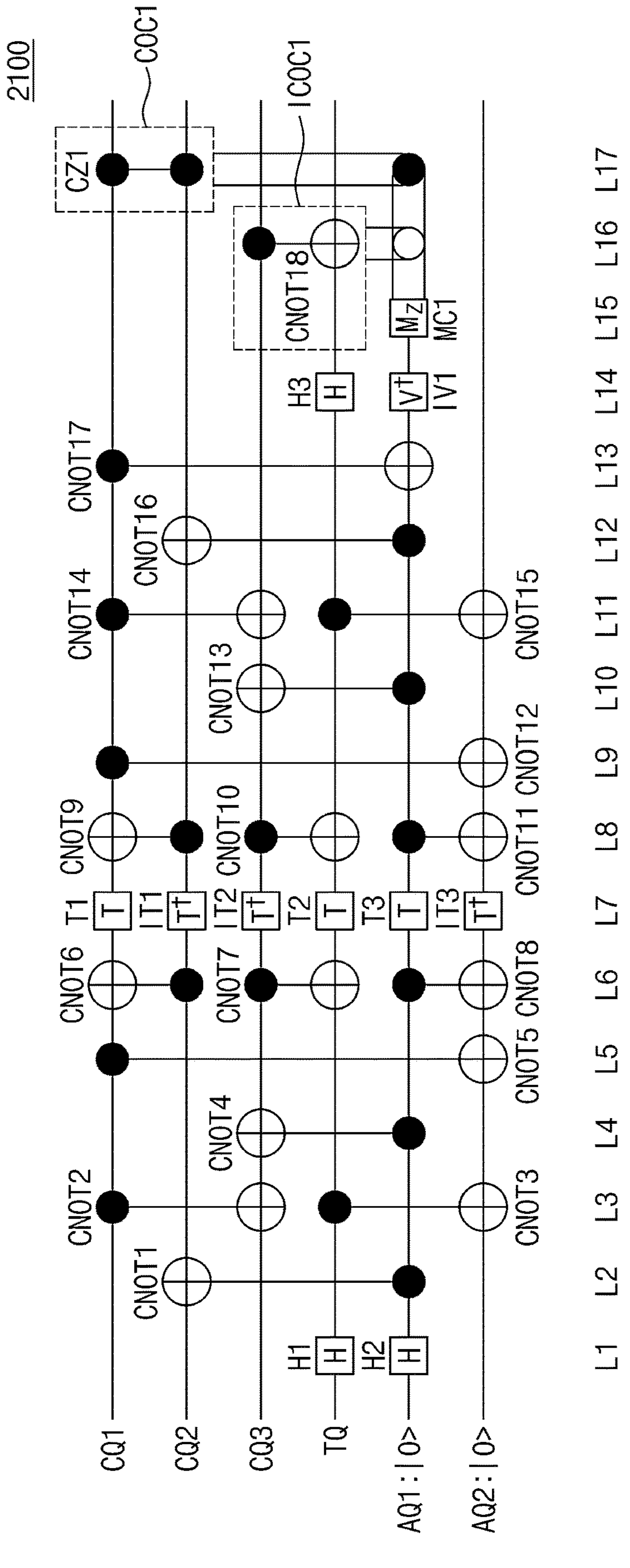
FIG. 21 is a circuit diagram illustrating an example of a quantum circuit for implementing a multi-controlled NOT gate with 3 control qubits according to an embodiment of the present disclosure.

FIG. 21 is a circuit diagram illustrating an example of a quantum circuit for implementing a multi-controlled NOT gate with 3 control qubits according to an embodiment of the present disclosure.

Referring to FIG. 21, the quantum circuit 2100 may include a plurality of quantum logic gates corresponding to a plurality of layers L1-L17.

The quantum circuit 2100 may include, corresponding to a layer 1 (L1), a first H gate H1 configured to perform Hadamard transformation on a target qubit TQ and a second H gate H2 configured to perform Hadamard transformation on an auxiliary qubit AQ1 initialized to the |0> state.

The quantum circuit 2100 may further include, corresponding to a layer 2 (L2), a first CNOT gate CNOT1 configured to rotate a control qubit CQ2 by π about the X axis based on the auxiliary qubit AQ1.

The quantum circuit 2100 may further include, corresponding to a layer 3 (L3), a second CNOT gate CNOT2 configured to rotate a control qubit CQ3 by π about the X axis based on a control qubit CQ1 and a third CNOT gate CNOT3 configured to rotate a auxiliary qubit AQ2 initialized to the |0> state by π about the X axis based on the target qubit TQ.

The quantum circuit 2100 may further include, corresponding to a layer 4 (L4), a fourth CNOT gate CNOT4 configured to rotate the control qubit CQ3 by π about the X axis based on the auxiliary qubit AQ1.

The quantum circuit 2100 may further include corresponding to a layer 5 (L5), a fifth CNOT gate CNOT5 configured to rotate the auxiliary qubit AQ2 by π about the X axis based on the control qubit CQ1.

The quantum circuit 2100 may further include, corresponding to a layer 6 (L6), a sixth CNOT gate CNOT6 configured to rotate the control qubit C1 by π about the X axis based on the control qubit C2, a seventh CNOT gate CNOT7 configured to rotate the target qubit TQ by π about the X axis based on a control qubit CQ3, and an eighth CNOT gate CNOT8 configured to rotate the auxiliary qubit AQ2 by π about the X axis based on the auxiliary qubit AQ1.

The quantum circuit 2100 may further include, corresponding to a layer 7 (L7), a first T gate T1 configured to perform π/4 phase transformation on the control qubit CQ1, a first inverse T gate IT1 configured to perform −π/4 phase transformation on the control qubit CQ2, a second inverse T gate IT2 configured to perform −π/4 phase transformation of the control qubit CQ3, a second T gate T2 configured to perform π/4 phase transformation of the target qubit TQ, a third T gate T3 configured to perform π/4 phase transformation on the auxiliary qubit AQ1, and a third inverse T gate IT3 configured to perform −π/4 phase transformation on the auxiliary qubit AQ2.

The quantum circuit 2100 may further include, corresponding to a layer 8 (L8), a ninth CNOT gate CNOT9 configured to rotate the control qubit C1 by π about the X axis based on the control qubit C2, a tenth CNOT gate CNOT10 configured to rotate the target qubit TQ by π about the X axis based on a control qubit CQ3, and an eleventh CNOT gate CNOT11 configured to rotate the auxiliary qubit AQ2 by π about the X axis based on an auxiliary qubit AQ1.

The quantum circuit 2100 may further include, corresponding to a layer 9 (L9), a twelfth CNOT gate CNOT12 configured to rotate the auxiliary qubit AQ2 by π about the X axis based on the control qubit CQ1.

The quantum circuit 2100 may further include, corresponding to a layer 10 (L10), a thirteenth CNOT gate CNOT13 configured to rotate the control qubit CQ3 by π about the X axis based on the auxiliary qubit AQ1.

The quantum circuit 2100 may further include, corresponding to a layer 11 (L11), a fourteenth CNOT gate CNOT14 configured to rotate the control qubit CQ3 by π about the X axis based on the control qubit CQ1, and a fifteenth CNOT gate CNOT15 configured to rotate the auxiliary qubit AQ2 by π about the X axis based on a target qubit TQ.

The quantum circuit 2100 may further include, corresponding to a layer 12 (L12), a sixteenth CNOT gate CNOT16 configured to rotate the control qubit CQ2 by π about the X axis based on the auxiliary qubit AQ1.

The quantum circuit 2100 may further include, corresponding to a layer 13 (L13), a seventeenth CNOT gate CNOT17 configured to rotate the auxiliary qubit AQ2 by π about the X axis based on the control qubit CQ1.

The quantum circuit 2100 may further include, corresponding to a layer 14 (L14), a third H gate H3 configured to perform Hadamard transformation on the target qubit TQ, and a first inverse V gate IVI configured to rotate the auxiliary qubit AQ1 by −π/2 about the X axis.

The quantum circuit 2100 may further include a first measurement circuit MC1 that measures the auxiliary qubit AQ1 on a Z basis corresponding to a layer 15 (L15).

The quantum circuit 2100 may further include a first inverted conditional operation circuit ICOC1 that performs a conditional operation based on a measurement result of the first measurement circuit MC1 corresponding to the layer 16 (L16).

The first inverted conditional operation circuit ICOC1 may include a seventeenth CNOT gate CNOT17 configured to rotate the target qubit TQ by π about the X axis based on the control qubit CQ3. The first inverted conditional operation circuit ICOC1 does not perform a predetermined operation when the measurement result of the first measurement circuit MC1 is 1. When the measurement result of the first measurement circuit MC1 is 0, the first inverted conditional operation circuit ICOC1 performs the predetermined operation. In this case, the operation of the seventeenth CNOT gate CNOT17 may performed.

The quantum circuit 2100 may include a first conditional operation circuit COC1 that performs a conditional operation based on the measurement result of the first measurement circuit MC1 corresponding to the layer 17 (L17).

The first conditional operation circuit COC1 may include a first CZ gate CZ1 configured to rotate the control qubit CQ2 by π about the Z axis based on the control qubit CQ1. When the measurement result of the first measurement circuit MC1 is 0, the first conditional operation circuit COC1 does not perform a predetermined operation. When the measurement result of the first measurement circuit MC1 is 1, the first conditional operation circuit COC1 performs the predetermined operation. At this time, the operation of the first CZ gate CZ1 may be performed.

The quantum circuit 2100 may implement a multi-controlled NOT gate with 3 control qubits by using only two auxiliary qubits.

In accordance with the embodiments described above, the quantum circuit may implement a multi-controlled NOT gate with N control qubits with minimal circuit depth. This enables fast and efficient quantum computation. In addition, even when a type of operation directly provided by a hardware platform is limited, a quantum circuit having a minimum circuit depth can be provided by using the limited type of operation.

A quantum computer on which a quantum circuit is implemented may be composed of a plurality of components that perform various functions. For example, a quantum computer in which the above-described quantum circuit is implemented may include a CPU that processes quantum information, a memory that stores quantum information, and a bus that transfers information between the CPU and the memory.

The CPU may perform a function as a central processing unit of the quantum computer. The CPU may operate by utilizing a computation space of the memory, and the quantum circuit may perform, under control of the CPU, an operation of a control-rotation gate by using a control qubit, a target qubit, and an auxiliary qubit. The quantum circuit may generate a control qubit, a target qubit, and an auxiliary qubit under control of the CPU, and perform an operation according to a gate operation on the target qubit based on a state of the control qubit. By using the quantum circuit according to the embodiment of the present invention, the processing speed of quantum information will be improved, and resources for processing quantum information will be reduced.

The foregoing are specific embodiments for practicing the present disclosure. The present disclosure will include not only the above-described embodiments, but also embodiments that can be simply changed in design or easily changed. In addition, the present disclosure will include techniques that can be easily modified and implemented by using the embodiments. Therefore, the scope of the present disclosure should not be limited to the above-described embodiments, but should be defined by the following claims as well as equivalents to the claims of the present disclosure.

A quantum circuit according to an embodiment of the present disclosure may implement a multi-controlled NOT gate that may reduce circuit depth by effectively decomposing the gates using auxiliary qubits.

A quantum circuit according to an embodiment of the present disclosure may implement a multi-controlled NOT gate capable of reducing a circuit depth through a measurement circuit.

What is claimed is:

1. A quantum circuit for implementing multi-controlled NOT gates with N control qubits, where N is an integer greater than or equal to 3, the quantum circuit comprising:

a first auxiliary circuit corresponding to one or more initial layers of the plurality of layers and configured to performing controlled NOT operation on a target qubit based on an Nth control qubit from among the N control qubits and a first auxiliary qubit initialized to a |+> state;

a quantum gate group corresponding to a plurality of layers and configured to perform controlled NOT operation on the first auxiliary qubit based on first to (N−1)th control qubits; and a second auxiliary circuit corresponding to one or more last layers of the plurality of layers and configured to performing controlled NOT operation on the target qubit based on the Nth control qubit and the first auxiliary qubit.

2. The quantum circuit of claim 1, wherein the first auxiliary circuit includes a first Toffoli gate configured to rotate the target qubit by π about X axis based on the Nth control qubit and the first auxiliary qubit, and wherein the second auxiliary circuit includes a second Toffoli gate configured to rotate the target qubit by π about the X axis based on the Nth control qubit and the first auxiliary qubit.

3. The quantum circuit of claim 2, wherein Nis 3, and wherein the first auxiliary circuit corresponds to a first layer and the second auxiliary circuit corresponds to a third layer, and wherein the quantum gate group includes:

a third Toffoli gate corresponding to a second layer and configured to rotate the first auxiliary qubit by π about the X axis based on a first control qubit and a second control qubit.

4. The quantum circuit of claim 2, wherein N is 5, and wherein the quantum gate group includes:

a third Toffoli gate corresponding to a first layer of the plurality of layers and configured to rotate a second auxiliary qubit initialized to a |0> state by π about the X axis based on a first control qubit and a second control qubit;

a fourth Toffoli gate corresponding to the first layer and configured to rotate a third auxiliary qubit initialized to a |0> state by π about the X axis based on a third control qubit and a fourth control qubit;

a fifth Toffoli gate corresponding to a second layer and configured to rotate the first auxiliary qubit by π about the X axis based on the first auxiliary qubit and the second auxiliary qubit;

a sixth Toffoli gate corresponding to a third layer and configured to rotate the second auxiliary qubit by π about the X axis based on the first control qubit and the second control qubit; and a seventh Toffoli gate that corresponds to the third layer and configured to rotate the third auxiliary qubit by π about the X axis based on the third control qubit and the fourth control qubit.

5. The quantum circuit of claim 2, wherein a circuit depth of the plurality of layers is $K=2\lceil\log_2(N+1)/3\rceil+1$.

6. The quantum circuit of claim 1, wherein the first auxiliary circuit includes:

a first inverted CH gate corresponding to a first layer of the plurality of layers and configured to perform inverted Hadamard transformation on the first auxiliary qubit based on the Nth control qubit;

a first CNOT gate corresponding to a second layer and configured to rotate the target qubit by π about X axis based on the first auxiliary qubit; and a second inverted CH gate corresponding to a third layer and configured to perform inverted Hadamard transformation on the first auxiliary qubit based on the Nth control qubit; and wherein the second auxiliary circuit is configured symmetrically with the first auxiliary circuit.

7. The quantum circuit of claim 6, wherein a circuit depth of the plurality of layers is $6\lceil\log_2(N+1)\rceil-5$.

8. The quantum circuit of claim 1, wherein the first auxiliary qubit is initialized to |0>, and wherein the first auxiliary circuit includes:

a first CH gate corresponding to a first layer of the plurality of layers and configured to perform Hadamard transformation on the first auxiliary qubit based on the Nth control qubit;

a first CNOT gate corresponding to a second layer and configured to rotate the target qubit by π about X axis based on the first auxiliary qubit; and a second CH gate corresponding to a third layer and configured to perform Hadamard transformation on the first auxiliary qubit based on the Nth control qubit;

wherein the second auxiliary circuit is configured symmetrically with the first auxiliary circuit.

9. The quantum circuit of claim 1, wherein the first auxiliary circuit includes:

a first H gate corresponding to a first layer of the plurality of layers and configured to perform Hadamard transformation on the target qubit;

a first CNOT gate corresponding to a second layer and configured to rotate the Nth control qubit by π about X axis based on the first auxiliary qubit;

a first T gate corresponding to a third layer and configured to perform π/4 phase transformation on the first auxiliary qubit;

a first inverse T gate corresponding to the third layer and configured to perform −π/4 phase transformation on the Nth control qubit;

a second CNOT gate corresponding to a fourth layer and configured to rotate the first auxiliary qubit by π about the X axis based on the target qubit;

a third CNOT gate corresponding to a fifth layer and configured to rotate the Nth control qubit by π about the X axis based on the target qubit;

a second inverse T gate corresponding to a sixth layer and configured to perform −π/4 phase transformation on the first auxiliary qubit;

a second T gate corresponding to the sixth layer and configured to perform π/4 phase transformation on the Nth control qubit;

a fourth CNOT gate corresponding to a seventh layer and configured to rotate the Nth control qubit by π about the X axis based on the first auxiliary qubit; and wherein the second auxiliary circuit is configured symmetrically with the first auxiliary circuit.

10. The quantum circuit of claim 9, wherein the T-circuit depth is $4(\log_2(N+1)-1)$.

11. The quantum circuit of claim 1, wherein the first auxiliary circuit includes:

a first H gate corresponding to a first layer of the plurality of layers and configured to perform Hadamard transformation on the target qubit;

a first CNOT gate corresponding to a second layer and configured to rotate the Nth control qubit by π about X axis based on the first auxiliary qubit;

a second CNOT gate corresponding to a third layer and configured to rotate by π about the X axis based on a second auxiliary qubit initialized to a |0> state based on the target qubit;

a third CNOT gate corresponding to a fourth layer and configured to rotate the target qubit by π about the X axis based on the first auxiliary qubit;

a fourth CNOT gate corresponding to a fifth layer and configured to rotate the second auxiliary qubit by π about the X axis based on the Nth control qubit;

a first T gate corresponding to a sixth layer and configured to perform π/4 phase transformation on the second auxiliary qubit;

a second T gate corresponding to the sixth layer and configured to perform π/4 phase transformation on the first auxiliary qubit;

a first inverse T gate, corresponding to the sixth layer and configured to perform −π/4 phase transformation on the Nth control qubit;

a second inverse T-gate corresponding to the sixth layer and configured to perform −π/4 phase transformation on the second auxiliary qubit;

a fifth CNOT gate corresponding to a seventh layer and configured to rotate the second auxiliary qubit by π about the X axis based on the Nth control qubit;

a sixth CNOT gate corresponding to a eighth layer and configured to rotate the target qubit by π about the X axis based on the first auxiliary qubit; and a seventh CNOT gate corresponding to a ninth layer and configured to rotate the Nth control qubit by π about the X axis based on the first auxiliary qubit; and wherein the second auxiliary circuit is configured symmetrically with the first auxiliary circuit.

12. The quantum circuit of claim 11, wherein the T-circuit depth is $2(\lceil \log_2(N+1) \rceil - 1)$.

13. The quantum circuit of claim 1, wherein the first auxiliary qubit is initialized to a |0> state, and wherein the first auxiliary circuit includes:

a first H gate corresponding to a first layer of the plurality of layers and configured to perform Hadamard transformation on the first auxiliary qubit;

a second H gate corresponding to the first layer and configured to perform Hadamard transformation on the target qubit;

a first CNOT gate corresponding to a second layer and configured to rotate the Nth control qubit by π about the X axis based on the first auxiliary qubit;

a second CNOT gate corresponding to a third layer and configured to rotate by π about the X axis based on a second auxiliary qubit that is initialized to a |0> state;

a third CNOT gate corresponding to a fourth layer and configured to rotate the target qubit by π about the X axis based on the first auxiliary qubit;

a fourth CNOT gate corresponding to a fifth layer and configured to rotate the second auxiliary qubit by π about the X axis based on the Nth control qubit;

a first T gate corresponding to a sixth layer and configured to perform π/4 phase transformation on the second auxiliary qubit;

a second T gate corresponding to the sixth layer and configured to perform π/4 phase transformation on the first auxiliary qubit;

a first inverse T gate corresponding to the sixth layer and configured to perform −π/4 phase transformation on the Nth control qubit;

a second inverse T-gate corresponding to the sixth layer and configured to perform −π/4 phase transformation on the second auxiliary qubit;

a fifth CNOT gate corresponding to a seventh layer and configured to rotate the second auxiliary qubit by π about the X axis based on the Nth control qubit;

a sixth CNOT gate corresponding to the eighth layer and configured to rotate the target qubit by π about the X axis based on the first auxiliary qubit; and a seventh CNOT gate corresponding to a ninth layer and configured to rotate the Nth control qubit by π about the X axis based on the first auxiliary qubit; and wherein the second auxiliary circuit is configured symmetrically with the first auxiliary circuit.

14. A quantum circuit for implementing multi-controlled NOT gates with N control qubits, where N is an integer greater than or equal to 3, the quantum circuit comprising:

a first auxiliary circuit corresponding to one or more initial layers in the plurality of layers and configured to perform controlled NOT operation on a target qubit based on an Nth control qubit from among the N control qubits and a first auxiliary qubit initialized to a |+> state in the plurality of auxiliary qubits;

a quantum gate group corresponding to a plurality of layers and configured to perform controlled NOT operation on the first auxiliary qubit based on first to (N−1)th control qubits; and a measurement area corresponding to a last one or more layers of the plurality of layers and including one or more measurement circuits that measure a state of one or more auxiliary qubits, and one or more conditional operation circuits that perform a conditional operation based on a measurement result of the one or more measurement circuits.

15. The quantum circuit of claim 14, wherein N is 3, and wherein the first auxiliary circuit includes a first Toffoli gate corresponding to a first layer and configured to rotate the target qubit by π about X axis based on the first auxiliary qubit and a third control qubit, and wherein the quantum gate group includes a second Toffoli gate corresponding to the first layer and configured to rotate a second auxiliary qubit initialized to a |0> state by π about the X axis based on the first control qubit and the second control qubit, and a first CNOT gate corresponding to a second layer and configured to rotate the first auxiliary qubit by π about an X axis based on the second auxiliary qubit, and wherein the measurement area includes a first measurement circuit corresponding to a third layer and configured to measure the second auxiliary qubit on X basis, a second measurement circuit corresponding to a fourth layer and configured to measure the first auxiliary qubit on Z basis, a first conditional operation circuit corresponding to a fourth layer and configured to rotate the second control qubit by π about Z axis based on the first control qubit, in response to a measurement result of the first measurement circuit, and a second conditional operation circuit corresponding to the fourth layer and configured to rotate the target qubit by the π about the X axis based on the third control qubit, in response to the measurement result of the second measurement circuit.

16. The quantum circuit of claim 14, wherein the first auxiliary circuit includes:

a first inverted CH gate corresponding to a first layer of the plurality of layers and configured to perform an inverted Hadamard transformation on the first auxiliary qubit based on the Nth control qubit;

a first CNOT gate corresponding to a second layer and configured to rotate the target qubit by π about X axis based on the first auxiliary qubit; and a second inverted CH gate corresponding to a third layer and performing an inverted Hadamard transformation on the first auxiliary qubit based on the Nth control qubit.

17. The quantum circuit of claim 14, wherein the first auxiliary qubit is initialized to |0>, and wherein the first auxiliary circuit includes:

a first CH gate corresponding to a first layer of the plurality of layers and configured to perform Hadamard transformation on the first auxiliary qubit based on the Nth control qubit;

a first CNOT gate corresponding to a second layer and configured to rotate the target qubit by π about X axis based on the first auxiliary qubit; and a second CH gate that performs a Hadamard transformation on the first auxiliary qubit based on the Nth control qubit corresponding to a third layer.

18. The quantum circuit of claim 14, wherein the first auxiliary qubit is initialized to a |0> state, and wherein the first auxiliary circuit includes:

a first H gate corresponding to a first layer of the plurality of the layers and configured to perform Hadamard transformation on the first auxiliary qubit;

a second H gate corresponding to the first layer and configured to perform Hadamard transformation on the target qubit;

a first CNOT gate corresponding to a second layer and configured to rotate the Nth control qubit by π about the X axis based on the first auxiliary qubit;

a second CNOT gate corresponding to a third layer and configured to rotate a second auxiliary qubit initialized to a |0> state by π about the X axis based on the target qubit;

a third CNOT gate corresponding to a fourth layer and configured to rotate the target qubit by π about the X axis based on the first auxiliary qubit;

a fourth CNOT gate corresponding to a fifth layer and configured to rotate the second auxiliary qubit by π about the X axis based on the Nth control qubit;

a first T gate corresponding to a sixth layer and configured to perform π/4 phase transformation on the second auxiliary qubit;

a second T gate corresponding to the sixth layer and configured to perform π/4 phase transformation on the first auxiliary qubit;

a first inverse T gate corresponding to the sixth layer and configured to perform −π/4 phase transformation on the Nth control qubit;

a second inverse T gate corresponding to the sixth layer and configured to perform −π/4 phase transformation on the second auxiliary qubit;

a fifth CNOT gate corresponding to a seventh layer and configured to rotate the second auxiliary qubit by π about the X axis based on the Nth control qubit;

a sixth CNOT gate corresponding to an eighth layer and configured to rotate the target qubit by π about the X axis based on the first auxiliary qubit; and a seventh CNOT gate corresponding to a ninth layer and configured to rotate Nth control qubit by π about the X axis based on the first auxiliary qubit.

19. The quantum circuit of claim 14, wherein the quantum gate group includes at least one measurement circuit for gate teleportation and at least one conditional operation circuit that performs a conditional operation in response to a measurement result of the at least one measurement circuit.

20. A quantum circuit comprising:

corresponding to a first layer, a first H gate configured to perform Hadamard transformation on a target qubit, and a second H gate configured to perform Hadamard transformation on a first auxiliary qubit initialized to the |0> state;

corresponding to a second layer, a first CNOT gate and configured to rotate a second control qubit by π about X axis based on the first auxiliary qubit;

corresponding to a third layer, a second CNOT gate and configured to rotate a third control qubit by π about the X-axis based on a first control qubit, and a third CNOT gate configured to rotate a second auxiliary qubit initialized to a |0> state by π about the X axis based on the target qubit;

corresponding to a fourth layer, a fourth CNOT gate configured to rotate the third control qubit by π about the X axis based on the first auxiliary qubit;

corresponding to a fifth layer, a fifth CNOT gate configured to rotate the second auxiliary qubit by π about the X axis based on the first control qubit;

corresponding to a sixth layer, a sixth CNOT gate configured to rotate the first control qubit by π about the X axis based on the second control qubit, a seventh CNOT gate configured to rotate the target qubit by π about the X axis based on the third control qubit, and an eighth CNOT gate configured to rotate the second auxiliary qubit by π based on the first auxiliary qubit;

corresponding to a seventh layer, a first T gate configured to perform π/4 phase transformation on the first control qubit, a first inverse T gate configured to perform −π/4 phase transformation on the second control qubit, a second inverse T gate configured to perform −π/4 phase transformation on the third control qubit, a second T gate configured to perform the π/4 phase transformation on the target qubit, a third T gate configured to perform π/4 phase transformation on the first auxiliary qubit, and a third inverse T gate configured to perform −π/4 phase transformation on the second auxiliary qubit;

corresponding to an eighth layer, a ninth CNOT gate configured to rotate the first control qubit by π about the X axis based on the second control qubit, a tenth CNOT gate configured to rotate the target qubit by the x about the X axis based on the third control qubit, and an eleventh CNOT gate configured to rotate the second auxiliary qubit by π about the X axis based on the first auxiliary qubit;

corresponding to a ninth layer, a twelfth CNOT gate configured to rotate the second auxiliary qubit by π about the X axis based on the first control qubit;

corresponding to a tenth layer, a thirteenth CNOT gate configured to rotate the third control qubit by π about the X axis based on the first auxiliary qubit;

corresponding to an eleventh layer; a fourteenth CNOT gate configured to rotate the third control qubit by π about an X axis based on the first control qubit, and a fifteenth CNOT gate configured to rotate the second auxiliary qubit by π about the X axis based on the target qubit;

corresponding to a twelfth layer, a sixteenth CNOT gate configured to rotate the second control qubit by π about the X axis based on the first auxiliary qubit;

corresponding to a thirteenth layer, a seventeenth CNOT gate configured to rotate the first auxiliary qubit by π about the X axis based on the first control qubit;

corresponding to a fourteenth layer, a third H gate configured to perform Hadamard transformation on the target qubit, and a first inverse V gate configured to rotate the first auxiliary qubit by −π/2 about the X axis;

corresponding to a fifteenth layer a first measurement circuit configured to measure the first auxiliary qubit on Z basis;

corresponding to a sixteenth layer, a first inverted conditional operation circuit configured to not perform an operation in response to a measurement result being 1, and to rotate the target qubit by π about the X axis based on the third control qubit in response to the measurement result being 0; and corresponding to a seventeenth layer, a first conditional operation circuit configured to do not perform an operation in response to the measurement being 0, and to rotate the second control qubit by π about Z axis based on the first control qubit in response to the measurement result being 1.

* * * * *